(12) United States Patent
Muro et al.

(10) Patent No.: US 9,465,142 B2
(45) Date of Patent: Oct. 11, 2016

(54) NEAR-INFRARED ABSORPTIVE COMPOSITION, NEAR-INFRARED CUT FILTER USING NEAR-INFRARED ABSORPTIVE COMPOSITION, METHOD FOR MANUFACTURING NEAR-INFRARED CUT FILTER, AND CAMERA MODULE AND METHOD FOR MANUFACTURING CAMERA MODULE

(71) Applicant: FUJIFILM Corporation, Minato-ku, Tokyo (JP)

(72) Inventors: Naotsugu Muro, Haibara-gun (JP); Hideki Takakuwa, Haibara-gun (JP); Seongmu Bak, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 40 days.

(21) Appl. No.: 14/604,199

(22) Filed: Jan. 23, 2015

(65) Prior Publication Data

US 2015/0130008 A1 May 14, 2015

Related U.S. Application Data

(63) Continuation of application No. PCT/JP2013/070145, filed on Jul. 25, 2013.

(30) Foreign Application Priority Data

Jul. 27, 2012 (JP) ................... 2012-167694

(51) Int. Cl.
*H01L 27/146* (2006.01)
*G02B 1/04* (2006.01)
(Continued)

(52) U.S. Cl.
CPC ................. *G02B 1/04* (2013.01); *G02B 5/208* (2013.01); *G02B 27/22* (2013.01);
(Continued)

(58) Field of Classification Search
CPC ................. H01L 27/14618; H01L 27/14621; H01L 27/14625; H01L 27/14685; G02B 1/04; G02B 5/208; G02B 27/22
See application file for complete search history.

(56) References Cited

U.S. PATENT DOCUMENTS 7,084,472 B2    8/2006  Fukuyoshi et al.
7,223,817 B2 *  5/2007  Nakagawa ............... C08F 8/42
                                                    525/100

(Continued)

FOREIGN PATENT DOCUMENTS

JP    11-052127 A     2/1999
JP    2000-159776 A   6/2000
(Continued)

OTHER PUBLICATIONS

Office Action dated Mar. 16, 2016, issued by the Korean Intellectual Property Office in corresponding Korean Application No. 10-2015-7002614.

(Continued)

*Primary Examiner* — Nicholas Tobergte
(74) *Attorney, Agent, or Firm* — Sughrue Mion, PLLC

(57) ABSTRACT

Provided is a near-infrared absorptive compositions capable of reducing unevenness in the coated surface profile and variation in near-infrared absorptive ability when the near-infrared absorptive compositions are formed into films. The near-infrared absorptive composition comprises a copper complex and a solvent, wherein the near-infrared absorptive composition has a solid content of 10 to 90% by mass and the solvent has a boiling point of 90 to 200° C.

18 Claims, 2 Drawing Sheets

(51) Int. Cl.
  *G02B 5/20* (2006.01)
  *G02B 27/22* (2006.01)
  *G02B 5/22* (2006.01)
(52) U.S. Cl.
  CPC .. *H01L 27/14618* (2013.01); *H01L 27/14621* (2013.01); *H01L 27/14625* (2013.01); *H01L 27/14685* (2013.01); *G02B 5/223* (2013.01); *H01L 2924/0002* (2013.01)

(56) References Cited

U.S. PATENT DOCUMENTS

| 2002/0033661 | A1* | 3/2002 | Sugimachi | G02B 5/204 313/479 |
| 2002/0050587 | A1* | 5/2002 | Hayashi | C07F 9/4006 252/582 |
| 2004/0185588 | A1 | 9/2004 | Fukuyoshi et al. | |
| 2005/0053864 | A1* | 3/2005 | Dessauer | B41M 5/282 430/270.15 |
| 2012/0251831 | A1 | 10/2012 | Okayasu et al. | |
| 2015/0124152 | A1* | 5/2015 | Bak | C09B 57/10 348/340 |

FOREIGN PATENT DOCUMENTS

| JP | 2000-190430 A | 7/2000 |
| JP | 2001-154015 A | 6/2001 |
| JP | 2005-097495 A | 4/2005 |
| JP | 2006-085196 A | 3/2006 |
| JP | 2008-009206 A | 1/2008 |
| JP | 2008-091535 A | 4/2008 |
| JP | 2008-303308 A | 12/2008 |
| JP | 2009-244291 A | 10/2009 |
| JP | 2010-160380 A | 7/2010 |
| JP | 2011-203467 A | 10/2011 |
| WO | 99/26952 A1 | 6/1999 |
| WO | 2004/006336 A1 | 1/2004 |
| WO | 2011/074619 A1 | 6/2011 |

OTHER PUBLICATIONS

International Search Report for PCT/JP2013/070145 dated Oct. 15, 2013.
International Preliminary Report on Patentability Under Chapter II for PCT/JP2013/070145 dated Oct. 16, 2014.
PCT IB 345 Communication dated Nov. 13, 2014 regarding Third Party Observation in PCT/JP2013/070145.
International Preliminary Report on Patentability dated Mar. 19, 2015 from the International Bureau in counterpart International Application No. PCT/JP2013/070145.
Office Action dated Aug. 4, 2015 from the Japanese Patent Office in counterpart Japanese Application No. 2013-155459.

* cited by examiner

NEAR-INFRARED ABSORPTIVE COMPOSITION, NEAR-INFRARED CUT FILTER USING NEAR-INFRARED ABSORPTIVE COMPOSITION, METHOD FOR MANUFACTURING NEAR-INFRARED CUT FILTER, AND CAMERA MODULE AND METHOD FOR MANUFACTURING CAMERA MODULE

CROSS-REFERENCE TO RELATED APPLICATIONS

This application is a Continuation of PCT International Application No. PCT/JP2013/070145 filed on Jul. 25, 2013, which claims priority under 35 U.S.C. §119(a) to Japanese Patent Application No. 2012-167694 filed on Jul. 27, 2012. The above application is hereby expressly incorporated by reference, in its entirety, into the present application.

TECHNICAL FIELD

The present invention relates to a near-infrared absorptive composition, a near-infrared cut filter using the same and a method for manufacturing the same, and, a camera module and a method for manufacturing the same.

BACKGROUND ART

Recent video camera, digital still camera, mobile phone with camera function and so forth employ CCD and CMOS image sensor, which are solid state image sensing devices capturing color image. These solid state image sensing devices need spectral sensitivity correction, since they use, for their light receiving units, a silicon photodiode which is sensitive in the near-infrared region, and often use a near-infrared cut filter (also referred to as IR cut filter, hereinafter).

Known materials for forming such near-infrared cut filters include near-infrared absorptive compositions (patent documents 1 and 2). In patent document 1, such near-infrared absorptive compositions are prepared into layers by vapor deposition or the like to form near-infrared cut layers. In patent document 2, infrared cut layers are formed by coating.

CITATION LIST

Patent Literature

[Patent Literature 1] JP-A-ll11-052127
[Patent Literature 2] JP2008-9206

SUMMARY OF THE INVENTION

Technical Problem

Recently, there have been demands for providing near-infrared cut filters in the form of thin films for use in solid-state image sensors. In order to reduce the thickness of the films, the proportion of solids (especially, copper complexes absorbing near-infrared radiation) in near-infrared absorptive compositions need to be increased. However, our examination revealed that when proportion of solids such as copper in near-infrared absorptive compositions is increased and a film is formed by coating the near-infrared absorptive compositions, the obtained film has unevenness in the coated surface to cause a variation in the infrared absorbing ability of the films.

The present invention aims to solve these problems of the prior art, thereby providing near-infrared absorptive compositions capable of reducing unevenness in the coated surface profile and variation in near-infrared absorptive ability when the near-infrared absorptive compositions are formed into films by coating.

Solution to Problem

As a result of our careful studies under these circumstances, we accomplished the present invention on the basis of the finding that near-infrared absorptive compositions capable of retaining high near-infrared cut performance as well as reducing unevenness in the coated surface profile and variation in near-infrared absorptive ability even at a solid content of 10 to 90% by mass can be provided by employing a solvent having a boiling point of 90 to 220° C. in the near-infrared absorptive compositions. The mechanism for this is unknown, but may be explained as follows. When a film is formed by coating near-infrared absorptive compositions and drying it, the site-dependence of the microscopic surface profile or reflectance and the site-dependence of the angle of refraction would decrease if the solvent were removed by drying or other means while ensuring the uniformity of the films in the thickness direction as much as possible. To achieve this, it is important to strike a balance between the drying speed and viscosity changes during drying, and the combination of these factors influences the surface profile and variation in absorbing ability. In the present invention, a good balance may be achieved between the drying speed and viscosity changes during drying by selecting a combination of specific ranges of the proportion of solids such as copper complexes that is the governing factor of viscosity and the boiling point of the solvent.

The problems were solved by the configuration <1>, preferably by configurations <2> to <16> below.

<1> A near-infrared absorptive composition comprising a copper complex and a solvent, wherein the near-infrared absorptive composition has a solid content of 10 to 90% by mass and the solvent has a boiling point of 90 to 200° C. at 1 atm.

<2> The near-infrared absorptive composition according to <1>, wherein the solvent has a density of 0.90 g/cm$^3$ or more.

<3> The near-infrared absorptive composition according to <1> or <2>, wherein the solvent has a boiling point of 110 to 180°×C.

<4> The near-infrared absorptive composition according to any one of <1> to <3>, wherein a copper complex is contained at a proportion of 30 to 90% by mass based on the solids content of the near-infrared absorptive composition.

<5> The near-infrared absorptive composition according to any one of <1> to <4>, wherein the solvent is at least one kind selected from alcohols, ketones, esters, ethers, aromatic hydrocarbons and halogenated hydrocarbons.

<6> The near-infrared absorptive composition according to any one of <1> to <5>, wherein the solvent is at least one kind of propylene glycol monomethyl ether acetate, propylene glycol monomethyl ether, cyclohexanone, and ethyl 3-ethoxypropionate.

<7> The near-infrared absorptive composition according to any one of <1> to <5>, wherein the solvent is at least one kind selected from propylene glycol, propylene glycol monomethyl ether acetate, butoxypropanol, ethoxypropanol, ethyl lactate, dipropylene glycol monomethyl ether, butoxyethanol, dimethylformamide, dimethyl sulfoxide, dimethylacetamide and methyl diglyme.

<8> The near-infrared absorptive composition according to any one of <1> to <7>, further comprising a polymerizable compound.

<9> The near-infrared absorptive composition according to any one of <1> to <8>, wherein the solvent is contained in an amount of 30 to 65% by mass in the near-infrared absorptive composition.

<10> The near-infrared absorptive composition according to any one of <1> to <9>, wherein the copper complex is a copper phosphate ester compound.

<11> The near-infrared absorptive composition according to any one of <1> to <10> used by forming a coating on an image sensor for a solid-state imaging device.

<12> A near-infrared cut filter manufactured by using a near-infrared absorptive composition according to any one of <1> to <11>.

<13> A camera module comprising a solid-state image sensor substrate and a near-infrared cut filter according to <12> provided on the light-capturing side of the solid-state image sensor substrate.

<14> A method for manufacturing a camera module comprising a solid-state image sensor substrate and a near-infrared cut filter provided on the light-capturing side of the solid-state image sensor substrate, the method comprising forming a film by coating a near-infrared absorptive composition according to any one of <1> to <11> on the light-capturing side of the solid-state image sensor substrate.

<15> The method for manufacturing a camera module according to <14>, comprising curing the film formed by coating the near-infrared absorptive composition with light irradiation.

<16> A near-infrared absorptive composition comprising a copper compound and a solvent, wherein the near-infrared absorptive composition has a solid content of 10 to 90% by mass and the solvent has a boiling point of 90 to 200° C. at 1 atm.

Advantageous Effects of Invention

The present invention made it possible to provide near-infrared absorptive compositions capable of reducing unevenness in the coated surface profile and variation in the infrared absorbing ability of the resulting films.

DESCRIPTION OF EMBODIMENTS

Figure 1:
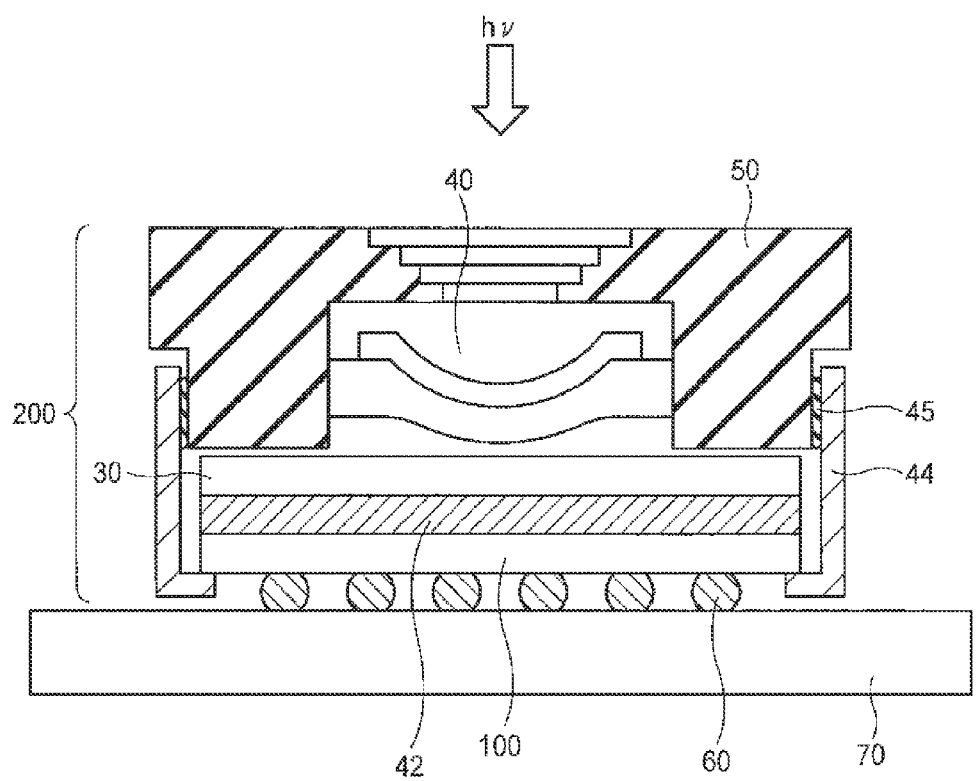
FIG. 1 is a schematic cross sectional view illustrating a configuration of a camera module having a solid state image sensing device according to an embodiment of the present invention.

The present invention will be detailed below. Note in this specification that the wording "to" with preceding and succeeding numerals is used for indicating a numerical range with the lower and upper limits thereof respectively given by these numerals.

In this specification, "(meth)acrylate" means acrylate and methacrylate, "(meth)acryl" means acryl and methacryl, "(meth)acryloyl" means acryloyl and methacryloyl. The monomer in the present invention is discriminated from oligomer and polymer, and means any compound having a weight-average molecular weight of 2,000 or smaller. In this specification, the polymerizable compound means any compound having a polymerizable functional group, and may be a monomer or polymer. The polymerizable functional group means any group participating a polymerization reaction. Note that, in the nomenclature of group (atomic group) in this specification, any expression without indication of "substituted" or "unsubstituted" includes both cases having no substituent and having a substituent. For example, "alkyl group" includes not only an alkyl group having no substituent (unsubstituted alkyl group) but also an alkyl group having a substituent (substituted alkyl group).

Near-infrared radiation in the present invention means the radiation in the wavelength range from 700 to 2500 nm.

The near-infrared absorptive composition, the near-infrared cut filter, the camera module having such near-infrared cut filter and a substrate for solid state image sensing device, and the method for manufacturing the camera module of the present invention will be detailed. While the explanation will occasionally be based on representative embodiments of the present invention, the present invention is not limited to these embodiments.

The near-infrared absorptive compositions of the present invention (hereinafter sometimes referred to as "the compositions of the present invention") comprise a copper compound and a solvent, and are characterized in that the near-infrared absorptive compositions have a solid content of 10 to 90% by mass and the solvent has a boiling point of 90 to 200° C.

Further, the compositions of the present invention are near-infrared absorptive compositions comprising a copper complex and a solvent, characterized in that the near-infrared absorptive compositions have a solid content of 10 to 90% by mass and the solvent has a boiling point of 90 to 200° C.

These features will be explained in detail below.

<Copper Compounds>

The compositions of the present invention comprise a copper compound at a proportion of 30 to 90% by mass, preferably 60 to 90% by mass, more preferably 60 to 80% by mass based on the total solids of the compositions. Only one or two or more copper compounds may be contained, and when two or more compounds are contained, the total amount should be in the ranges defined above.

The copper compound used in the present invention is not specifically limited so far as it has a maximum absorption wavelength in the range of 700 nm to 1000 nm (in the near-infrared region).

The copper compound used in the present invention may or may not be a copper complex, but it is preferably a copper complex.

When the copper compound used in the present invention is a copper complex, the ligand L coordinated to copper is not specifically limited so far as it can form a coordinate bond with the copper ion, and such compounds include compounds containing sulfonic acids, phosphoric acid, phosphoric acid esters, phosphonic acids, phosphonic acid esters, phosphinic acid, phosphinic acid esters, carboxylic acids, carbonyl (esters, ketones), amines, amides, sulfonamides, urethane, urea, alcohols, thiols and the like. Among them, preferred are carboxylic acids, carbonyl (esters, ketones), sulfonic acids, phosphoric acid, amines, phosphoric acid esters, phosphonic acids, phosphonic acid esters, phosphinic acid, and phosphinic acid esters, more preferably sulfonic acids, phosphoric acid esters, phosphonic acid esters, and phosphinic acid esters.

More preferably, specific examples of copper compounds used in the present invention include phosphorus-containing copper compounds, copper sulfonate compounds, copper carboxylate compounds or copper compounds represented by general formula (1) below. Specifically, phosphorus-containing compounds can be found at page 5, line 27 to page 7, line 20 of WO2005/030898, the contents of which are incorporated herein by reference.

Preferably, the copper compound used in the present invention is represented by general formula (1) below:

$$Cu(L)_n \cdot X \qquad \text{general formula (1)}$$

In general formula (1), L represents a ligand coordinated to copper, X is absent or represents a halogen atom, $H_2O$, $NO_3$, $ClO_4$, $SO_4$, CN, SCN, $BF_4$, $PF_6$, $BPh_4$ (wherein Ph represents phenyl), or alcohol. n represents an integer of 1 to 4.

L represents a ligand coordinated to copper. The ligand is not specifically limited so far as it can form a coordinate bond with the copper ion, but it preferably has a substituent containing an atom capable of being coordinated to copper such as C, N, O, or S, more preferably a group containing a lone pair such as N, O or S.

Preferred ligands for L are as defined above for the ligand L. They may contain not only one but also two or more groups capable of being coordinated in the molecule, and they may be dissociated or not. When they are not dissociated, X is absent.

Preferably, X represents $NO_3$, $ClO_4$, $SO_4$, SCN, $BF_4$, $PF_6$, or BPh.

Preferably, n is 1 to 2.

<<Phosphate Ester Copper Compounds>>

Phosphate ester copper compounds as an example of copper compounds used in the present invention are preferably formed by using a phosphate ester compound, more preferably a compound represented by formula (A) below:

$$(HO)_n-P(=O)-(OR^2)_{3-n} \qquad \text{formula (A)}$$

wherein $R^2$ represents an alkyl group containing 1 to 18 carbon atoms, an aryl group containing 6 to 18 carbon atoms, an aralkyl group containing 1 to 18 carbon atoms, or an alkenyl group containing 1 to 18 carbon atoms; or $—OR^2$ represents a polyoxyalkyl group containing 4 to 100 carbon atoms, a (meth)acryloyloxyalkyl group containing 4 to 100 carbon atoms or a (meth)acryloylpolyoxyalkyl group containing 4 to 100 carbon atoms, and n represents 1 or 2.

When n is 1, $R^2$ may be the same or different.

Preferably, at least one of $—OR^2$ in the formula above represents a (meth)acryloyloxyalkyl group containing 4 to 100 carbon atoms, or a (meth)acryloylpolyoxyalkyl group containing 4 to 100 carbon atoms, more preferably a (meth)acryloyloxyalkyl group containing 4 to 100 carbon atoms.

Preferably, the polyoxyalkyl group containing 4 to 100 carbon atoms, the (meth) acryloyloxyalkyl group containing 4 to 100 carbon atoms, or the (meth) acryloylpolyoxyalkyl group containing 4 to 100 carbon atoms each contains 4 to 20 carbon atoms, more preferably 4 to 10 carbon atoms.

In formula (A), $R^2$ preferably represents an alkyl group containing 1 to 18 carbon atoms, or an aryl group containing 6 to 18 carbon atoms, more preferably an alkyl group containing 1 to 10 carbon atoms, or an aryl group containing 6 to 10 carbon atoms, still more preferably an aryl group containing 6 to 10 carbon atoms, especially preferably phenyl.

When n is 1 in the present invention, one of $R^2$ represents $—OR^2$, preferably a (meth)acryloyloxyalkyl group containing 4 to 100 carbon atoms, or a (meth)acryloylpolyoxyalkyl group containing 4 to 100 carbon atoms, while the other preferably represents $—OR^2$ as defined above or an alkyl group.

Further, the phosphate ester compound may be a phosphate monoester (formula (A) above wherein n=2) or a phosphate diester (formula (A) above wherein n=1), preferably a phosphate diester because of the near-infrared blocking ability and solubility.

Preferably, the phosphate ester copper compounds are in the form of a copper complex containing a phosphate ester coordinated to the central metallic copper ion. The copper ion in the phosphate ester copper complex is a divalent copper ion, and the complex can be produced by, for example, a reaction between a copper salt and a phosphate ester. Thus, it is predicted that a phosphate ester copper complex would be formed in a near-infrared absorptive composition containing copper and a phosphate ester compound.

The phosphate ester copper compounds used in the present invention preferably have a molecular weight of 300 to 1500, more preferably 320 to 900.

Specific examples of compounds forming ligands include exemplary compounds (A-1) to (A-219) shown below.

TABLE 1

| | $R^1$ | $R^2$ |
|---|---|---|
| A-1 | H |  |
| A-2 | | |

TABLE 1-continued $$\begin{array}{c} R^1O \quad \underset{\|}{O} \\ \phantom{R^1O}\diagdown\mathrm{P}\diagup \\ R^2O \diagup \phantom{\mathrm{P}} \diagdown OH \end{array}$$

| | R¹ | R² |
|---|---|---|
| A-3 | H | 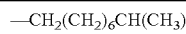 |
| A-4 |  |  |
| A-5 |  | (structure) |
| A-6 | H | —CH₃ |
| A-7 | —CH₃ | —CH₃ |
| A-8 | H | —CH₂CH₃ |
| A-9 | —CH₂CH₃ | —CH₂CH₃ |
| A-10 | H | —CH(CH₃)₂ |
| A-11 | —CH(CH₃)₂ | —CH(CH₃)₂ |
| A-12 | H | —CH₂(CH₂)₂CH₃ |
| A-13 | —CH₂(CH₂)₂CH₃ | —CH₂(CH₂)₂CH₃ |
| A-14 | H | —CH₂CH₂OCH₂(CH₂)₂CH₃ |
| A-15 | —CH₂CH₂OCH₂(CH₂)₂CH₃ | —CH₂CH₂OCH₂(CH₂)₂CH₃ |
| A-16 | H | (2-ethylhexyl) |
| A-17 | (2-ethylhexyl) | (2-ethylhexyl) |
| A-18 | H | —CH₂(CH₂)₈CH₃ |
| A-19 | —CH₂(CH₂)₈CH₃ | —CH₂(CH₂)₈CH₃ |
| A-20 | H | —CH₂(CH₂)₆CH(CH₃)₂ |

In the table, "*" indicates a site of bonding with an oxygen atom.

TABLE 2

$$\begin{array}{c} R^1O \quad \underset{\|}{O} \\ \phantom{R^1O}\diagdown\mathrm{P}\diagup \\ R^2O \diagup \phantom{\mathrm{P}} \diagdown OH \end{array}$$

| | R¹ | R² |
|---|---|---|
| A-21 | —CH₂(CH₂)₆CH(CH₃)₂ | —CH₂(CH₂)₆CH(CH₃)₂ |
| A-22 | H | (oleyl) |
| A-23 | (oleyl) | (oleyl) |

TABLE 2-continued $$\begin{array}{c} R^1O\phantom{X}O \\ \diagdown\phantom{X}\diagup\phantom{X} \\ P \\ \diagup\phantom{X}\diagdown\phantom{X} \\ R^2O\phantom{XX}OH \end{array}$$

| | $R^1$ | $R^2$ |
|---|---|---|
| A-24 | H | —CH$_2$(CH$_2$)$_{14}$CH(CH$_3$)$_2$ |
| A-25 | —CH$_2$(CH$_2$)$_{14}$CH(CH$_3$)$_2$ | —CH$_2$(CH$_2$)$_{14}$CH(CH$_3$)$_2$ |
| A-26 | H | —C$_6$H$_5$ |
| A-27 | —C$_6$H$_5$ | —C$_6$H$_5$ |
| A-28 | H | —CH$_2$CH$_2$OCH$_3$ |
| A-29 | —CH$_2$CH$_2$CH$_3$ | —CH$_2$CH$_2$OCH$_3$ |
| A-30 | H | —CH$_2$CH$_2$OCH$_2$CH$_3$ |
| A-31 | —CH$_2$CH$_2$OCH$_2$CH$_3$ | —CH$_2$CH$_2$OCH$_2$CH$_3$ |
| A-32 | H | —(C$_2$H$_4$O)$_2$C$_2$H$_5$ |
| A-33 | —(C$_2$H$_4$O)$_2$C$_2$H$_5$ | —(C$_2$H$_4$O)$_2$C$_2$H$_5$ |
| A-34 | H | —(C$_2$H$_4$O)$_2$C$_4$H$_9$ |
| A-35 | —(C$_2$H$_4$O)$_2$C$_4$H$_9$ | —(C$_2$H$_4$O)$_2$C$_4$H$_9$ |
| A-36 | H | —C$_2$H$_4$OCH$_2$CHCH$_3$)$_2$ |
| A-37 | —C$_2$H$_4$OCH$_2$CHCH$_3$)$_2$ | —C$_2$H$_4$OCH$_2$CHCH$_3$)$_2$ |
| A-38 | H | —(C$_2$H$_4$O)$_2$CH$_2$CHCH$_3$)$_2$ |
| A-39 | —(C$_2$H$_4$O)$_2$CH$_2$CHCH$_3$)$_2$ | —(C$_2$H$_4$O)$_2$CH$_2$CHCH$_3$)$_2$ |
| A-40 | H | —CH(CH$_3$)CH$_2$OCH$_3$ |

In the table, "*" indicates a site of bonding with the above formula.

TABLE 3

$$\begin{array}{c} R^1O\phantom{X}O \\ \diagdown\phantom{X}\diagup\phantom{X} \\ P \\ \diagup\phantom{X}\diagdown\phantom{X} \\ R^2O\phantom{XX}OH \end{array}$$

| | $R^1$ | $R^2$ |
|---|---|---|
| A-41 | H | —CH(CH$_3$)CH$_2$OCH$_3$ |
| A-42 | —CH(CH$_3$)CH$_2$CH$_3$ | —CH(CH$_3$)CH$_2$OCH$_3$ |
| A-43 | H | —(CH(CH$_3$)CH$_2$O)$_2$CH$_3$ |
| A-44 | —(CH(CH$_3$)CH$_2$O)$_2$CH$_3$ | —(CH(CH$_3$)CH$_2$O)$_2$CH$_3$ |
| A-45 | H | —(CH(CH$_3$)CH$_2$O)$_3$CH$_3$ |
| A-46 | —(CH(CH$_3$)CH$_2$O)$_3$CH$_3$ | —(CH(CH$_3$)CH$_2$O)$_3$CH$_3$ |
| A-47 | H | —CH$_2$CH(CH$_3$)OCH$_3$ |
| A-48 | —CH$_2$CH(CH$_3$)OCH$_3$ | —CH$_2$CH(CH$_3$)OCH$_3$ |
| A-49 | H | —(CH$_2$CH(CH$_3$)O)$_2$CH$_3$ |
| A-50 | —(CH$_2$CH(CH$_3$O)$_2$CH$_3$ | —(CH$_2$CH(CH$_3$)O)$_2$CH$_3$ |
| A-51 | H | —(CH$_2$CH(CH$_3$)O)$_3$CH$_3$ |
| A-52 | —(CH$_2$CH(CH$_3$)O)$_3$CH$_3$ | —(CH$_2$CH(CH$_3$)O)$_3$CH$_3$ |
| A-53 | H | —CH(CH$_3$)CH$_2$OC(=O)CH$_3$ |
| A-54 | —CH(CH$_3$)CH$_2$OC(=O)CH$_3$ | —CH(CH$_3$)CH$_2$OC(=O)CH$_3$ |
| A-55 | H | —CH$_2$CH(CH$_3$) OC(=O)CH$_3$ |
| A-56 | —CH$_2$CH(CH$_3$) OC(=O)CH$_3$ | —CH$_2$CH(CH$_3$) OC(=O)CH$_3$ |
| A-57 | —CH$_2$CH(CH$_3$) OC(=O)CH$_3$ | —CH(CH$_3$)CH$_2$OC(=O)CH$_3$ |
| A-58 | H | —CH(CH$_3$)CH$_2$OC(=O)CH$_2$CH$_3$ |
| A-59 | —CH(CH$_3$)CH$_2$OC(=O)CH$_2$CH$_3$ | —CH(CH$_3$)CH$_2$OC(=O)CH$_2$CH$_3$ |
| A-60 | H | —CH$_2$CH(CH$_3$)OC(=O)CH$_2$CH$_3$ |

TABLE 4

$$\begin{array}{c} R^1O\phantom{X}O \\ \diagdown\phantom{X}\diagup\phantom{X} \\ P \\ \diagup\phantom{X}\diagdown\phantom{X} \\ R^2O\phantom{XX}OH \end{array}$$

| | $R^1$ | $R^2$ |
|---|---|---|
| A-61 | —CH$_2$CH(CH$_3$)OC(=O)CH$_2$CH$_3$ | —CH$_2$CH(CH$_3$)OC(=O)CH$_2$CH$_3$ |
| A-62 | —CH$_2$CH(CH$_3$)OC(=O)CH$_2$CH$_3$ | —CH(CH$_3$)CH$_2$OC(=O)CH$_3$ |
| A-63 | H | —CH(CH$_2$CH$_3$)CH$_2$OC(=O)CH$_3$ |
| A-64 | —CH(CH$_2$CH$_3$)CH$_2$OC(=O)CH$_3$ | —CH(CH$_2$CH$_3$)CH$_2$OC(=O)CH$_3$ |
| A-65 | H | —CH$_2$CH(CH$_2$CH$_3$) OC(=O)CH$_3$ |
| A-66 | —CH$_2$CH(CH$_2$CH$_3$) OC(=O)CH$_3$ | —CH$_2$CH(CH$_2$CH$_3$) OC(=O)CH$_3$ |
| A-67 | —CH(CH$_2$CH$_3$)CH$_2$OC(=O)CH$_3$ | —CH$_2$CH(CH$_2$CH$_3$) OC(=O)CH$_3$ |
| A-68 | H | —CH(CH$_2$CH$_3$)CH$_2$OC(=O)CH$_2$CH$_3$ |
| A-69 | —CH(CH$_2$CH$_3$)CH$_2$OC(=O)CH$_2$CH$_3$ | —CH(CH$_2$CH$_3$)CH$_2$OC(=O)CH$_2$CH$_3$ |
| A-70 | H | —CH$_2$CH(CH$_2$CH$_3$)OC(=O)CH$_2$CH$_3$ |

TABLE 4-continued $$R^1O-P(=O)(OR^2)(OH)$$

| | R¹ | R² |
|---|---|---|
| A-71 | —CH$_2$CH(CH$_2$CH$_3$)OC(=O)CH$_2$CH$_3$ | —CH$_2$CH(CH$_2$CH$_3$)OC(=O)CH$_2$CH$_3$ |
| A-72 | —CH(CH$_2$CH$_3$)CH$_2$OC(=O)CH$_2$CH$_3$ | —CH$_2$CH(CH$_2$CH$_3$)OC(=O)CH$_2$CH$_3$ |
| A-73 | H | —CH(CH$_3$)CH$_2$OC(=O)CH(CH$_3$)$_2$ |
| A-74 | —CH(CH$_3$)CH$_2$OC(=O)CH(CH$_3$)$_2$ | —CH(CH$_3$)CH$_2$OC(=O)CH(CH$_3$)$_2$ |
| A-75 | H | —CH$_2$CH(CH$_3$)OC(=O)CH(CH$_3$)$_2$ |
| A-76 | —CH$_2$CH(CH$_3$)OC(=O)CH(CH$_3$)$_2$ | —CH$_2$CH(CH$_3$)OC(=O)CH(CH$_3$)$_2$ |
| A-77 | —CH$_2$CH(CH$_3$)OC(=O)CH(CH$_3$)$_2$ | —CH(CH$_3$)CH$_2$OC(=O)CH(CH$_3$)$_2$ |
| A-78 | H | —CH(CH$_2$CH$_3$)CH$_2$OC(=O)CH(CH$_3$)$_2$ |
| A-79 | —CH(CH$_2$CH$_3$)CH$_2$OC(=O)CH(CH$_3$)$_3$ | —CH(CH$_2$CH$_3$)CH$_2$OC(=O)CH(CH$_3$)$_2$ |
| A-80 | H | —CH$_2$CH(CH$_2$CH$_3$)OC(=O)CH(CH$_3$)$_2$ |

TABLE 5

$$R^1O-P(=O)(OR^2)(OH)$$

| | R¹ | R² |
|---|---|---|
| A-81 | —CH$_2$CH(CH$_2$CH$_3$)OC(=O)CH(CH$_3$)$_2$ | —CH$_2$CH(CH$_2$CH$_3$)OC(=O)CH(CH$_3$)$_2$ |
| A-82 | —CH$_2$CH(CH$_2$CH$_3$)OC(=O)CH(CH$_3$)$_2$ | —CH(CH$_2$CH$_3$)CH$_2$OC(=O)CH(CH$_3$)$_2$ |
| A-83 | —(CH(CH$_2$CH$_3$)CH$_2$O)$_2$C(=O)CH$_3$ | H |
| A-84 | —(CH(CH$_2$CH$_3$)CH$_2$O)$_2$C(=O)CH$_3$ | —(CH(CH$_2$CH$_3$)CH$_2$O)$_2$C(=O)CH$_3$ |
| A-85 | H | —CH(CH$_3$)CH$_2$C(=O)OCH$_3$ |
| A-86 | —CH(CH$_3$)CH$_2$C(=O)OCH$_3$ | —CH(CH$_3$)CH$_2$C(=O)OCH$_3$ |
| A-87 | H | —CH(CH$_3$)CH$_2$C(=O)OCH$_2$CH$_3$ |
| A-88 | —CH(CH$_3$)CH$_2$C(=O)OCH$_2$CH$_3$ | —CH(CH$_3$)CH$_2$C(=O)OCH$_2$CH$_3$ |
| A-89 | H | —CH$_2$CH(CH$_3$)C(=O)OCH$_3$ |
| A-90 | —CH$_2$CH(CH$_3$)C(=O)OCH$_3$ | —CH$_2$CH(CH$_3$)C(=O)OCH$_3$ |
| A-91 | H | —CH$_2$C(CH$_3$)$_2$C(=O)OCH$_3$ |
| A-92 | —CH$_2$C(CH$_3$)$_2$C(=O)OCH$_3$ | —CH$_2$C(CH$_3$)$_2$C(=O)OCH$_3$ |
| A-93 | —CH$_2$CH(C$_2$H$_5$)CH$_2$CH$_2$CH$_3$ | —CH$_2$CH(C$_2$H$_5$)CH$_2$CH$_2$CH$_3$ |
| A-94 | H | —CH(CH$_3$)CH$_2$OC$_6$H$_5$ |
| A-95 | H | —CH$_2$CH(CH$_3$)OC$_6$H$_5$ |
| A-96 | —CH$_2$CH(CH$_3$)OC$_6$H$_5$ | —CH$_2$CH(CH$_3$)OC$_6$H$_5$ |
| A-97 | —CH(CH$_3$)CH$_2$OC$_6$H$_5$ | —CH(CH$_3$)CH$_2$OC$_6$H$_5$ |
| A-98 | —CH(CH$_3$)CH$_2$OC$_6$H$_5$ | —CH(CH$_3$)CH$_2$OC$_6$H$_5$ |
| A-99 | H | —CH(CH$_2$OCH$_3$)CH$_2$OC$_6$H$_5$ |
| A-100 | —CH(CH$_2$OCH$_3$)CH$_2$OC$_6$H$_5$ | —CH(CH$_2$OCH$_3$)CH$_2$OC$_6$H$_5$ |

TABLE 6

$$R^1O-P(=O)(OR^2)(OH)$$

| | R¹ | R² |
|---|---|---|
| A-101 | H | —CH$_2$CH$_2$CH(CH$_3$)OCH$_3$ |
| A-102 | —CH$_2$CH$_2$CH(CH$_3$)OCH$_3$ | —CH$_2$CH$_2$CH(CH$_3$)OCH$_3$ |
| A-103 | H | 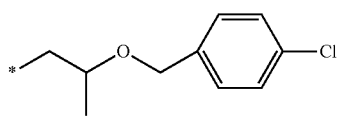 [SMILES: *CC(C)OCc1ccc(Cl)cc1] |
| A-103 | H | 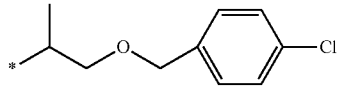 [SMILES: *C(C)COCc1ccc(Cl)cc1] |

TABLE 6-continued $$\begin{array}{c} R^1O \diagdown \underset{\displaystyle \|}{P} \diagup O \\ R^2O \diagup \phantom{P} \diagdown OH \end{array}$$

| | R¹ | R² |
|---|---|---|
| A-104 | *-CH(CH₃)-CH₂-O-CH₂-C₆H₄-Cl (p) | *-CH(CH₃)-CH₂-O-CH₂-C₆H₄-Cl (p) |
| A-105 | *-CH₂-CH(CH₃)-O-CH₂-C₆H₄-Cl (p) | *-CH₂-CH(CH₃)-O-CH₂-C₆H₄-Cl (p) |
| A-106 | *-CH(CH₃)-CH₂-O-CH₂-C₆H₄-Cl (p) | *-CH(CH₃)-CH₂-O-CH₂-C₆H₄-Cl (p) |

TABLE 7

Quinoline-2-carboxylate structure with (R²) substituent and —OR¹ group

| | R¹ | R² |
|---|---|---|
| A-107 | H | H |
| A-108 | —CH₃ | H |
| A-109 | CH₂=C(CH₃)—C(=O)—O—CH₂CH₂—* | H |
| A-110 | —CH₃ | —COCH₃ |
| A-111 | CH₂=C(CH₃)—C(=O)—O—CH₂CH₂—* | —O—CH₂CH₂—O—C(=O)—C₆H₄—* |
| A-112 | CH₂=C(CH₃)—C(=O)—O—CH₂CH₂—* | —COCH₃ |

In the table, "*" indicates a site of bonding with the above formula.

TABLE 8

$$R^1 \!-\! \underset{\displaystyle \underset{O}{\|}}{C} \!-\! OH$$

| | R¹ | R² |
|---|---|---|
| A-113 | —CH₃ | — |
| A-114 | —C₆H₅ | — |
| A-115 | 2-(butoxycarbonyl)phenyl—* | — |
| A-116 | CH₂=C(CH₃)—C(=O)—O—CH₂CH₂—O—C(=O)—CH₂CH₂—* | — |
| A-117 | CH₂=CH(Me)— | — |
| A-118 | H | — |
| A-119 | -n-C₁₇H₃₅ | — |
| A-120 | 2,5-dimethylcyclopentyl—CH(CH₂)ₙ* | — |
| A-121 | CH₃—C(=O)—CH=C(OEt)—O—* | — |
| A-122 | HOOC—CH₂—C(OH)(CH₂COOH)—CH₂—* | — |

In the table, "*" indicates a site of bonding with the COOH.

TABLE 9

$$\underset{O}{\overset{R^1}{\diagdown}}\underset{}{\overset{R^2}{-}}\underset{O}{\overset{R^3}{\diagup}}$$

| | R¹ | R² | R³ |
|---|---|---|---|
| A-123 | CH₃ | H | C₆H₅ |
| A-124 | C₆H₅ | H | C₆H₅ |
| A-125 | CH₃ | CH₃ | C₆H₅ |
| A-126 | CH₂(CH₂)₂CH₃ | CH₃ | C₆H₅ |
| A-127 | CH₂(CH₂)₂CH₃ | CH₃ | *-cyclohexyl |
| A-128 | H | | *-naphthyl |

In the table, "*" indicates a site of bonding with the above formula.

TABLE 10

[Phenanthroline with two CH=N-R substituents at 2,9 positions]

| | R¹ | R² |
|---|---|---|
| A-129 | 2-F-C₆H₄-* | 2-F-C₆H₄-* |
| A-130 | 2-F-C₆H₄-* | 2-Cl-C₆H₄-* |
| A-131 | 2-F-C₆H₄-* | 2-Br-C₆H₄-* |
| A-132 | 2-F-C₆H₄-* | 2-CH₃-C₆H₄-* |
| A-133 | 2-Cl-C₆H₄-* | 2-Br-C₆H₄-* |

TABLE 10-continued

| | R¹ | R² |
|---|---|---|
| A-134 | 2-Cl-C₆H₄-* | 2-CH₃-C₆H₄-* |
| A-135 | 2-Cl-C₆H₄-* | 2-Cl-C₆H₄-* |
| A-136 | 2-Br-C₆H₄-* | 2-Br-C₆H₄-* |
| A-137 | 2-Br-C₆H₄-* | 2-CH₃-C₆H₄-* |
| A-138 | 2-CH₃-C₆H₄-* | 2-CH₃-C₆H₄-* |

In the table, "*" indicates a site of bonding with a nitrogen atom.

TABLE 11

[Aniline with R¹ substituent at ortho position]

| | R¹ |
|---|---|
| A-139 | OH |
| A-140 | OCH₃ |
| A-141 | SCH₃ |

TABLE 12

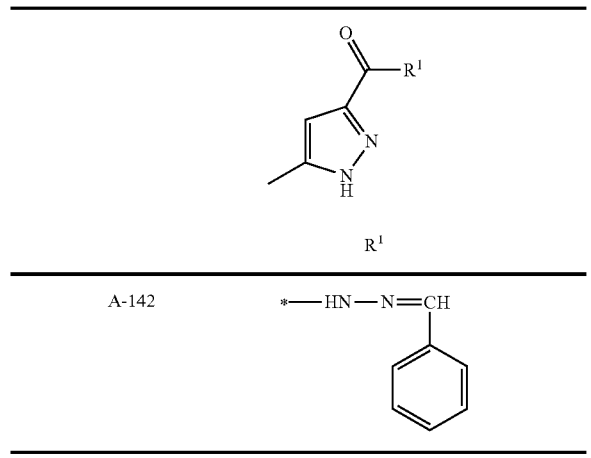

| | R¹ |
|---|---|
| A-142 | *—HN—N=CH—(phenyl) |

In the table, "*" indicates a site of bonding with the above formula.

TABLE 13

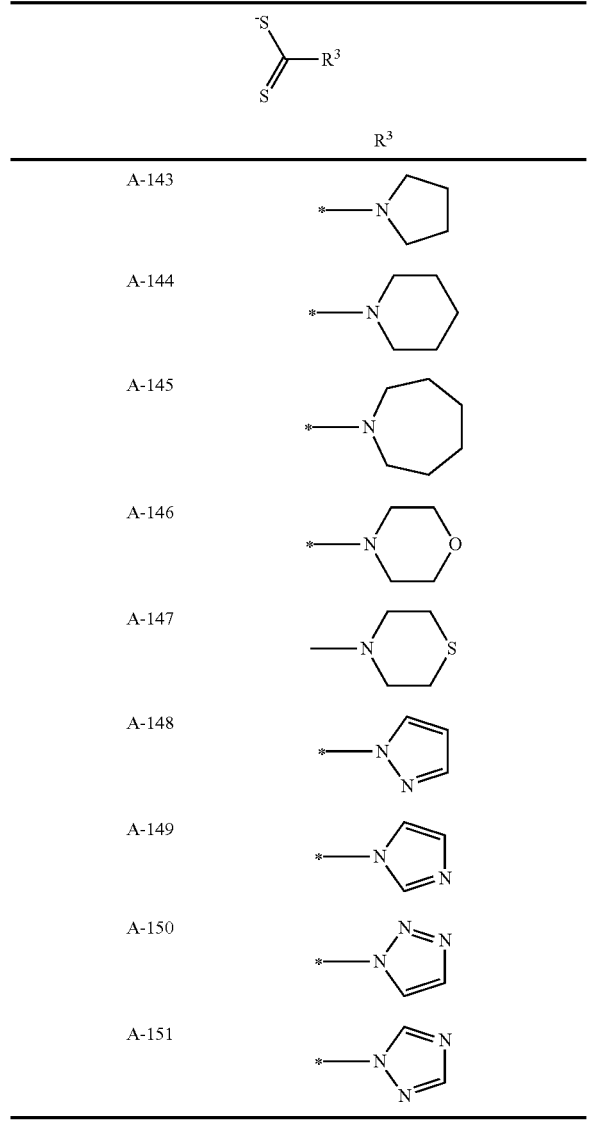

| | R³ |
|---|---|
| A-143 | *—N(pyrrolidine) |
| A-144 | *—N(piperidine) |
| A-145 | *—N(azepane) |
| A-146 | *—N(morpholine) |
| A-147 | —N(thiomorpholine) |
| A-148 | *—N(pyrazole) |
| A-149 | *—N(imidazole) |
| A-150 | *—N(1,2,3-triazole) |
| A-151 | *—N(1,2,4-triazole) |

In the table, "*" indicates a site of bonding with the above formula.

TABLE 14

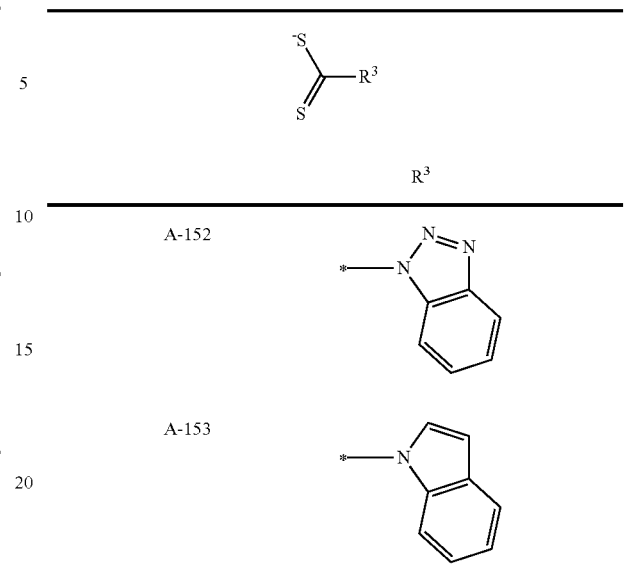

| | R³ |
|---|---|
| A-152 | *—N(benzotriazole) |
| A-153 | *—N(indole) |
| A-154 | *—N(phenoxazine) |
| A-155 | *—N(phenothiazine) |
| A-156 | *—N(carbazole) |
| A-157 | *—N(dibenzazepine) |

In the table, "*" indicates a site of bonding with the above formula.

TABLE 15

| | R¹ | R² | R³ | R⁴ | R⁵ | R⁶ | R⁷ | R⁸ |
|---|---|---|---|---|---|---|---|---|
| A-158 | H | H | H | F | H | H | F | H |
| A-159 | H | H | H | CF₃ | H | H | CF₃ | H |
| A-160 | H | H | H | CN | H | H | CN | H |
| A-161 | H | H | H | COOCH₃ | H | H | COOCH₃ | H |
| A-162 | CH₃ | CH₃ | H | F | H | H | F | H |
| A-163 | CH₃ | CH₃ | H | CF₃ | H | H | CF₃ | H |
| A-164 | CH₃ | CH₃ | H | CN | H | H | CN | H |
| A-165 | CH₃ | CH₃ | H | COOCH₃ | H | H | COOCH₃ | H |
| A-166 | H | CH₃ | H | F | H | H | F | H |
| A-167 | H | CH₃ | H | CF₃ | H | H | CF₃ | H |
| A-168 | H | CH₃ | H | CN | H | H | CN | H |
| A-169 | H | CH₃ | H | COOCH₃ | H | H | COOCH₃ | H |
| A-170 | H | H | F | H | F | F | H | F |
| A-171 | H | H | CF₃ | H | CF₃ | CF₃ | H | CF₃ |
| A-172 | H | H | CN | H | CN | CN | H | CN |
| A-173 | H | H | CN | COOCH₃ | CN | CN | COOCH₃ | CN |
| A-174 | CH₃ | CH₃ | F | H | F | H | H | F |
| A-175 | CH₃ | CH₃ | CF₃ | H | CF₃ | CF₃ | H | CF₃ |
| A-176 | CH₃ | CH₃ | CN | H | CN | CN | H | CN |
| A-177 | CH₃ | CH₃ | COOCH₃ | H | COOCH₃ | COOCH₃ | H | COOCH₃ |
| A-178 | H | CH₃ | F | H | F | F | H | F |
| A-179 | H | CH₃ | CF₃ | H | CF₃ | CF₃ | H | CF₃ |
| A-180 | H | CH₃ | CN | H | CN | CN | H | CN |
| A-181 | H | CH₃ | COOCH₃ | H | COOCH₃ | COOCH₃ | H | COOCH₃ |

In the table, "*" indicates a site of bonding with a metal atom.

TABLE 16

| | R¹ | R² | R³ | R⁴ |
|---|---|---|---|---|
| A-182 | H | H | H | 2-pyridyl |
| A-183 | H | H | H | 1-isoquinolyl |
| A-184 | H | H | H | 2-thienyl |
| A-185 | H | H | H | 2-benzothiazolyl |

TABLE 16-continued

[Structure: benzene ring with R¹, R², R³, R⁴ substituents and ** bonding site]

| | R¹ | R² | R³ | R⁴ |
|---|---|---|---|---|
| A-186 | H | H | H | 3-methylpyridin-2-yl |
| A-187 | H | H | H | 5-methylpyridin-2-yl |
| A-188 | H | H | H | 3-methylpyridin-2-yl (alt) |
| A-189 | H | H | H | 4-phenylpyridin-2-yl |

In the table, "*" indicates a site of bonding with the above formula.
In the table, "**" indicates a site of bonding with a metal atom.

TABLE 17

[Structure: benzene ring with R¹, R², R³, R⁴ substituents and ** bonding site]

| | R¹ | R² | R³ | R⁴ |
|---|---|---|---|---|
| A-190 | H | H | H | 5-phenylpyridin-2-yl |
| A-191 | H | H | H | 3-phenylpyridin-2-yl |
| A-192 | H | CH₃ | H | pyridin-2-yl |
| A-193 | CH₃ | H | H | pyridin-2-yl |
| A-194 | H | H | CH₃ | pyridin-2-yl |
| A-195 | H | C₆H₅ | H | pyridin-2-yl |
| A-196 | C₆H₅ | H | H | pyridin-2-yl |
| A-197 | H | H | C₆H₅ | pyridin-2-yl |

In the table, "*" indicates a site of bonding with the above formula.
In the table, "**" indicates a site of bonding with a metal atom.

TABLE 18
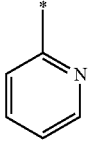
| | R¹ | R² | R³ | R⁴ |
|---|---|---|---|---|
| A-198 | F | H | H | 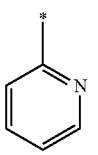 |
| A-199 | CF₃ | H | H | 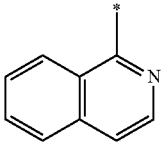 |
| A-200 | F | H | H | 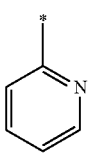 |
| A-201 | CH₂CH₃ | H | H | 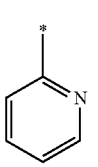 |
| A-202 | n-C₃H₇ | H | H | 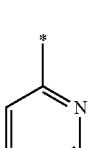 |
| A-203 | n-C₄H₉ | H | H | 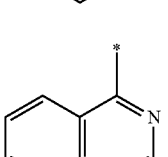 |
| A-204 | n-C₃H₇ | H | H | 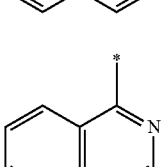 |
| A-205 | n-C₄H₉ | H | H | 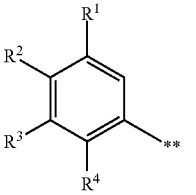 |
TABLE 18-continued
| | R¹ | R² | R³ | R⁴ |
|---|---|---|---|---|
| A-206 | n-C₆H₁₃ | H | H | 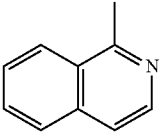 |
In the table, "*" indicates a site of bonding with the above formula.
In the table, "**" indicates a site of bonding with a metal atom.
TABLE 19
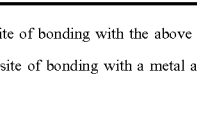
| | R¹ |
|---|---|
| A-207 | 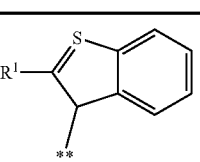 |
| A-208 | 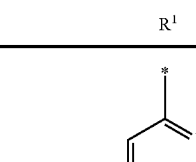 |
| A-209 | 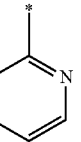 |
| A-210 | 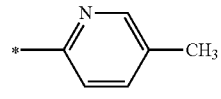 |
| A-211 | 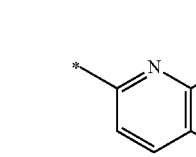 |

TABLE 19-continued

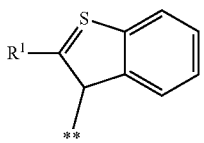

| | $R^1$ |
|---|---|
| A-212 | 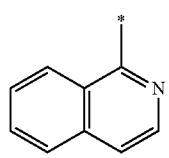 |
| A-213 | $C_6H_5$ |

In the table, "*" indicates a site of bonding with the above formula.
In the table, "**" indicates a site of bonding with a metal atom.

TABLE 20

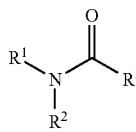

| | $R^1$ | $R^2$ | $R^3$ |
|---|---|---|---|
| A-214 | $CH_3$ | $CH_3$ | H |

TABLE 21

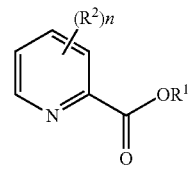

| | $R^1$ | $R^2$ |
|---|---|---|
| A-215 | H | H |
| A-216 | $CH_3$ | H |
| A-217 | 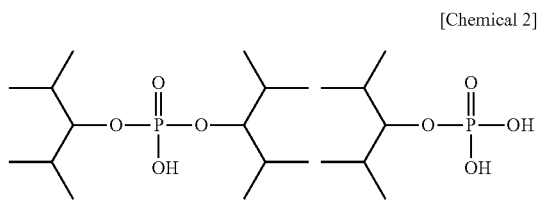 | H |
| A-218 | $CH_3$ | $COCH_3$ |
| A-219 | 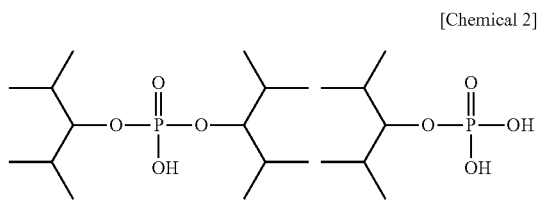 | $COCH_3$ |

In the table, "*" indicates a site of bonding with an oxygen atom.

The compounds which configure the ligands may be synthesized referring to publicly known methods. For example, the phosphoric acid ester shown below may be obtained by adding triethylamine to a tetrahydrofuran (THF) solution of 2,4-dimethylpentanol, stirring the mixture at 0° C. for 5 minutes, dropping thereinto phosphorus oxychloride, and stirring the mixture at room temperature for 6 hours to thereby complete the reaction. Upon completion of the reaction, the reaction liquid is poured into water so as not to elevate the temperature by 30° C. or more, separated in a chloroform/water system, and the solvent in the organic layer is distilled off to thereby obtain the phosphoric acid ester shown below:

[Chemical 2]

In the synthesis of the phosphate-copper complex compound, also commercially available phosphonic acids under the trade names of Phosmer M, Phosmer PE and Phosmer PP (from Uni-Chemical Co. Ltd.) may be used.

The copper salt used herein preferably contains divalent or trivalent copper, and more preferably divalent copper. Preferable examples of the copper salt include copper acetate, copper chloride, copper formate, copper stearate, copper benzoate, copper ethyl acetoacetate, copper pyrophosphate, copper naphthenate, copper citrate, copper nitrate, copper sulfate, copper carbonate, copper chlorate and copper (meth)acrylate, and more preferable examples include copper benzoate and copper (meth)acrylate.

Specific examples of the copper compound used in the present invention include Exemplary Compounds (Cu-1) to (Cu-219) shown below. The present invention is, of course, not limited to these compounds.

TABLE 22

Cu(L)$_n$·X Formula (1)

| | L | n | X |
|---|---|---|---|
| Cu-1 | A-1 | 2 | — |
| Cu-2 | A-2 | 2 | — |
| Cu-3 | A-3 | 2 | — |
| Cu-4 | A-4 | 2 | — |
| Cu-5 | A-5 | 2 | — |
| Cu-6 | A-6 | 2 | — |
| Cu-7 | A-7 | 2 | — |
| Cu-8 | A-8 | 2 | — |
| Cu-9 | A-9 | 2 | — |
| Cu-10 | A-10 | 2 | — |
| Cu-11 | A-11 | 2 | — |
| Cu-12 | A-12 | 2 | — |
| Cu-13 | A-13 | 2 | — |
| Cu-14 | A-14 | 2 | — |
| Cu-15 | A-15 | 2 | — |
| Cu-16 | A-16 | 2 | — |
| Cu-17 | A-17 | 2 | — |
| Cu-18 | A-18 | 2 | — |
| Cu-19 | A-19 | 2 | — |
| Cu-20 | A-20 | 2 | — |

TABLE 23

Cu(L)$_n$·X Formula (1)

| | L | n | X |
|---|---|---|---|
| Cu-21 | A-21 | 2 | — |
| Cu-22 | A-22 | 2 | — |
| Cu-23 | A-23 | 2 | — |

TABLE 23-continued

| Cu(L)$_n$·X Formula (1) | | | |
|---|---|---|---|
| | L | n | X |
| Cu-24 | A-24 | 2 | — |
| Cu-25 | A-25 | 2 | — |
| Cu-26 | A-26 | 2 | — |
| Cu-27 | A-27 | 2 | — |
| Cu-28 | A-28 | 2 | — |
| Cu-29 | A-29 | 2 | — |
| Cu-30 | A-30 | 2 | — |
| Cu-31 | A-31 | 2 | — |
| Cu-32 | A-32 | 2 | — |
| Cu-33 | A-33 | 2 | — |
| Cu-34 | A-34 | 2 | — |
| Cu-35 | A-35 | 2 | — |
| Cu-36 | A-36 | 2 | — |
| Cu-37 | A-37 | 2 | — |
| Cu-38 | A-38 | 2 | — |
| Cu-39 | A-39 | 2 | — |
| Cu-40 | A-40 | 2 | — |

TABLE 24

| Cu(L)$_n$·X Formula (1) | | | |
|---|---|---|---|
| | L | n | X |
| Cu-41 | A-41 | 2 | — |
| Cu-42 | A-42 | 2 | — |
| Cu-43 | A-43 | 2 | — |
| Cu-44 | A-44 | 2 | — |
| Cu-45 | A-45 | 2 | — |
| Cu-46 | A-46 | 2 | — |
| Cu-47 | A-47 | 2 | — |
| Cu-48 | A-48 | 2 | — |
| Cu-49 | A-49 | 2 | — |
| Cu-50 | A-50 | 2 | — |
| Cu-51 | A-51 | 2 | — |
| Cu-52 | A-52 | 2 | — |
| Cu-53 | A-53 | 2 | — |
| Cu-54 | A-54 | 2 | — |
| Cu-55 | A-55 | 2 | — |
| Cu-56 | A-56 | 2 | — |
| Cu-57 | A-57 | 2 | — |
| Cu-58 | A-58 | 2 | — |
| Cu-59 | A-59 | 2 | — |
| Cu-60 | A-60 | 2 | — |

TABLE 25

| Cu(L)$_n$·X Formula (1) | | | |
|---|---|---|---|
| | L | n | X |
| Cu-61 | A-61 | 2 | — |
| Cu-62 | A-62 | 2 | — |
| Cu-63 | A-63 | 2 | — |
| Cu-64 | A-64 | 2 | — |
| Cu-65 | A-65 | 2 | — |
| Cu-66 | A-66 | 2 | — |
| Cu-67 | A-67 | 2 | — |
| Cu-68 | A-68 | 2 | — |
| Cu-69 | A-69 | 2 | — |
| Cu-70 | A-70 | 2 | — |
| Cu-71 | A-71 | 2 | — |
| Cu-72 | A-72 | 2 | — |
| Cu-73 | A-73 | 2 | — |
| Cu-74 | A-74 | 2 | — |
| Cu-75 | A-75 | 2 | — |
| Cu-76 | A-76 | 2 | — |
| Cu-77 | A-77 | 2 | — |
| Cu-78 | A-78 | 2 | — |
| Cu-79 | A-79 | 2 | — |
| Cu-80 | A-80 | 2 | — |

TABLE 26

| Cu(L)$_n$·X Formula (1) | | | |
|---|---|---|---|
| | L | n | X |
| Cu-81 | A-81 | 2 | — |
| Cu-82 | A-82 | 2 | — |
| Cu-83 | A-83 | 2 | — |
| Cu-84 | A-84 | 2 | — |
| Cu-85 | A-85 | 2 | — |
| Cu-86 | A-86 | 2 | — |
| Cu-87 | A-87 | 2 | — |
| Cu-88 | A-88 | 2 | — |
| Cu-89 | A-89 | 2 | — |
| Cu-90 | A-90 | 2 | — |
| Cu-91 | A-91 | 2 | — |
| Cu-92 | A-92 | 2 | — |
| Cu-93 | A-93 | 2 | — |
| Cu-94 | A-94 | 2 | — |
| Cu-95 | A-95 | 2 | — |
| Cu-96 | A-96 | 2 | — |
| Cu-97 | A-97 | 2 | — |
| Cu-98 | A-98 | 2 | — |
| Cu-99 | A-99 | 2 | — |
| Cu-100 | A-100 | 2 | — |

TABLE 27

| Cu(L)$_n$·X Formula (1) | | | |
|---|---|---|---|
| | L | n | X |
| Cu-101 | A-101 | 2 | — |
| Cu-102 | A-102 | 2 | — |
| Cu-103 | A-103 | 2 | — |
| Cu-103 | A-103 | 2 | — |
| Cu-104 | A-104 | 2 | — |
| Cu-105 | A-105 | 2 | — |
| Cu-106 | A-106 | 2 | — |
| Cu-107 | A-107 | 2 | SO$_4$ |
| Cu-108 | A-108 | 2 | SO$_4$ |
| Cu-109 | A-109 | 2 | SO$_4$ |
| Cu-110 | A-110 | 2 | (NO$_3$)$_2$ |
| Cu-111 | A-111 | 2 | (NO$_3$)$_2$ |
| Cu-112 | A-112 | 2 | (ClO$_4$)$_2$ |
| Cu-113 | A-113 | 2 | — |
| Cu-114 | A-114 | 2 | — |
| Cu-115 | A-115 | 2 | — |
| Cu-116 | A-116 | 2 | — |
| Cu-117 | A-117 | 2 | — |
| Cu-118 | A-118 | 2 | — |
| Cu-119 | A-119 | 2 | — |
| Cu-120 | A-120 | 2 | — |

TABLE 28

| Cu(L)$_n$·X Formula (1) | | | |
|---|---|---|---|
| | L | n | X |
| Cu-121 | A-121 | 2 | — |
| Cu-122 | A-122 | 2 | — |
| Cu-123 | A-123 | 2 | — |
| Cu-124 | A-124 | 2 | — |
| Cu-125 | A-125 | 2 | — |
| Cu-126 | A-126 | 2 | — |
| Cu-127 | A-127 | 2 | — |

TABLE 28-continued

Cu(L)$_n$·X Formula (1)

|  | L | n | X |
|---|---|---|---|
| Cu-128 | A-128 | 2 | — |
| Cu-129 | A-129 | 1 | (ClO$_4$)$_2$ |
| Cu-130 | A-130 | 1 | (ClO$_4$)$_2$ |
| Cu-131 | A-131 | 1 | (ClO$_4$)$_2$ |
| Cu-132 | A-132 | 1 | (ClO$_4$)$_2$ |
| Cu-133 | A-133 | 1 | (ClO$_4$)$_2$ |
| Cu-134 | A-134 | 1 | (ClO$_4$)$_2$ |
| Cu-135 | A-135 | 1 | (ClO$_4$)$_2$ |
| Cu-136 | A-136 | 1 | (ClO$_4$)$_2$ |
| Cu-137 | A-137 | 1 | (ClO$_4$)$_2$ |
| Cu-138 | A-138 | 1 | (ClO$_4$)$_2$ |
| Cu-139 | A-139 | 2 | — |
| Cu-140 | A-140 | 2 | — |

TABLE 29

Cu(L)$_n$·X Formula (1)

|  | L | n | X |
|---|---|---|---|
| Cu-141 | A-141 | 2 | — |
| Cu-142 | A-142 | 2 | Cl$_2$ |
| Cu-143 | A-143 | 2 | — |
| Cu-144 | A-144 | 2 | — |
| Cu-145 | A-145 | 2 | — |
| Cu-146 | A-146 | 2 | — |
| Cu-147 | A-147 | 2 | — |
| Cu-148 | A-148 | 2 | — |
| Cu-149 | A-149 | 2 | — |
| Cu-150 | A-150 | 2 | — |
| Cu-151 | A-151 | 2 | — |
| Cu-152 | A-152 | 2 | — |
| Cu-153 | A-153 | 2 | — |
| Cu-154 | A-154 | 2 | — |
| Cu-155 | A-155 | 2 | — |
| Cu-156 | A-156 | 2 | — |
| Cu-157 | A-157 | 2 | — |
| Cu-158 | A-158 | 2 | — |
| Cu-159 | A-159 | 2 | — |
| Cu-160 | A-160 | 2 | — |

TABLE 30

Cu(L)$_n$·X Formula (1)

|  | L | n | X |
|---|---|---|---|
| Cu-161 | A-161 | 2 | — |
| Cu-162 | A-162 | 2 | — |
| Cu-163 | A-163 | 2 | — |
| Cu-164 | A-164 | 2 | — |
| Cu-165 | A-165 | 2 | — |
| Cu-166 | A-166 | 2 | — |
| Cu-167 | A-167 | 2 | — |
| Cu-168 | A-168 | 2 | — |
| Cu-169 | A-169 | 2 | — |
| Cu-170 | A-170 | 2 | — |
| Cu-171 | A-171 | 2 | — |
| Cu-172 | A-172 | 2 | — |
| Cu-173 | A-173 | 2 | — |
| Cu-174 | A-174 | 2 | — |
| Cu-175 | A-175 | 2 | — |
| Cu-176 | A-176 | 2 | — |
| Cu-177 | A-177 | 2 | — |
| Cu-178 | A-178 | 2 | — |
| Cu-179 | A-179 | 2 | — |
| Cu-180 | A-180 | 2 | — |

TABLE 31

Cu(L)$_n$·X Formula (1)

|  | L | n | X |
|---|---|---|---|
| Cu-181 | A-181 | 2 | — |
| Cu-182 | A-182 | 2 | — |
| Cu-183 | A-183 | 2 | — |
| Cu-184 | A-184 | 2 | — |
| Cu-185 | A-185 | 2 | — |
| Cu-186 | A-186 | 2 | — |
| Cu-187 | A-187 | 2 | — |
| Cu-188 | A-188 | 2 | — |
| Cu-189 | A-189 | 2 | — |
| Cu-190 | A-190 | 2 | SO$_4$ |
| Cu-191 | A-191 | 2 | SO$_4$ |
| Cu-192 | A-192 | 2 | SO$_4$ |
| Cu-193 | A-193 | 2 | (NO$_3$)$_2$ |
| Cu-194 | A-194 | 2 | (NO$_3$)$_2$ |
| Cu-195 | A-195 | 2 | (ClO$_4$)$_2$ |
| Cu-196 | A-196 | 2 | Cl$_2$ |
| Cu-197 | A-197 | 2 | Cl$_2$ |
| Cu-198 | A-198 | 2 | (CN)$_2$ |
| Cu-199 | A-199 | 2 | (CN)$_2$ |
| Cu-200 | A-200 | 2 | SO$_4$ |

TABLE 32

Cu(L)$_n$·X Formula (1)

|  | L | n | X |
|---|---|---|---|
| Cu-201 | A-201 | 2 | (NO$_3$)$_2$ |
| Cu-202 | A-202 | 2 | (NO$_3$)$_2$ |
| Cu-203 | A-203 | 2 | (CN)$_2$ |
| Cu-204 | A-204 | 2 | (CN)$_2$ |
| Cu-205 | A-205 | 2 | (ClO$_4$)$_2$ |
| Cu-206 | A-206 | 2 | (ClO$_4$)$_2$ |
| Cu-207 | A-207 | 2 | SO$_4$ |
| Cu-208 | A-208 | 2 | SO$_4$ |
| Cu-209 | A-209 | 2 | (NO$_3$)$_2$ |
| Cu-210 | A-210 | 2 | (CN)$_2$ |
| Cu-211 | A-211 | 2 | (SCN)$_2$ |
| Cu-212 | A-212 | 2 | (SCN)$_2$ |
| Cu-213 | A-213 | 2 | Cl$_2$ |
| Cu-214 | A-214 | 2 | Cl$_2$ |
| Cu-215 | A-215 | 2 | SO$_4$ |
| Cu-216 | A-216 | 2 | SO$_4$ |
| Cu-217 | A-217 | 2 | (NO$_3$)$_2$ |
| Cu-218 | A-218 | 2 | (NO$_3$)$_2$ |
| Cu-219 | A-219 | 2 | (ClO$_4$)$_2$ |

<Solvents>

The compositions of the present invention comprise a solvent. The solvent may be a single solvent or a mixture of two or more solvents. The solvent has a boiling point of 90 to 200° C., preferably 110 to 180° C., more preferably 120 to 160° C. at 1 atm. When the boiling point of the solvent is in the above ranges, a uniform coated surface profile can be achieved while reducing variation in near-infrared absorptive ability due to repeated coating.

When the solvent is a mixture containing two or more solvents, the boiling point refers to the weighted mean of the boiling points of all the solvents according to the weight ratio of the individual solvents.

Preferably, the solvent used in the compositions of the present invention has a density of 0.90 g/cm$^3$ or more, more preferably 0.91 g/cm$^3$ or more, still more preferably 0.94 g/cm$^3$ or more. When the density of the solvent is in the above ranges, further improvements tend to be achieved in the combination of the uniformity of the coated surface profile and reduction of variation in near-infrared absorptive ability due to repeated coating. The upper limit of the density of the solvent is not specifically limited, but typically 1 g/cm$^3$.

As used herein, the density refers to the density determined at 1 atm and 20° C., unless otherwise specified. When two or more solvents are contained, the density refers to the weighted mean of the densities of all the solvents according to the weight ratio of the individual solvents.

When one solvent is used in the present invention, the solvent can be selected from those having a boiling point of 90 to 200° C. at 1 atm as exemplified below. When a mixture of solvents is used, the solvents can be selected from those exemplified below so that the weighted mean of the boiling points of all the solvents according to the weight ratio of the individual solvents falls in the range of 90 to 200° C. at 1 atm. When a mixture of two or more solvents is used, a solvent having a boiling point of 150° C. or less and a solvent having a boiling point of 151 to 200° C. at 1 atm are preferably used in the mixture.

Preferred solvents include:

alcohols such as methanol, ethanol, n-propanol, isopropanol, n-butanol, soc-butanol, n-hexanol, propylene glycol, butoxypropanol, ethoxypropanol, butoxyethanol and the like;

ketones such as acetone, methyl ethyl ketone, methyl isobutyl ketone, cyclohexanone, cyclopentanone, 2-heptanone, 3-heptanone and the like;

esters such as ethyl acetate, n-butyl acetate, n-amyl acetate, isobutyl acetate, amyl formate, isoamyl acetate, isobutyl acetate, ethyl propionate, butyl propionate, isopropyl butyrate, ethyl butyrate, butyl butyrate, methyl lactate, ethyl lactate, dimethyl phthalate, ethyl benzoate, methyl sulfate, alkyl oxyacetates (examples: methyl oxyacetates, ethyl oxyacetates, butyl oxyacetates (e.g., methyl methoxyacetate, ethyl methoxyacetate, butyl methoxyacetate, methyl ethoxyacetate, ethyl ethoxyacetate and the like)), 3-oxypropionic acid alkyl esters (examples: methyl 3-oxypropionates, ethyl 3-oxypropionates and the like (e.g., methyl 3-methoxypropionate, ethyl 3-methoxypropionate, methyl 3-ethoxypropionate, ethyl 3-ethoxypropionate and the like)), 2-oxypropionic acid alkyl esters (examples: methyl 2-oxypropionates, ethyl 2-oxypropionates, propyl 2-oxypropionates and the like (e.g., methyl 2-methoxypropionate, ethyl 2-methoxypropionate, propyl 2-methoxypropionate, methyl 2-ethoxypropionate, ethyl 2-ethoxypropionate), methyl 2-oxy-2-methylpropionates and ethyl 2-oxy-2-methylpropionates (e.g., methyl 2-methoxy-2-methylpropionate, ethyl 2-ethoxy-2-methylpropionate and the like)), methyl pyruvate, ethyl pyruvate, propyl pyruvate, methyl acetoacetate, ethyl acetoacetate, methyl 2-oxobutanoate, ethyl 2-oxobutanoate and the like;

others such as diethylene glycol dimethyl ether (methyl diglyme), dipropylene glycol dimethyl ether, tetrahydrofuran, diethyl ether, ethylene glycol monomethyl ether, ethylene glycol monoethyl ether, ethylene glycol monobutyl ether acetate, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, propylene glycol mono-n-butyl ether, propylene glycol mono-tert-butyl ether, dipropylene glycol monomethyl ether and the like;

aromatic hydrocarbons such as toluene, xylene, benzene, ethylbenzene and the like;

halogenated hydrocarbons such as carbon tetrachloride, trichloroethylene, chloroform, 1,1,1-trichloroethane, methylene chloride, monochlorobenzene and the like; and dimethylformamide, dimethylacetamide, dimethyl sulfoxide, sulfolane and the like.

Among them, preferred are PGMEA (propylene glycol monomethyl ether acetate), PGME (propylene glycol monomethyl ether), cyclohexanone, ethyl 3-ethoxypropionate, and propylene glycol.

Also preferred is at least one kind selected from propylene glycol, propylene glycol monomethyl ether acetate, butoxypropanol, ethoxypropanol, ethyl lactate, dipropylene glycol monomethyl ether, butoxyethanol, dimethylformamide, dimethyl sulfoxide, dimethylacetamide and methyl diglyme.

Two or more of these solvents may be mixed to improve the solubility for UV absorbers and alkali-soluble resins, the coated surface profile and the like. In such cases, especially preferred are mixed solutions composed of two or more members selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, ethylene glycol monobutyl ether acetate, propylene glycol methyl ether, and propylene glycol methyl ether acetate among the list shown above.

Also preferred are mixed solutions composed of two or more members selected from propylene glycol, propylene glycol monomethyl ether acetate, butoxypropanol, ethoxypropanol, ethyl lactate, dipropylene glycol monomethyl ether, butoxyethanol, dimethylformamide, dimethyl sulfoxide, dimethylacetamide, and methyl diglyme.

Especially, a mixed solution of propylene glycol monomethyl ether acetate with butoxypropanol, ethoxypropanol, ethyl lactate, dipropylene glycol monomethyl ether, butoxyethanol, dimethylformamide, dimethyl sulfoxide, dimethylacetamide or methyl diglyme is more preferred, still more preferably a mixed solution of propylene glycol monomethyl ether acetate with dimethylformamide or dimethyl sulfoxide. In this mixed solution, the weight ratio of propylene glycol monomethyl ether acetate to the other solvent is preferably 99:1 to 50:50, more preferably 95:5 to 80:20.

The solvent should preferably be contained in the compositions in an amount of 30 to 65% by mass, more preferably 35 to 65% by mass, especially preferably 40 to 65% by mass based on the total amount of the compositions to improve coatability. When two or more solvents are used, the total amount should be in the above ranges.

<Polymerizable Compounds>

The compositions of the present invention preferably comprise a compound having a polymerizable group (hereinafter sometimes referred to as "polymerizable compound"). In the present invention, a polymerizable compound is contained as a solid component of the compositions of the present invention (i.e., a solid component other than the copper compound (copper complex)), whereby thermal curing reactions proceed at the same time as the solvent is dried, which helps films to uniformly solidify and further reduces variation in the near-infrared absorptive ability of thin films due to repeated coating.

Such compounds are widely known in the field of industry, and can be used in the present invention without any specific limitation. These may be in any chemical forms such as monomers, oligomers, prepolymers, polymers and the like. It should be noted that the polymerizable compound used in the present invention may be photocurable, but preferably heat curable.

The polymerizable compound may be monofunctional or polyfunctional, but preferably polyfunctional. Near-infrared blocking ability and heat resistance can be further improved by incorporating a polyfunctional compound. The number of functional groups of the polymerizable compound is not specifically limited, but preferably 2 to 8.

<<Polymerizable Monomer and Polymerizable Oligomer>>

A first preferable embodiment of the composition of the present invention contains a monomer having polymerizable group (hereinafter, also referred to as polymerizable monomer) or an oligomer having at least two of polymerizable groups (hereinafter, also referred to as polymerizable oligomer) (the polymerizable monomer and the polymerizable oligomer may collectively be referred to as "polymerizable monomer, etc.", hereinafter), as the polymerizable compound.

Examples of the polymerizable monomer, etc. include unsaturated carboxylic acid (acrylic acid, methacrylic acid, itaconic acid, crotonic acid, isocrotonic acid, maleic acid, etc.) and esters and amides thereof, and preferably include ester formed between unsaturated carboxylic acid and aliphatic polyhydric alcohol compound, and amide formed between unsaturated carboxylic acid and aliphatic multivalent amine compound. Also preferably used are adducts of unsaturated carboxylic acid esters or amides having a nucleophilic substituent such as hydroxy group, amino group, or mercapto group, with monofunctional or polyfunctional isocyanates or epoxy compounds; and dehydration condensation products with monofunctional or polyfunctional carboxylic acid. Also preferably used are adducts of unsaturated carboxylic acid esters or amides having an electrophilic substituent such as isocyanate group or epoxy group, with monofunctional or polyfunctional alcohols, amines, or thiols; and substitution products formed between unsaturated carboxylic acid esters or amides having an eliminatable substituent such as halogen group or tosyloxy group, with monofunctional or polyfunctional alcohols, amines, or thiols. Other examples usable herein include compounds obtained by replacing the above-described unsaturated carboxylic acid with unsaturated phosphonic acid, vinylbenzene derivative such as styrene, vinyl ether, allyl ether or the like.

Specific example of these compounds are described in paragraphs [0095] to [0108] of JP-A-2009-288705, all of which are also preferably used in the present invention.

The polymerizable monomer, etc. is also preferably a compound having at least one addition-polymerizable ethylene group, and having an ethylenic unsaturated group and showing a boiling point under normal pressure of 100° C. or above. The examples of which include monofunctional acrylate or methacrylate such as polyethylene glycol mono (meth) acrylate, polypropylene glycol mono(meth) acrylate; compounds obtained by adding ethylene oxide or propylene oxide to polyfunctional alcohol, followed by conversion into (meth) acrylate, such as polyethylene glycol di(meth)acrylate, trimethylolethane tri(meth)acrylate, neopentylglycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri (acryloyloxypropyl)ether, tri(acryloyloxyethyl) isocyanurate, glycerin and trimethylolethane; urethane (meth)acrylates such as those described in JP-B-S48-41708, JP-R-S50-6034 and JP-A-S51-37193; polyester acrylates such as those described in JP-A-S48-64183, JP-B-S49-43191 and JP-B-S52-30490; and epoxy acrylates obtained by reacting epoxy polymer with (meth)acrylic acid.

Other examples include polyfunctional (meth)acrylate obtained by reacting polyfunctional carboxylic acid with a compound having a cyclic ether group and an ethylenic unsaturated group, such as glycidyl (meth)acrylate.

Other examples of preferable polymerizable monomer usable herein include compounds having a fluorene ring and two or more ethylenic polymerizable groups, and cardo polymer, such as those described in JP-A-2010-160418, JP-A-2010-129825, Japanese Patent No. 4364216 and so forth.

As the compound having an ethylenic unsaturated group and showing a boiling point under normal pressure of 100° C. or above, also the compounds described in paragraphs [0254] to [0257] of JP-A-2008-292970 are preferable.

Also usable herein as the polymerizable monomer are the compounds obtained by adding ethylene oxide or propylene oxide to polyfunctional alcohol, followed by conversion into (meth)acrylate, such as those represented by the formulae (1) and (2) and specifically enumerated in JP-A-H10-62986.

The polymerizable monomer used in the present invention is more preferably polymerizable monomers represented by the formulae (MO-1) to (MO-6) below:

[Chemical 3]

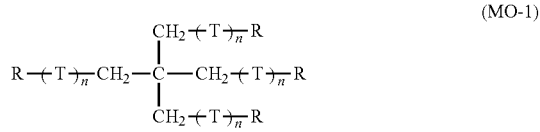

(MO-1)

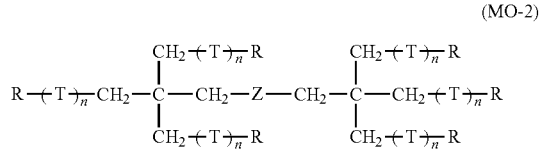

(MO-2)

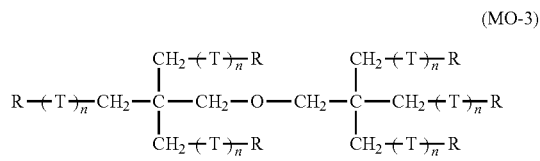

(MO-3)

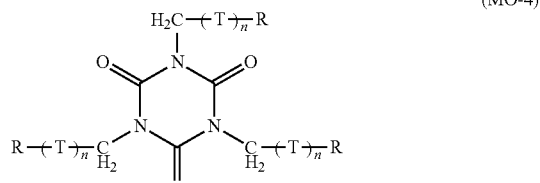

(MO-4)

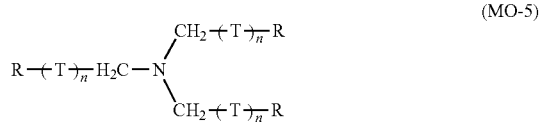

(MO-5)

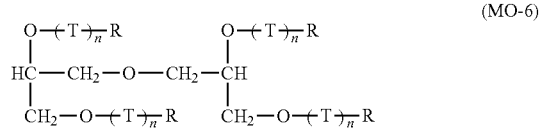

(MO-6)

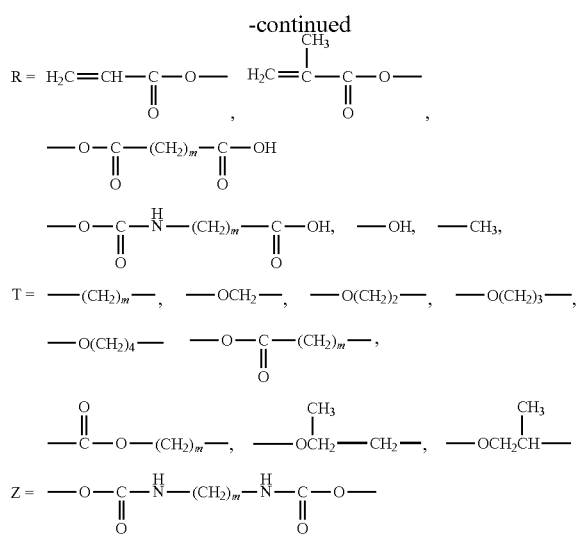

(In the formula, each n represents 0 to 14, and each m represents 1 to 8. A plurality of each of (R)s, (T)s and (Z)s in a single molecule may be same with, or different from each other. When T represents an oxyalkylene group, the carbon terminal thereof is bound to R. At least one of (R)s represents a polymerizable group.)

n is preferably 0 to 5, and more preferably 1 to 3.
m is preferably 1 to 5, and more preferably 1 to 3.
R preferably represents below:

[Chemical 4]

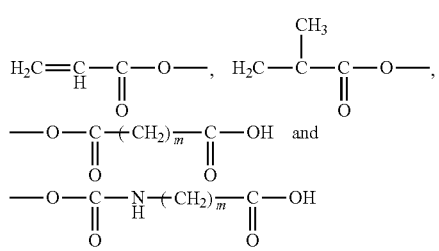

are preferable

[Chemical 5]

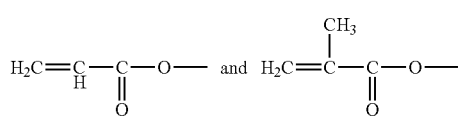

are more preferable.

The radical polymerizable monomers represented by the formulae (MO-1) to (MO-6) are specifically exemplified by those described in paragraphs [0248] to [0251] of JP-A-2007-269779, which are also preferably used in the present invention.

Among others, the polymerizable monomer is preferably a Pentaerythritol tetraacrylate (commercially available under the brand name A-TMMT; Shin-Nakamura Chemical Co., Ltd.), dipentaerythritol triacrylate (commercially available under the brand name KAYARAD D-330 from Nippon Kayaku Co., Ltd.); dipentaerythritol tetraacrylate (commercially available under the brand name KAYARAD D-320 from Nippon Kayaku Co.); dipentaerythritol penta(meth)acrylate (commercially available under the brand name KAYARAD D-310 from Nippon Kayaku Co., Ltd.); dipentaerythritol hexa(meth)acrylate (commercially available under the brand name KAYARAD DPHA from Nippon Kayaku Co., Ltd.); and structures in which these (meth)acryloyl groups have been introduced through ethylene glycol or propylene glycol residues; as well as ethoxylated diglyceryl (meth)acrylate (commercially available under the brand name ARONIX M-460 from Toagosei Co., Ltd.). Their oligomeric counterparts may also be used.

For example, RP-1040 (from Nippon Kayaku Co., Ltd.) and the like may be used.

The polymerizable monomer, etc. may also be a multi-functional monomer, and may have an acid group such as carboxyl group, sulfonic acid group, phosphoric acid group or the like. Accordingly, any polymerizable monomer having an unreacted carboxyl group, such as for the case where the ethylenic compound is a mixture as described above, may be used in its intact form, or if necessary, the ethylenic compound may be introduced with an acid group by allowing a hydroxyl group thereof to react with a non-aromatic carboxylic anhydride. Specific examples of the non-aromatic carboxylic anhydride usable herein include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, the monomer having an acid group is an ester formed between an aliphatic polyhydroxy compound and an unsaturated carboxylic acid, and is preferably a multifunctional monomer introduced with an acid group by allowing an unreacted hydroxyl group of an aliphatic polyhydroxy compound to react with a non-aromatic carboxylic anhydride, and is particularly such ester obtained by using pentaerythritol and/or dipentaerythritol as the aliphatic polyhydroxy compound. Examples of commercially available polybasic acid-modified acrylic oligomer include Aronix Series M-305, M-510 and M-520 from Toagosei Co. Ltd.

The polyfunctional monomer containing an acid group preferably has an acid number of 0.1 to 40 mg-KOH/g, especially preferably 5 to 30 mg-KOH/g. If the acid number of the polyfunctional monomer is too low, development solubility decreases, but if it is too high, such a monomer is difficult to prepare or handle so that photopolymerizability decreases and curability such as surface smoothness of pixels decreases. When two or more polyfunctional monomers containing different acid groups are used in combination or when a polyfunctional monomer containing no acid group is also used, therefore, it is essential to control the acid number of the combination of the polyfunctional monomers in the above ranges.

The composition also preferably contains, as the polymerizable monomer, etc., a polyfunctional monomer having a caprolacton structure.

The polyfunctional monomer having a caprolactone structure is not specifically limited so long as it has in the molecule thereof a caprolactone structure. The examples of which include ε-caprolactone-modified polyfunctional (meth)acrylate which is obtainable by esterifying a polyhydric alcohol such as trimethylolethane, di-trimethylolethane, trimethylolpropane, di-trimethylolpropane, pentaerythritol, di-pentaerythritol, tri-pentaerythritol, glycerin, diglycerol or trimethylolmelamine, using (meth)acrylic acid and ε-caprolactone. Among them, the polyfunctional monomer having a caprolactone structure represented by the formula (1) below is preferable.

[Chemical 6]

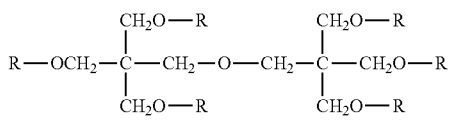

(1)

(In the formula, all of, or one to five of six (R)s represent a group represented by the formula (2) below, and the residual represents a group represented by the formula (3) below.)

[Chemical 7]

(2)

(In the formula, $R^1$ represents a hydrogen atom or methyl group, m represents an integer of 1 or 2, and "*" indicates an atomic bonding.)

[Chemical 8]

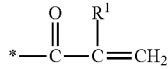

(3)

(In the formula, $R^1$ represents a hydrogen atom or methyl group, and "*" indicates an atomic bonding.)

Such polyfunctional monomer having a caprolactone structure is commercially available, for example, from Nippon Kayaku Co. Ltd. under the trade name of KAYARAD DPCA Series, which includes DPCA-20 (a compound represented by the formulae (1) to (3), where m=1, the number of groups represented by the formula (2) is 2, all ($R^1$)s represent a hydrogen atom), DPCA-30 (in the same formulae, m=1, the number of groups represented by the formula (2) is 3, all ($R^1$)s represent a hydrogen atom), DPCA-60 (in the same formulae, m=1, the number of groups represented by the formula (2) is 6, all ($R^1$)s represent a hydrogen atom), and DPCA-120 (in the same formulae, m=2, the number of groups represented by the formula (2) is 6, all ($R^1$)s represent a hydrogen atom).

In the present invention, a single species of the polyfunctional monomer having a caprolactone structure may be used alone, or two or more species may be used in a mixed manner.

The polymerizable monomer, etc. in the present invention is also preferably at least one species selected from the group consisting of compounds represented by the formula (i) or (ii) below.

[Chemical 9]

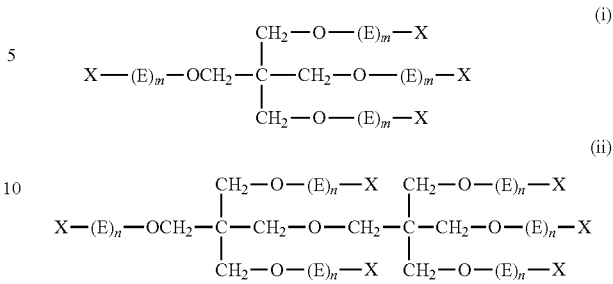

In the formulae (i) and (ii), each E independently represents —(($CH_2)_y CH_2 O$)—, or —(($CH_2)_y CH(CH_3)O$)—, each y independently represents an integer of 0 to 10, and each X independently represents an acryloyl group, methacryloyl group, hydrogen atom, or carboxyl group.

In the formula (i), the total number of acryloyl group and methacryloyl group is 3 or 4, each m independently represents an integer of 0 to 10, and the individual (m)s add up to an integer of 0 to 40. When the individual (m)s add up to 0, any one of (X)s represents a carboxyl group.

In the formula (ii), the total number of acryloyl group and methacryloyl group is 5 or 6, each n independently represents an integer of 0 to 10, and the individual (n)s add up to an integer of 0 to 60. When the individual (n)s add up to 0, any one of (X)s represents a carboxyl group.

In the formula (i), m preferably represents an integer of 0 to 6, and more preferably of 0 to 4. The individual (m)s preferably add up to an integer of 2 to 40, more preferably to an integer of 2 to 16, and particularly to an integer of 4 to 8.

In the formula (ii), n preferably represents an integer of 0 to 6, and more preferably 0 to 4. The individual (n)s preferably add up to an integer of 3 to 60, more preferably to an integer of 3 to 24, and particularly to an integer of 6 to 12.

In the formula (i) or formula (ii), —(($CH_2)_y CH_2 O$)— or —(($CH_2)_y CH(CH_3)O$)— is preferably bound to X, at the terminal thereof on the oxygen atom side.

A single species of the compound represented by the formula (i) or (ii) may be used alone, or two or more species thereof may be used in combination. In particular, a compound having acryloyl groups for all of six (X)s in the formula (ii) is preferable.

The compound represented by the formula (i) or (ii) may be synthesized by publicly known processes, such as a process of proceeding a ring-opening addition polymerization of pentaerytyritol or dipentaerytyritol with ethylene oxide or propylene oxide to thereby combine the ring-opened skeleton, and a process of allowing, for example, (meth)acryloyl chloride to react with the terminal hydroxyl group of the ring-opened skeleton, to thereby introduce a (meth)acryloyl group. The individual processes have been well-known, so that those skilled in the art will readily synthesize the compound represented by the formula (i) or (ii).

Among the compounds represented by the formula (i) or (ii), pentaerythritol derivative and/or dipentaerythritol derivative are more preferable.

More specifically, compounds represented by the formulae (a) to (f) below (also referred to as "Exemplary Compounds (a) to (f)", hereinafter) are exemplified, and among them, Exemplary Compounds (a), (b), (e) and (f) are preferable.

[Chemical 10]
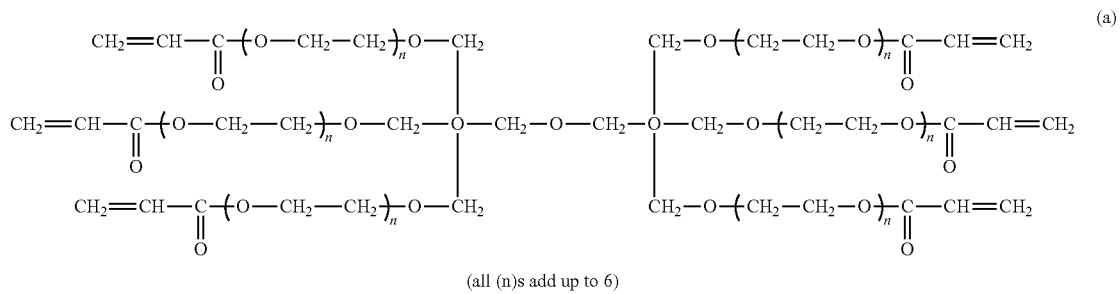
(a) (all (n)s add up to 6)
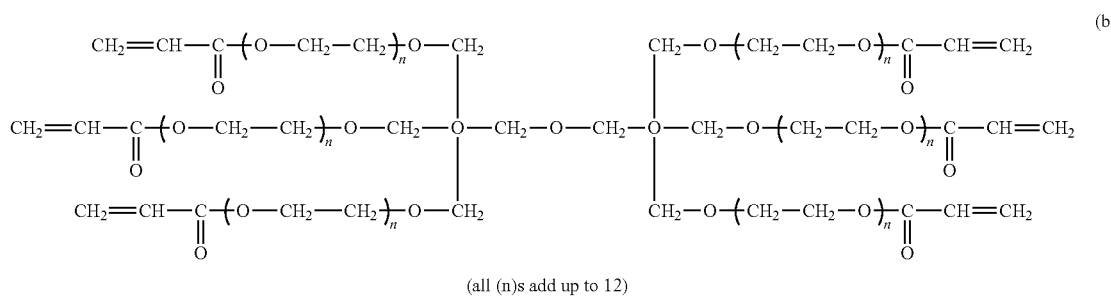
(b) (all (n)s add up to 12)
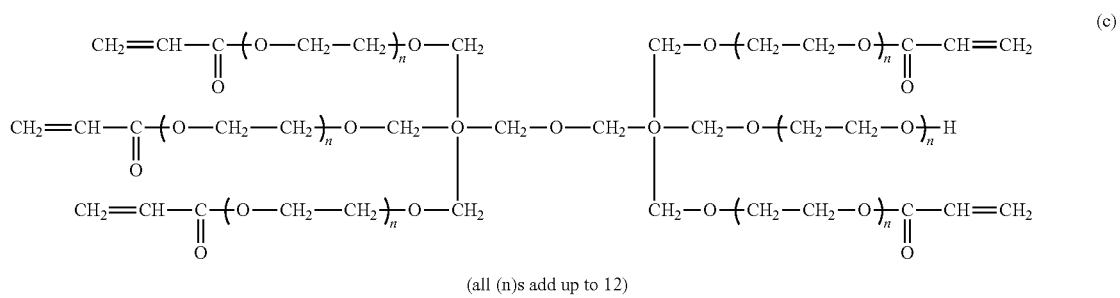
(c) (all (n)s add up to 12)
[Chemical 11]
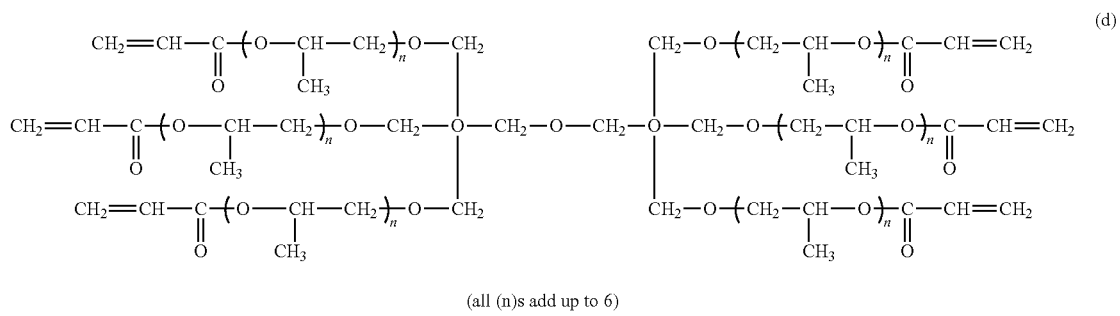
(d) (all (n)s add up to 6)
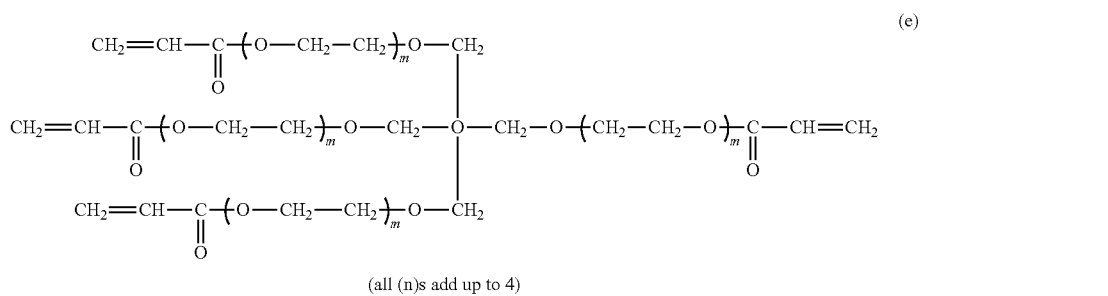
(e) (all (n)s add up to 4)

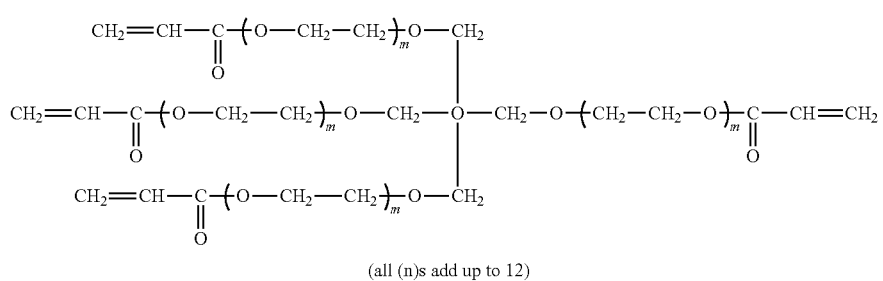

(all (n)s add up to 12)

Examples of the polymerizable monomer, etc. represented by the formulae (i), (ii) which are commercially available include SR-494 from Sartomer, which is a tetrafunctional acrylate having four ethyleneoxy chains, DPCA-60 which is a hexafunctional acrylate having six pentylenoxy chains, and TPA-330 which is a trifunctional acrylate having three isobutylenoxy chains, the both from Nippon Kayaku Co. Ltd.

Other preferable examples of the polymerizable monomer, etc. include urethane acrylates described in JP-B-S48-41708, JP-A-S51-37193, JP-B-H2-32293 and JP-B-H2-16765, and urethane compounds having an ethylene oxide-based skeleton described in JP-B-S58-49860, JP-B-S56-17654, JP-B-S62-39417 and JP-B-S62-39418. Moreover, by using, as the polymerizable monomer, etc., an addition polymerizable monomer having in the molecule thereof an amino structure or sulfide structure, described in JP-A-S63-277653, JP-A-S63-260909 and JP-A-H01-105238, it is now possible to obtain a curable composition with a very high speed.

Examples of the polymerizable monomer, etc. which are commercially available include urethane oligomer UAS-10, UAB-140 (from Sanyo-Kokusaku Pulp Co. Ltd.), UA-7200 (from Shin-Nakamura Chemical Co. Ltd.), DPHA-40H (from Nippon Kayaku Co. Ltd.), and UA-306H, UA-306T, UA-306I, AH-600, T-600 and AI-600 (from Kyoeisha Chemical Co. Ltd.).

Also polyfunctional thiol compound having in the molecule thereof two or more mercapto (SH) groups is preferable as the polymerizable monomer, etc. In particular, a compound represented by the formula (I) below is preferable.

[Chemical 12]

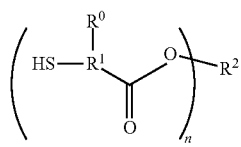

(In the formula, $R^1$ represents an alkyl group, $R^2$ represents an aliphatic group with a valency of n, which may contain atom(s) other than carbon atom, $R^0$ represents an alkyl group but not H, and n represents 2 to 4.)

The polyfunctional thiol compound represented by the formula (I) is exemplified, together with structural formula, by 1,4-bis(3-mercaptobutyryloxy)butane [formula (II)], 1,3,5-tris(3-mercaptobutyloxyethyl)-1,3,5-triazine-2,4,6 (1H, 3H,5H)-trione [formula (III)], and pentaerythritol tetrakis(3-mercaptobutyrate) [formula (IV)]. Only a single species of these polyfunctional thiols may be used alone, or two or more species thereof may be used in combination.

[Chemical 13]

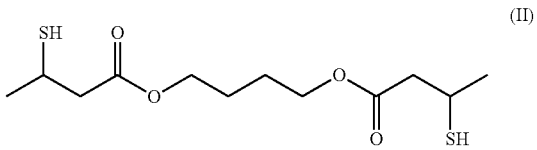

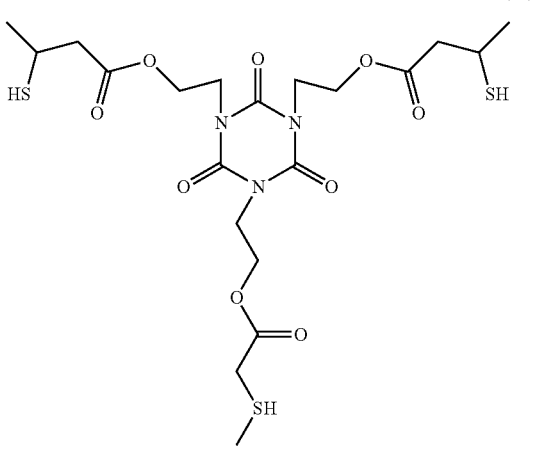

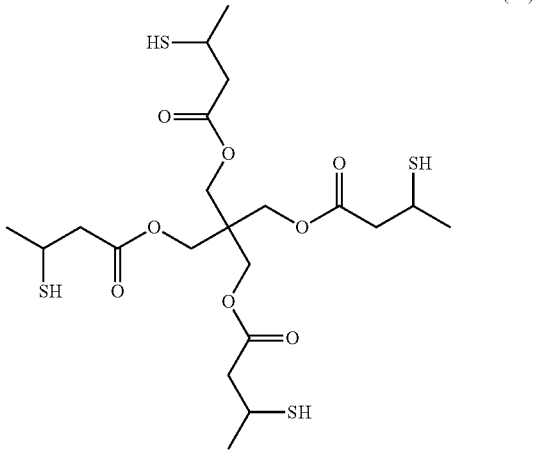

For the composition of the present invention, it is also preferable to use, as the polymerizable monomer, etc., a polymerizable monomer or oligomer having in the molecule thereof two or more epoxy groups or oxetanyl groups. Specific examples of these compounds will be described in the section of "polymer having epoxy group or oxetanyl group in Side Chains" in the next.

<<Polymer Having a Polymerizable Group in the Side Chains>>

A second preferable embodiment of the composition of the present invention contains, as the polymerizable compound, a polymer having polymerizable group in the side chains thereof.

The polymerizable group is exemplified by ethylenic unsaturated double bond group, epoxy group and oxetanyl group.

<<Polymer Having an Ethylenic Unsaturated Double Bond Group in the Side Chains>>

The polymer having an ethylenic unsaturated bond in the side chain thereof is preferably a polymer having, as the unsaturated double bond moiety thereof, at least one functional group selected from those represented by the formulae (1) to (3) below.

[Chemical 14]

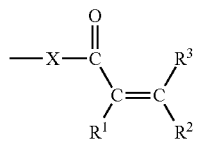

Formula (1)

In the formula (1), each of $R^1$ to $R^3$ independently represents a hydrogen atom or monovalent organic group. $R^1$ is preferably exemplified by hydrogen atom or alkyl group which may have a substituent, and in particular, hydrogen atom and methyl group are preferable by virtue of their high radical reactivity. Each of $R^2$ and $R^3$ is independently exemplified by hydrogen atom, halogen atom, amino group, carboxyl group, alkoxycarbonyl group, sulfo group, nitro group, cyano group, alkyl group which may have a substituent, aryl group which may have a substituent, alkoxy group which may have a substituent, aryloxy group which may have a substituent, alkylamino group which may have a substituent, arylamino group which may have a substituent, alkylsulfonyl group which may have a substituent, and arylsulfonyl group which may have a substituent. Among them, hydrogen atom, carboxyl group, alkoxycarbonyl group, alkyl group which may have a substituent, and aryl group which may have a substituent are preferable by virtue of their high radical reactivity.

X represents an oxygen atom, sulfur atom, or —N($R^{12}$)—, and $R^{12}$ represents a hydrogen atom or monovalent organic group. $R^{12}$ is exemplified by an alkyl group which may have a substituent, among which a hydrogen atom, methyl group, ethyl group, and isopropyl group are preferable by virtue of their high radical reactivity.

Examples of the substituent which may be introduced herein include alkyl group, alkenyl group, alkynyl group, aryl group, alkoxy group, aryloxy group, halogen atom, amino group, alkylamino group, arylamino group, carboxyl group, alkoxycarbonyl group, sulfo group, nitro group, cyano group, amide group, alkylsulfonyl group, and arylsulfonyl group.

[Chemical 15]

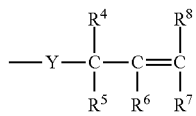

Formula (2)

In the formula (2), each of $R^4$ to $R^8$ independently represents a hydrogen atom or monovalent organic group. Each of $R^4$ to $R^8$ is preferably a hydrogen atom, halogen atom, amino group, dialkylamino group, carboxy group, alkoxycarbonyl group, sulfo group, nitro group, cyano group, alkyl group which may have a substituent, aryl group which may have a substituent, alkoxy group which may have a substituent, aryloxy group which may have a substituent, alkylamino group which may have a substituent, arylamino group which may have a substituent, alkylsulfonyl group which may have a substituent, and arylsulfonyl group which may have a substituent. Among them, hydrogen atom, carboxy group, alkoxycarbonyl group, alkyl group which may have a substituent, and aryl group which may have a substituent are preferable.

Examples of the substituent which may be introduced herein are similar to those represented by the formula (1). Y represents an oxygen atom, sulfur atom, or —N($R^{12}$)—. $R^{12}$ is synonymous to $R^{12}$ in the formula (1), the same will also apply to the preferable examples thereof.

[Chemical 16]

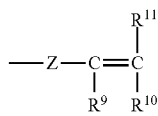

Formula (3)

In the formula (3), $R^9$ is preferably exemplified by hydrogen atom or alkyl group which may have a substituent. Among them, hydrogen atom and methyl group are preferable by virtue of their high radical reactivity. Each of $R^{10}$ and $R^{11}$ independently represents a hydrogen atom, halogen atom, amino group, dialkylamino group, carboxy group, alkoxycarbonyl group, sulfo group, nitro group, cyano group, alkyl group which may have a substituent, aryl group which may have a substituent, alkoxy group which may have a substituent, aryloxy group which may have a substituent, alkylamino group which may have a substituent, arylamino group which may have a substituent, alkylsulfonyl group which may have a substituent, and arylsulfonyl group which may have a substituent. Among them, hydrogen atom, carboxy group, alkoxycarbonyl group, alkyl group which may have a substituent, and aryl group which may have a substituent are preferable by virtue of their high radical reactivity.

Examples of the substituent which may be introduced herein are similar to those represented by the formula (1). Z represents an oxygen atom, sulfur atom, —N($R^{13}$)—, or phenylene group which may have a substituent. $R^{13}$ is exemplified by an alkyl group which may have a substituent. Among them, methyl group, ethyl group and isopropyl group are preferable by virtue of their high radical reactivity.

The polymer having an ethylenic unsaturated bond in the side chain thereof, in the present invention, is preferably a compound which contains, in one molecule thereof, 20 mol % or more and less than 95 mol % of a structural unit having the functional group represented by the formulae (1) to (3). The range is more preferably 25 to 90 mol %, and furthermore preferably 30 mol % or more and less than 85 mol %.

The polymer compound which contains the structural unit having the group represented by the formulae (1) to (3) may be synthesized based on the methods described in paragraphs [0027] to [0057] of JP-A-2003-262958. Among the methods, Method of Synthesis 1) described in the patent literature is preferably used, which will be described in below.

<<Polymer Having an Ethylenic Unsaturated Double Bond Group and an Acid Group in Side Chains>>

The polymer having an ethylenic unsaturated bond is preferably a polymer additionally having an acid group.

The acid group in the context of the present invention is a dissociative group with a pKa of 14 or smaller, wherein preferable examples include —COOH, —SO$_3$H, —PO$_3$H$_2$, —OSO$_3$H, —OPO$_2$H$_2$, —PhOH, —SO$_2$H, —SO$_2$NH$_2$, —SO$_2$NHCO—, and —SO$_2$NHSO$_2$—. Among them, —COOH, —SO$_3$H and —PO$_3$H$_2$ are preferable, and —COOH is more preferable.

The polymer containing in the side chain thereof an acid group and an ethylenic unsaturated bond may be obtained, for example, by adding an ethylenic unsaturated group-containing epoxy compound to a carboxy group of a carboxyl group-containing, alkali-soluble polymer.

The carboxyl group-containing polymer includes 1) polymer obtained by radical polymerization or ion polymerization of a carboxyl group-containing monomer, 2) polymer obtained by radical or ion polymerization of an acid anhydride-containing monomer, and succeeding hydrolysis or half-esterification of the acid anhydride unit, and 3) epoxy acrylate obtained by modifying an epoxy polymer with a unsaturated monocarboxylic acid and an acid anhydride.

Specific examples of the carboxy group-containing, vinyl-based polymer include homopolymer obtained by polymerization of unsaturated carboxylic acid, used as the carboxyl group-containing monomer, such as (meth)acrylic acid, 2-succinoloyloxyethyl methacrylate, 2-malenoloyloxyethyl methacrylate, 2-phthaloyloxyethyl methacrylate, 2-hexahydrophthaloyloxyethyl methacrylate, maleic acid, fumaric acid, itaconic acid, and crotonic acid; and copolymer obtained by polymerization of these unsaturated carboxylic acids with a vinyl monomer having no carboxyl group, such as styrene, α-methyl styrene, methyl (meth)acrylate, ethyl (meth)acrylate, propyl (meth)acrylate, isopropyl (meth)acrylate, butyl (meth)acrylate, vinyl acetate, acrylonitrile, (meth)acrylamide, glycidyl (meth)acrylate, allyl glycidyl ether, glycidyl ethylacrylate, crotonic acid glycidyl ether, (meth)acrylic acid chloride, benzyl (meth)acrylate, hydroxyethyl (meth)acrylate, N-methylolacrylamide, N,N-dimethyl acrylamide, N-methacryloyl morpholine, N,N-dimethylaminoethyl (meth)acrylate, and N,N-dimethylaminoethyl acrylamide.

Other examples include polymer obtained by co-polymerizing maleic anhydride with styrene, α-methyl styrene or the like, and then half-esterifying or hydrolysing the maleic anhydride unit moiety with a monohydric alcohol such as methanol, ethanol, propanol, butanol, or hydroxyethyl (meth)acrylate.

Among them, the carboxyl group-containing polymer, and in particular, (meth)acrylic acid-containing (meth) acrylic acid (co)polymer is preferable. Specific examples of these copolymers include methyl methacrylate benzyl/methacrylic acid copolymer, methyl methacrylate/methacrylic acid copolymer described in JP-A-S60-208748, methyl methacrylate/methyl acrylate/methacrylic acid copolymer described in JP-A-S60-214354, benzyl methacrylate/methyl methacrylate/methacrylic acid/2-ethylhexyl acrylate copolymer described in JP-A-H5-36581, methyl methacrylate/n-butyl methacrylate/2-ethylhexyl acrylate/methacrylic acid copolymer described in JP-A-H5-333542, styrene/methyl methacrylate/methyl acrylate/methacrylic acid copolymer described in JP-A-H7-261407, methyl methacrylate/n-butyl acrylate/2-ethylhexyl acrylate/methacrylic acid copolymer described in JP-A-H10-110008, and methyl methacrylate/n-butyl acrylate/2-ethylhexyl acrylate/styrene/methacrylic acid copolymer described in JP-A-H10-198031.

The polymer having in the side chain thereof an acid group and a polymerizable group, in the present invention, is preferably a polymer having, as the unsaturated double bond moiety thereof, at least one structural unit represented by the formulae (1-1) to (3-1) below.

[Chemical 17]

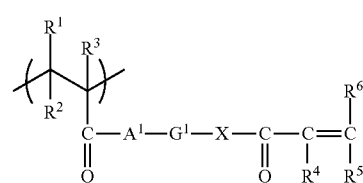

Formula (1-1)

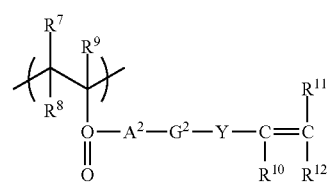

Formula (2-1)

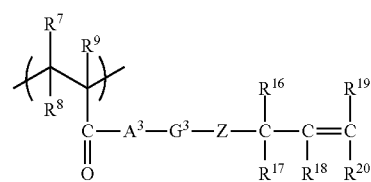

Formula (3-1)

In the formulae (1-1) to (3-1), each of $A^1$, $A^2$ and $A^3$ independently represents an oxygen atom, sulfur atom, or —N($R^{21}$)—, where $R^{21}$ represents an alkyl group which may have a substituent. Each of $G^1$, $G^2$ and $G^3$ independently represents a divalent organic group. Each of X and z independently represents an oxygen atom, sulfur atom, or —N($R^{22}$)—, where $R^{22}$ represents an alkyl group which may have a substituent. Y represents an oxygen atom, sulfur atom, phenylene group which may have a substituent, or —N($R^{23}$)—, where $R^{23}$ represents an alkyl group which may have a substituent. Each of $R^1$ to $R^{20}$ independently represents a monovalent substituent.

In the formula (1-1), each of $R^1$ to $R^3$ independently represents a monovalent substituent, which is exemplified by hydrogen atom, and alkyl group additionally having a substituent. Among them, each of $R^1$ and $R^2$ preferably represents a hydrogen atom, and $R^3$ is preferably represents a hydrogen atom or methyl group.

Each of $R^4$ to $R^6$ independently represents a monovalent substituent. $R^4$ is exemplified by hydrogen atom or alkyl group which may additionally have a substituent. Among them, hydrogen atom, methyl group, and ethyl group are preferable. Each of $R^5$ and $R^6$ independently represents a hydrogen atom, halogen atom, alkoxycarbonyl group, sulfo group, nitro group, cyano group, alkyl group which may additionally have a substituent, aryl group which may additionally have a substituent, alkoxy group which may additionally have a substituent, aryloxy group which may additionally have a substituent, alkylsulfonyl group which may additionally have a substituent, and arylsulfonyl group which may additionally have a substituent. Among them, hydrogen atom, alkoxycarbonyl group, alkyl group which may additionally have a substituent, and aryl group which may additionally have a substituent are preferable.

Examples of the substituent which may be introduced herein include methoxycarbonyl group, ethoxycarbonyl group, isopropyloxycarbonyl group, methyl group, ethyl group, and phenyl group.

$A^1$ represents an oxygen atom, sulfur atom, or —N($R^{21}$)—, and X represents an oxygen atom, sulfur atom or —N($R^{22}$)—. Bach of $R^{21}$ and $R^{22}$ is exemplified by alkyl group which may have a substituent.

$G^1$ represents a divalent organic group, wherein an alkylene group which may have a substituent is preferable. More preferably, $G^1$ is exemplified by $C_{1-20}$ alkylene group which may have a substituent, $C_{3-20}$ cycloalkylene group which may have a substituent, and $C_{6-20}$ aromatic group which may have a substituent. Among them, $C_{1-10}$ straight-chain or branched alkylene group which may have a substituent, $C_{3-20}$ cycloalkylene group which may have a substituent, and $C_{6-12}$ aromatic group which may have a substituent are preferable by virtue of their performances related to strength, developability and so forth.

The substituent on $G^1$ is preferably a hydroxyl group.

In the formula (2-1), each of $R^7$ to $R^9$ independently represents a monovalent substituent, preferably exemplified by hydrogen atom, and alkyl group which may additionally have a substituent, wherein each of $R^7$ and $R^8$ preferably represents a hydrogen atom, and $R^9$ preferably represents a hydrogen atom or methyl group.

Each of $R^{10}$ to $R^{12}$ independently represents a monovalent substituent. Specific examples of the substituent include hydrogen atom, halogen atom, dialkylamino group, alkoxycarbonyl group, sulfo group, nitro group, cyano group, alkyl group which may additionally have a substituent, aryl group which may additionally have a substituent, alkoxy group which may additionally have a substituent, aryloxy group which may additionally have a substituent, alkylsulfonyl group which may additionally have a substituent, and arylsulfonyl group which may additionally have a substituent. Among them, hydrogen atom, alkoxycarbonyl group, alkyl group which may additionally have a substituent, and aryl group which may additionally have a substituent are preferable.

Examples of the substituent which may be introduced herein are similar to those represented by the formula (1-1).

$A^2$ represents an oxygen atom, sulfur atom, or —N($R^{21}$)—, where $R^{21}$ is exemplified by hydrogen atom and alkyl group which may have a substituent.

$G^2$ represents a divalent organic group, which is preferably an alkylene group which may have a substituent. More preferably, $G^2$ is exemplified by $C_{1-20}$ alkylene group which may have a substituent, $C_{3-20}$ cycloalkylene group which may have a substituent, and $C_{6-20}$ aromatic group which may have a substituent. Among them, $C_{1-10}$ straight-chain or branched alkylene group which may have a substituent, $C_{3-10}$ cycloalkylene group which may have a substituent, and $C_{6-12}$ aromatic group which may have a substituent are preferable by virtue of their performances related to strength, developability and so forth.

The substituent on $G^2$ is preferably a hydroxyl group.

Y represents an oxygen atom, sulfur atom, —N($R^{23}$)—, or phenylene group which may have a substituent. $R^{23}$ is exemplified by hydrogen atom, and alkyl group which may have a substituent.

In the formula (3-1), each of $R^{13}$ to $R^{15}$ independently represents a monovalent substituent, which is exemplified by hydrogen atom, and alkyl group which may have a substituent. Among them, each of $R^{13}$ and $R^{14}$ preferably represents a hydrogen atom, and $R^{15}$ preferably represents a hydrogen atom or methyl group.

Each of $R^{16}$ to $R^{20}$ independent y represents a monovalent substituent, wherein each of $R^{16}$ to $R^{20}$ is exemplified by hydrogen atom, halogen atom, dialkylamino group, alkoxycarbonyl group, sulfo group, nitro group, cyano group, alkyl group which may additionally have a substituent, aryl group which may additionally have a substituent, alkoxy group which may additionally have a substituent, aryloxy group which may additionally have a substituent, alkylsulfonyl group which may additionally have a substituent, and arylsulfonyl group which may additionally have a substituent. Among them, hydrogen atom, alkoxycarbonyl group, alkyl group which may additionally have a substituent, and aryl group which may additionally have a substituent are preferable. Examples of the substituent which may be introduced herein are similar to those represented by the formula (1).

$A^3$ represents an oxygen atom, sulfur atom, or —N($R^{21}$)—, and Z represents an oxygen atom, sulfur atom, or —N($R^{22}$)—. Examples of $R^{21}$ and $R^{22}$ are similar to those represented by the formula (1).

$G^3$ represents a divalent organic group, which is preferably an alkylene group which may have a substituent. $G^3$ is preferably exemplified by $C_{1-20}$ alkylene group which may have a substituent, $C_{3-20}$ cycloalkylene group which may have a substituent, and $C_{6-20}$ aromatic group which may have a substituent. Among them, $C_{1-10}$ straight-chain or branched alkylene group which may have a substituent, $C_{3-10}$ cycloalkylene group which may have a substituent, $C_{6-12}$ aromatic group which may have a substituent are preferable by virtue of their performances related to strength, developability and so forth.

The substituent on $G^3$ is preferably a hydroxyl group.

In the present invention, the polymer containing an acid group and polymerizable groups in the side chain is preferably a compound containing a structural unit represented by general formulae (1-1) to (3-1) above in the range of 20 mol % or more and less than 95 mol %, more preferably 25 to 90 mol %, still more preferably 30 mol % or more and less than 85 mol % in one molecule to improve curability and to reduce development residues.

Preferred examples of structural units containing an ethylenically unsaturated bond and an acid group include polymer compounds 1 to 17 shown below.

Chemical 18

| polymer compounds composition (mol %) | Mw |
|---|---|
| 1 [structure: copolymer with -CO₂-CH₂CH₂-O-C(=O)-CH=CH₂ (40 mol%), -CO₂-CH₂-C₆H₅ (25 mol%), -CO₂H (35 mol%)] | 2980 |
| 2 [structure: copolymer with -CO₂-CH₂CH₂-O-C(=O)-C(CH₃)=CH₂ (35 mol%), -CO₂-C(CH₃)₃ (30 mol%), -CO₂H (35 mol%)] | 1340 |
| 3 [structure: copolymer with -CO₂-CH₂-C₆H₄-CH=CH₂ (55 mol%), -CO₂-C(CH₃)₃ (20 mol%), -CO₂H (25 mol%)] | 1950 |
| 4 [structure: copolymer with -CO₂-CH₂-CH=CH₂ (80 mol%), -CO₂-CH₂-C₆H₅ (15 mol%), -CO₂H (5 mol%)] | 960 |
| 5 [structure: copolymer with -CO₂-CH₂CH₂-O-C(=O)-C(CH₃)=CH₂ (45 mol%), -CO₂-C₆H₅ (50 mol%), -CO₂H (5 mol%)] | 3560 |

Chemical 19
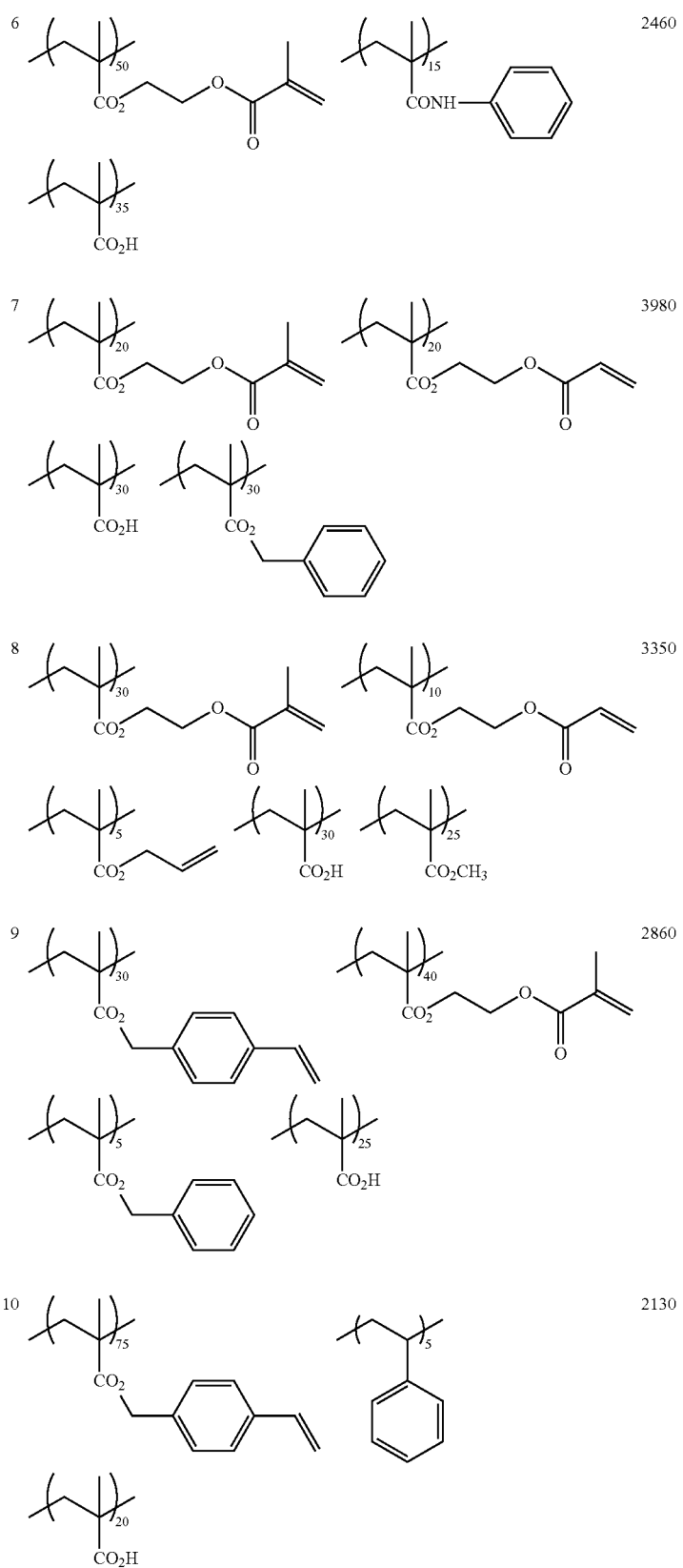

Chemical 20
| | | |
|---|---|---|
| 11 | 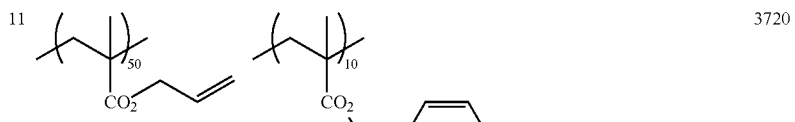 | 3720 |
| |  | |
| 12 | 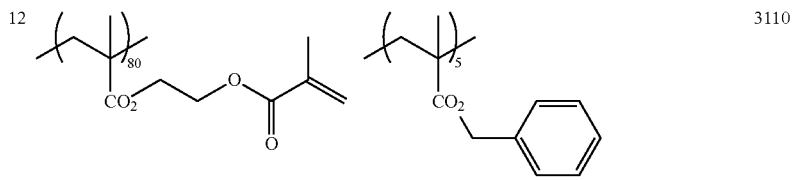 | 3110 |
| |  | |
| 13 | 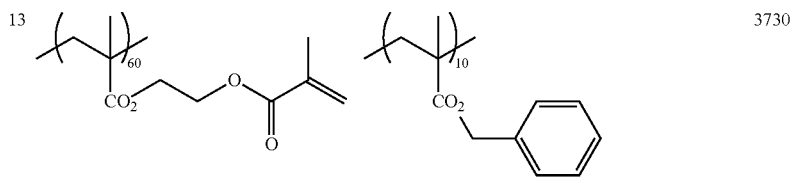 | 3730 |
| | 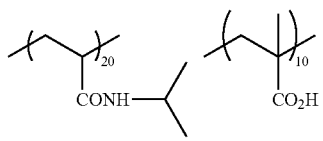 | |
| 14 | 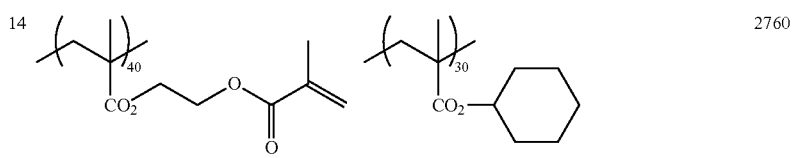 | 2760 |
| | 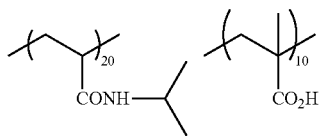 | |
| 15 | 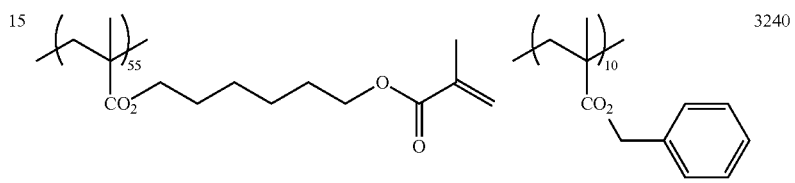 | 3240 |
| |  | |

Chemical 21

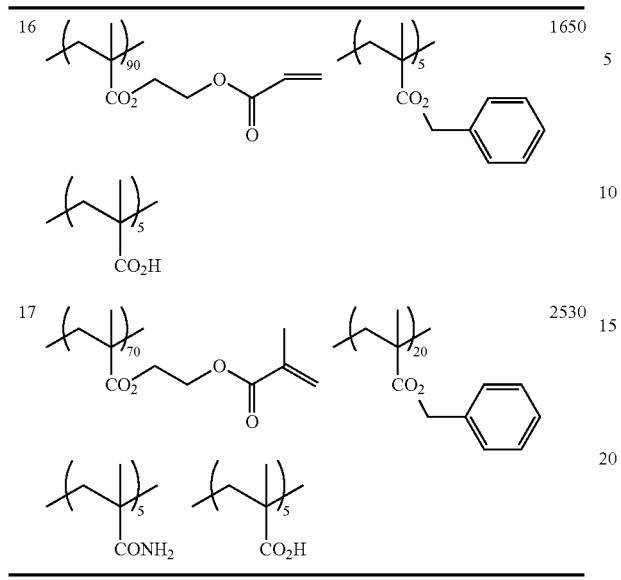

The polymer containing an acid group and an ethylenically unsaturated bond in the side chain in the present invention inevitably contain a photopolymerizable unsaturated bond to improve photosensitivity, while it inevitably contain an acid group such as COOH, $SO_3H$, $PO_3H_2$, $OSO_3H$, $OPO_2H_2$ or the like to allow alkaline development. Further, the polymer containing an acid group and an ethylenically unsaturated bond in the side chain in the present invention should have an acid number of 20 to 300, preferably 40 to 200, more preferably 60 to 150 to strike a balance among dispersion stability, developability and sensitivity.

(Polymer Having an Ethylenic Unsaturated Bond and an Urethane Group in the Side Chain)

The polymer having in the side chain thereof a polymerizable group is also preferably a polymer having, in the side chain thereof, an ethylenic unsaturated bond and an urethane group (occasionally referred to as "urethane polymer", hereinafter).

The urethane polymer is a polyurethane polymer having, as the basic skeleton thereof, a structural unit represented by a reaction product formed between at least one species of diisocyanate compound represented by the formula (4) below, and at least one species of diol compound represented by the formula (5) below (properly referred to as "specific polyurethane polymer", hereinafter).

OCN—X⁰—NCO      Formula (4)

HO—Y⁰—OH      Formula (5)

In the formulae (4) and (5), each of $X^0$ and $Y^0$ independently represents a divalent organic residue.

If at least either one of the diisocyanate compound represented by the formula (4) and the diol compound represented by the formula (5) has at least one of the group represented by the formulae (1) to (3) corresponded to the unsaturated double bond moieties, then the specific polyurethane polymer, having the group(s) represented by the formulae (1) to (3) introduced into the side chain thereof, is produced as a reaction product of the diisocyanate compound and the diol compound. According to this method, the specific polyurethane polymer in the present invention may readily be manufactured, more easily than by a method of replacing or introducing a desired side chain after reaction and production of the polyurethane polymer.

1) Diisocyanate Compound

The diisocyanate compound represented by the formula (4) above is exemplified by a product obtained, for example, by an addition reaction of a triisocyanate compound, with one equivalent of a monofunctional alcohol or monofunctional amine compound having an unsaturated group.

The triisocyanate compound is exemplified by the compound as shown below, which however are not limited thereto.

[Chemical 22]

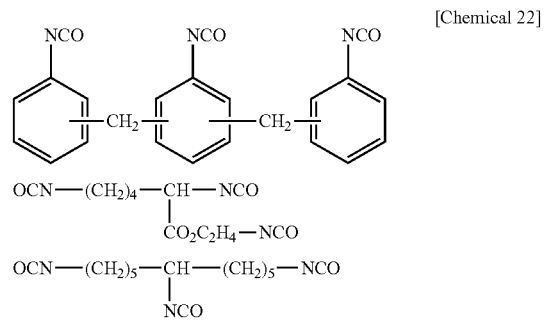

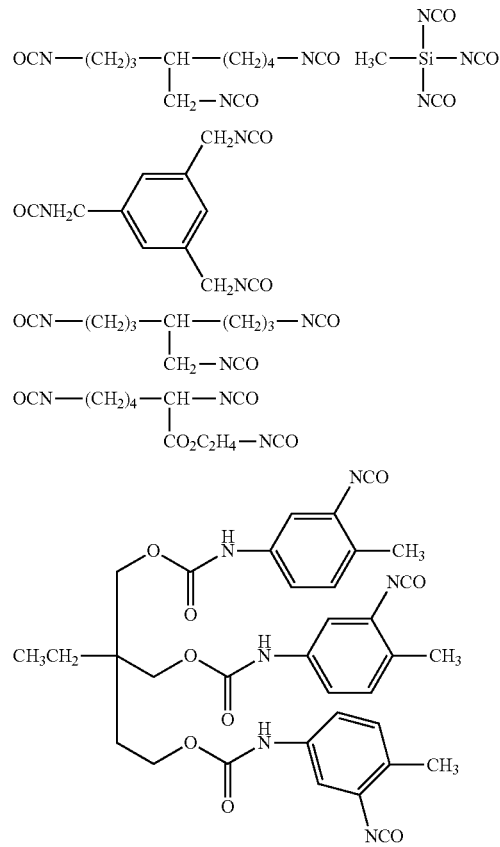

[Chemical 23]

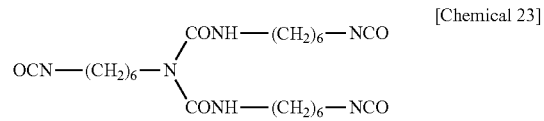

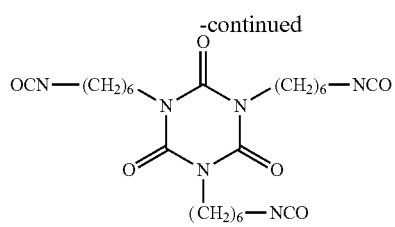

Monofunctional alcohol having an unsaturated group and monofunctional amine compound having an unsaturated group are exemplified by the following compounds, which however are not limited thereto.

[Chemical 24]

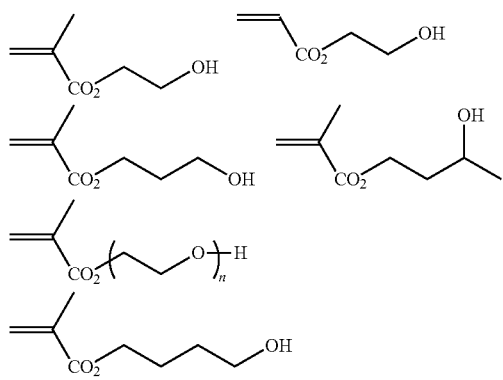

n is an integer of 2 to 10.

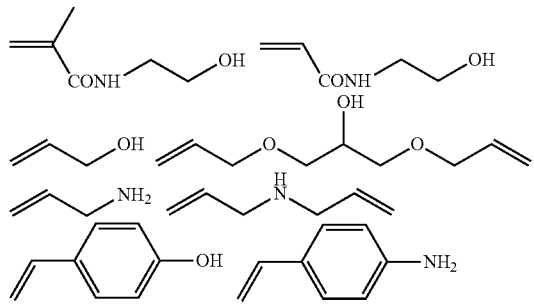

[Chemical 25]

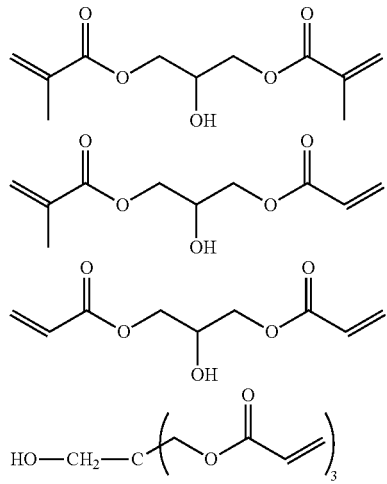

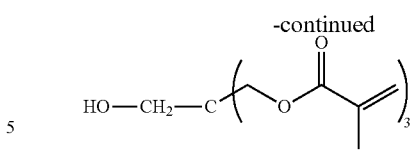

[Chemical 26]

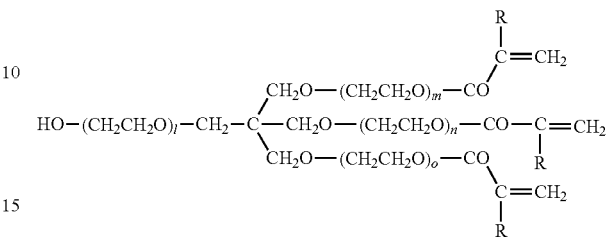

R is a hydrogen atom or methyl group. l, m, n, o are an integer of 1 to 20.

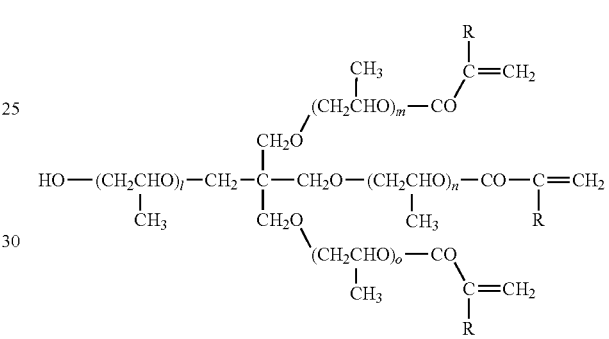

R is a hydrogen atom or methyl group. l, m, n, o are an integer of 1 to 20.

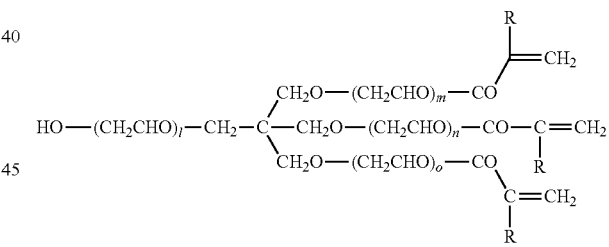

R is a hydrogen atom or methyl group. l, m, n, o are an integer of 1 to 20.

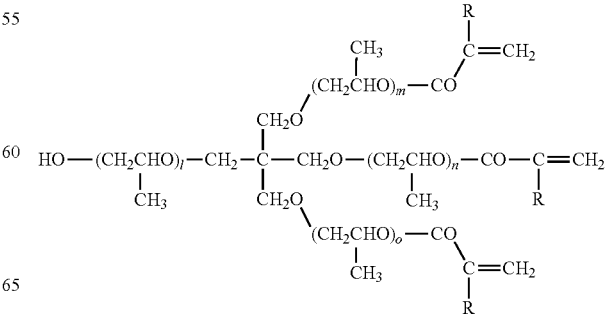

R is a hydrogen atom or methyl group. l, m, n, o are an integer of 1 to 20.

[Chemical 27]

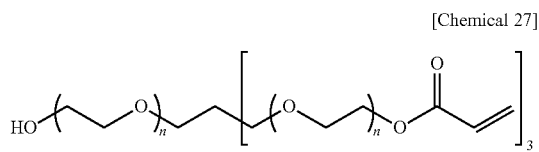

n is an integer of 1 to 20.

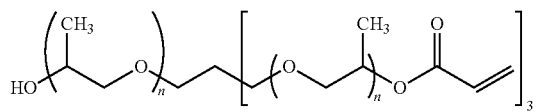

n is an integer of 1 to 20.

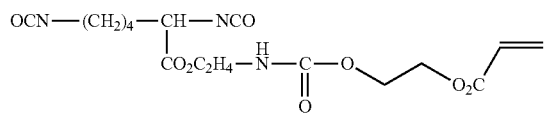

n is an integer of 1 to 20.

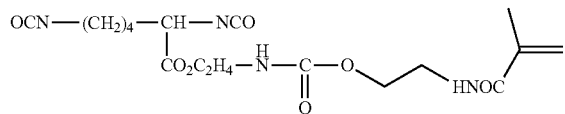

n is an integer of 1 to 20.

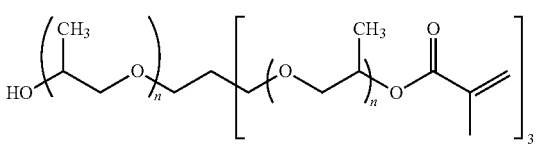

n is an integer of 1 to 20.

A preferable method of introducing the unsaturated group into the side chains of the polyurethane polymer is such as using, as a source material for manufacturing the polyurethane polymer, a diisocyanate compound having an unsaturated group in the side chain thereof. The diisocyanate compound, which is obtainable by an addition reaction of the triisocyanate compound with one equivalent of the monofunctional alcohol or monofunctional amine compound having an unsaturated group, and therefore having the unsaturated group in the side chain thereof is exemplified by the compound as shown below, which however are not limited thereto.

[Chemical 28]

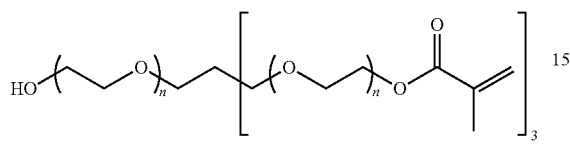

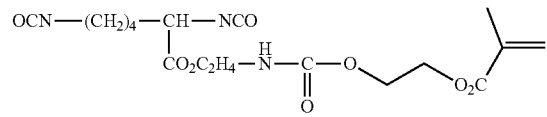

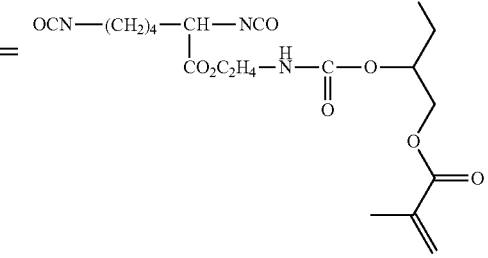

[Chemical 29]

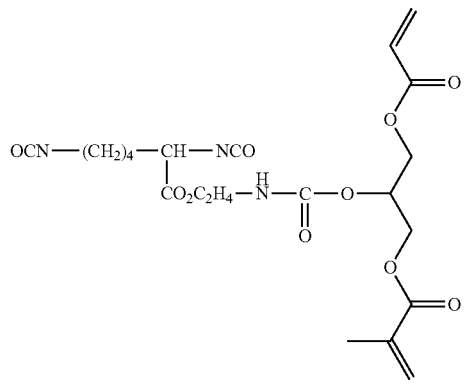

-continued
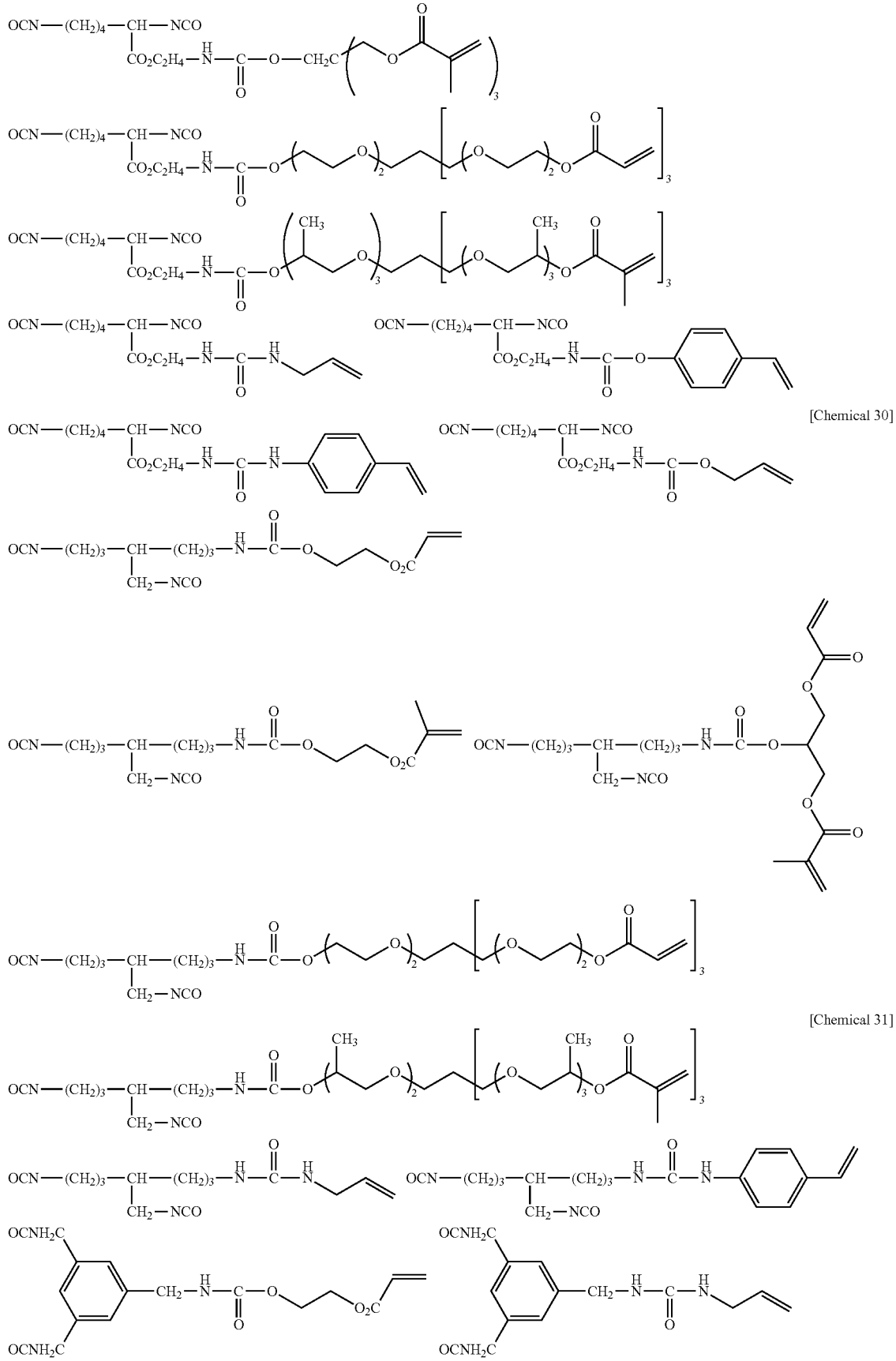

-continued
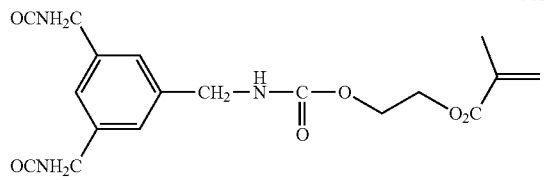
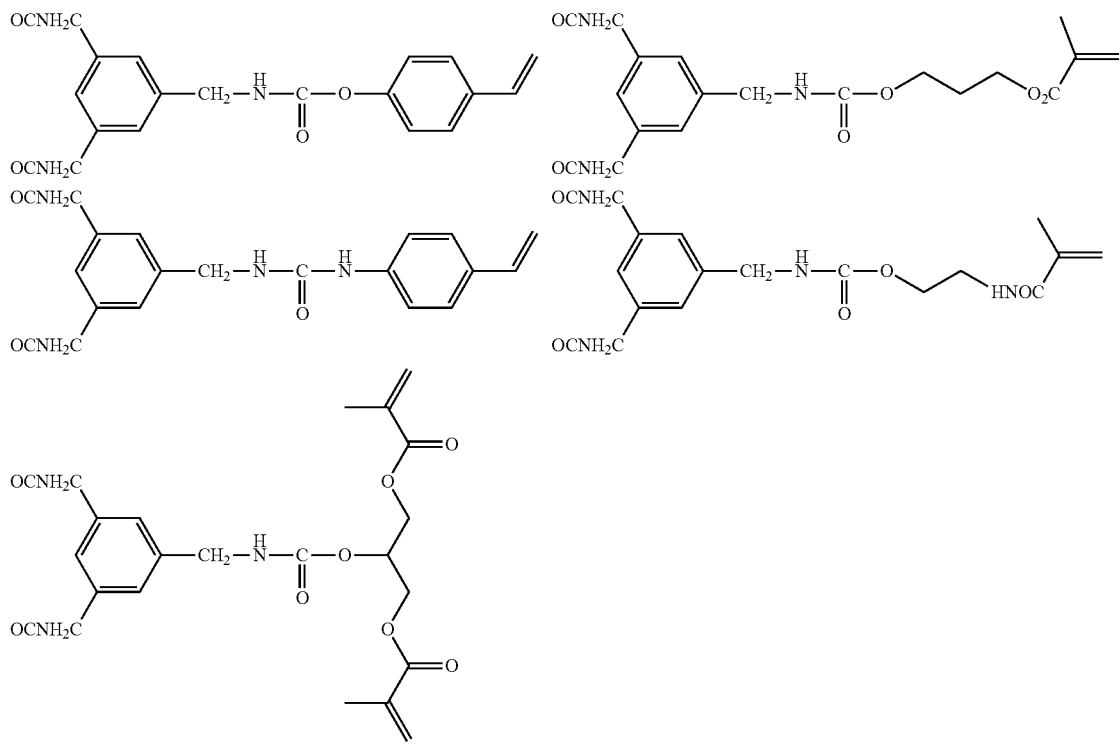
[Chemical 32]
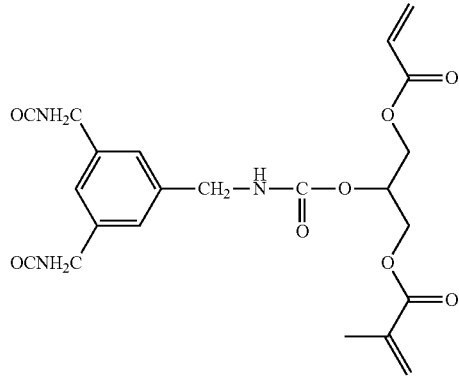
[Chemical 33]
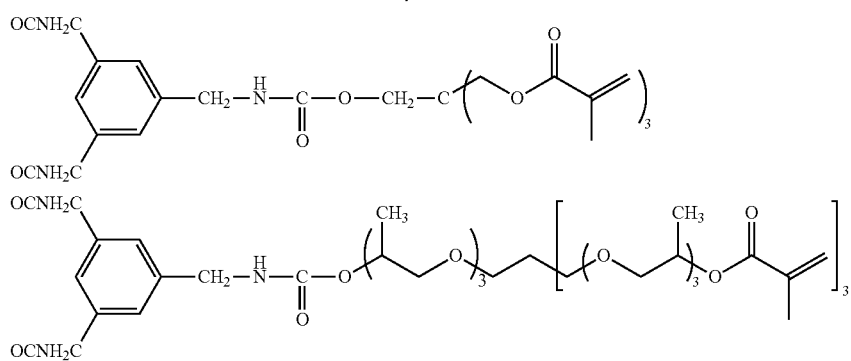

-continued
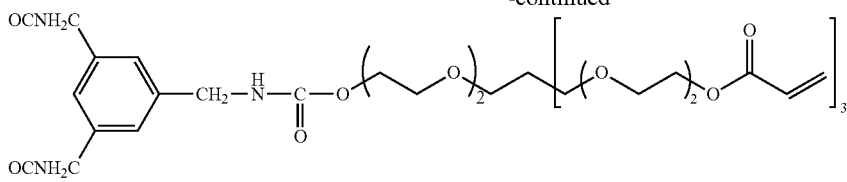
[Chemical 34]
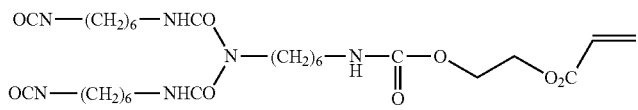
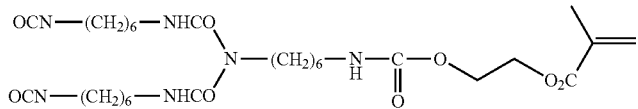
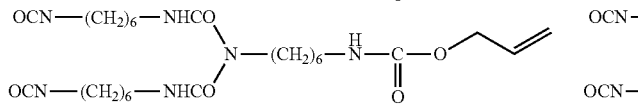
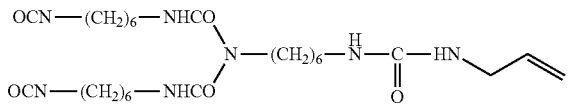
[Chemical 35]
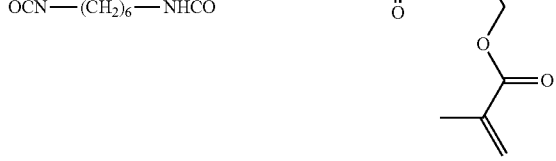
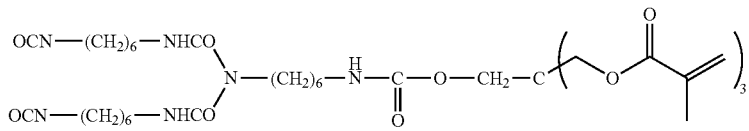
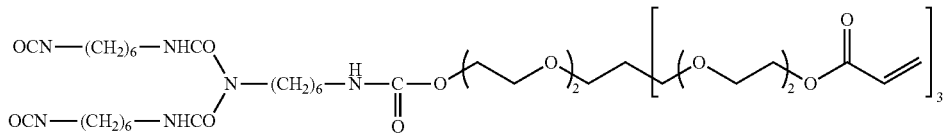
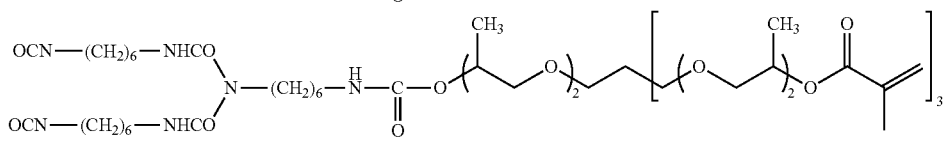

The specified polyurethane polymer used in the present invention may be copolymerized with a diisocyanate compound other than the above-described diisocyanate compound having an unsaturated group, from the viewpoint of improving the compatibility with the other components in the polymerizable composition, and of improving the shelf stability.

The diisocyanate compound to be co-polymerized is exemplified by those listed below. A diisocyanate compound represented by the formula (6) below is preferable.

OCN-$L^1$-NCO    Formula (6)

In formula (6), $L^1$ represents a divalent aliphatic or aromatic hydrocarbon group which may have a substituent. As necessary, $L^1$ may have other functional group non-reactive with an isocyanate group, such as ester, urethane, amide and ureido group.

The diisocyanate compound represented by the formula (6) specifically includes those listed below.

The examples include aromatic diisocyanate compound such as 2,4-tolylene diisocyanate, dimer of 2,4-tolylene diisocyanate, 2,6-tolylenedilene diisocyanate, p-xylylene diisocyanate, m-xylylene diisocyanate, 4,4'-diphenylmetane diisocyanate, 1,5-naphthylene diisocyanate, and 3,3'-dimethylbiphenyl-4,4'-diisocyanate; aliphatic diisocyanate compound such as hexamethylene diisocyanate, trimethyl hexamethylene diisocyanate, lysine diisocyanate, and dimer acid diisocyanate; alicyclic diisocyanate compound such as isophorone diisocyanate, 4,4'-methylenebis(cyclohexylisocyanate), methyl cyclohexane-2,4-(or -2,6-)diisocyanate, and 1,3-(isocyanatemethyl)cyclohexane; and diisocyanate compound obtained as a reaction product of a diol and a diisocyanate, such as an adduct of 1 mol of 1,3-butylene glycol and 2 mol of tolylene diisocyanate.

2) Diol Compound

The diol compound represented by the formula (5) is broadly exemplified by polyether diol compound, polyester diol compound, and polycarbonate diol compound.

Another preferable method of introducing the unsaturated group into the side chains of the polyurethane polymer, other than the method described above, is such as using a diol compound having an unsaturated group in the side chain thereof, as a source material of the polyurethane polymer. This sort of diol compound may be any of commercially available ones such as trimethylolpropane monoallyl ether, or may be compounds readily manufacturable by allowing a halogenated diol compound, triol compound or aminodiol compound to react with a carboxylic acid having an unsaturated group, acid chloride, isocyanate, alcohol, amine, thiol or halogenated alkyl compound. Specific examples of these compounds are exemplified by the following compounds, which however are not limited thereto.

[Chemical 36]

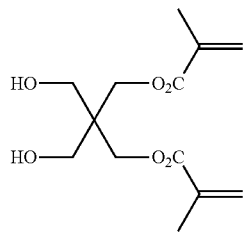

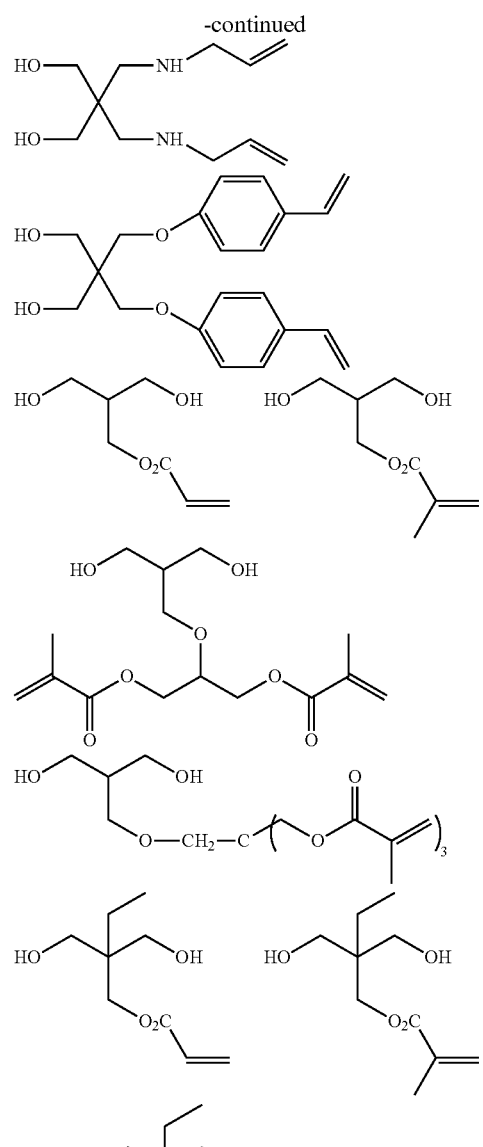

[Chemical 37]

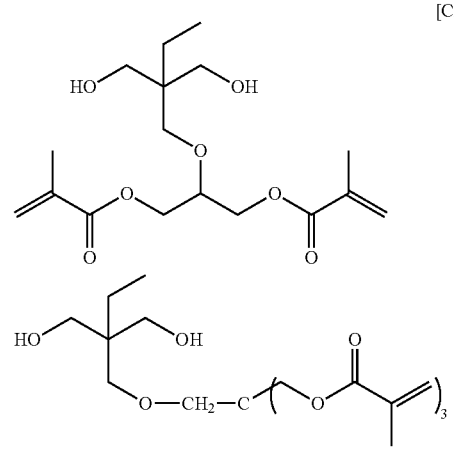

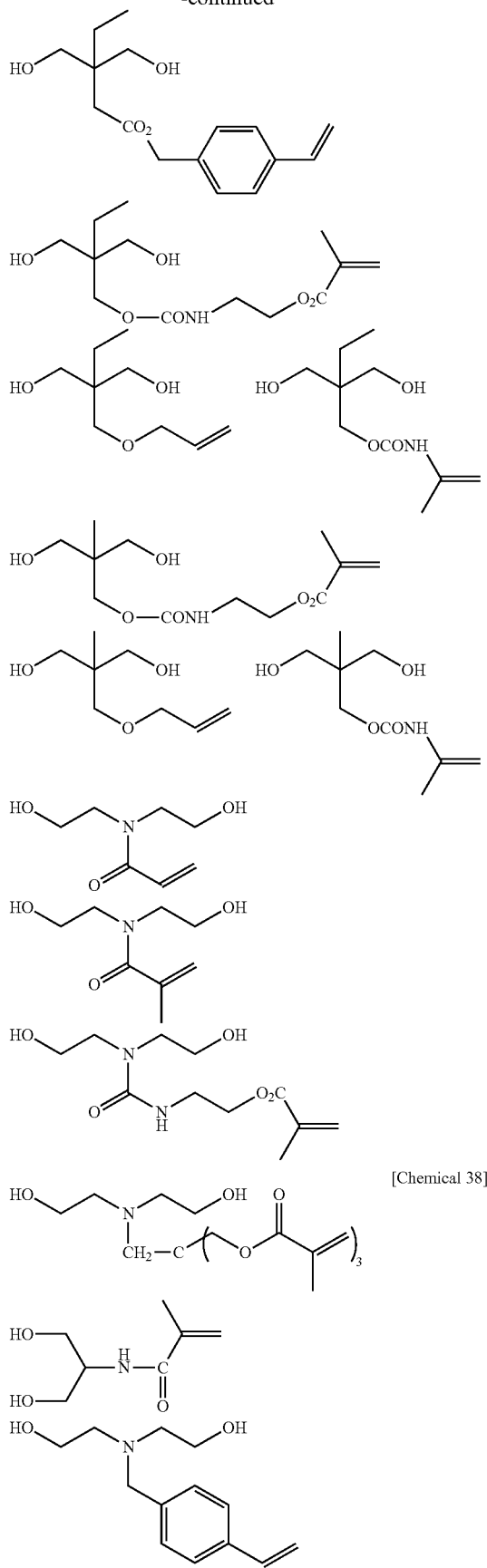
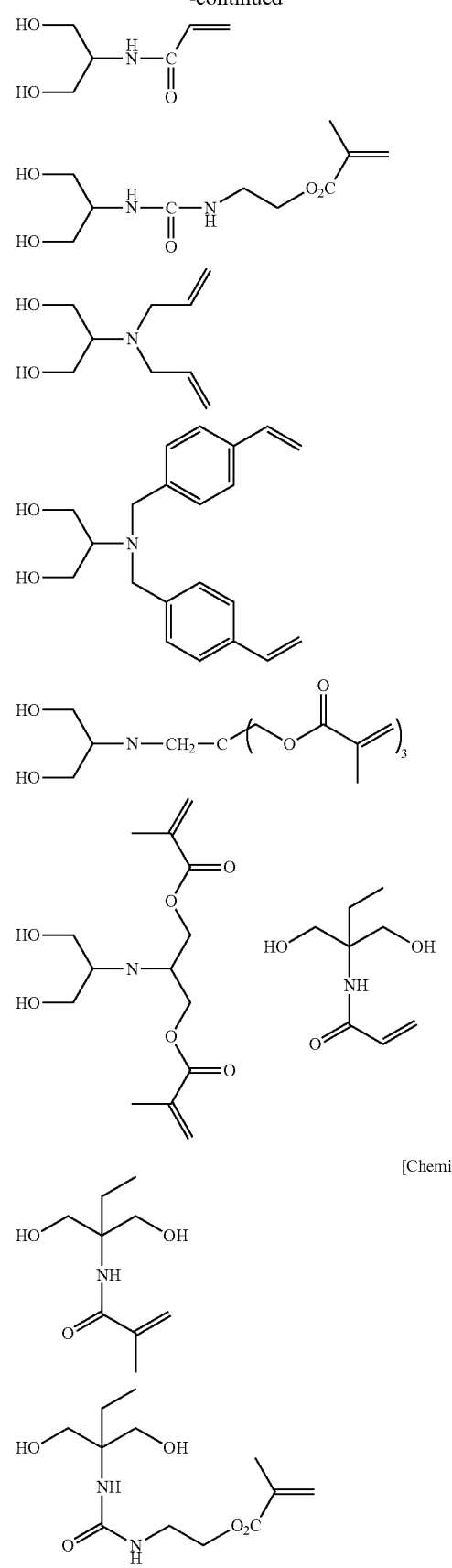

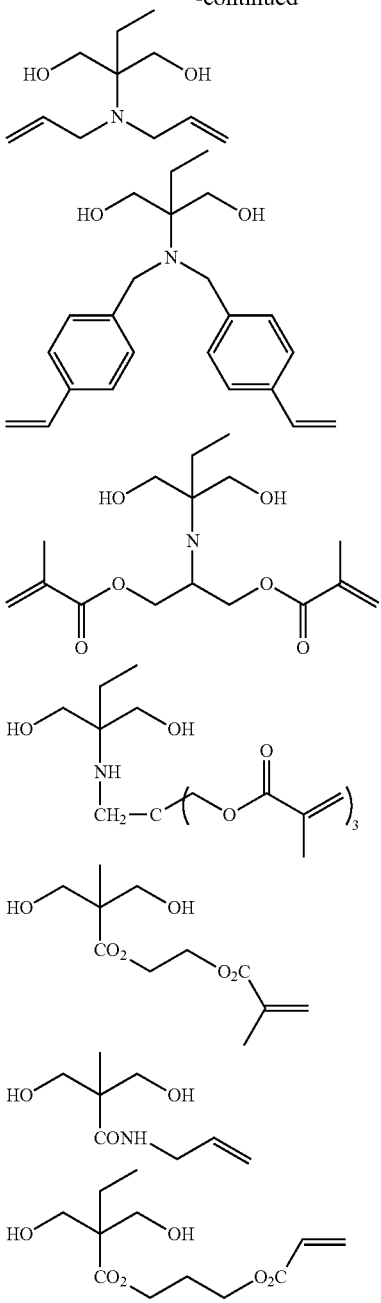

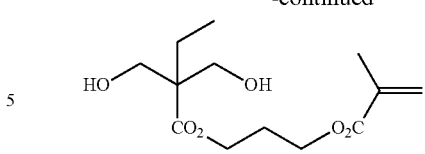

More preferable polymer used in the present invention is exemplified by a polyurethane resin obtained by using, in the process of synthesis thereof, a diol compound represented by the formula (G) below, as at least one diol compound having an ethylenic unsaturated linking group.

[Chemical 40]

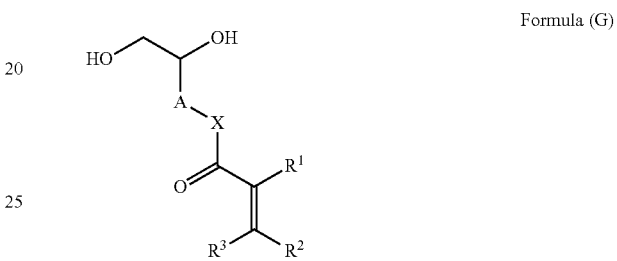

Formula (G)

In the formula (G), each of $R^1$ to $R^3$ independently represents a hydrogen atom or monovalent organic group, A represents a divalent organic residue, X represents an oxygen atom, sulfur atom, or —$N(R^{12})$—, where $R^{12}$ represents a hydrogen atom or monovalent organic group.

Note that $R^1$ to $R^3$ and X in the formula (G) are synonymous to $R^1$ to $R^3$ and X in the formula (1), the same will also apply to the preferable examples thereof.

By using the polyurethane polymer derived from such diol compound, it is supposed that an excessive molecular motion of the polymer principal chain is suppressed by the contribution of a secondary alcohol with a large steric hindrance, and thereby the film strength is improved.

Specific examples of the diol compound represented by the formula (G), which may preferably be used for the synthesis of the specific polyurethane polymer, will be listed below.

Hereinafter, specific examples of the diol represented by the formula (G), preferably used for synthesis of the specified polyurethane polymer, are shown below.

[Chemical 41]

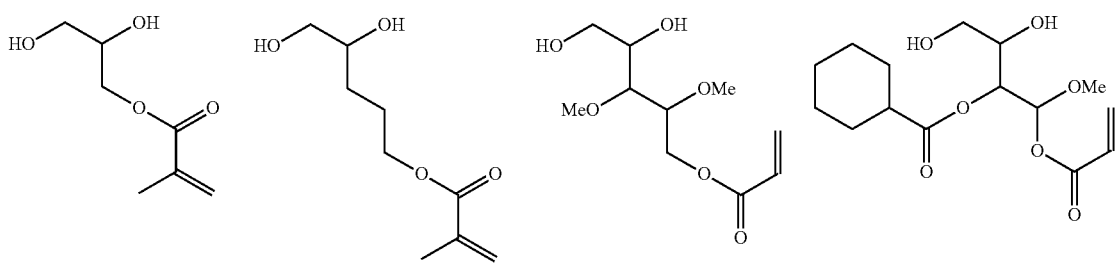

-continued
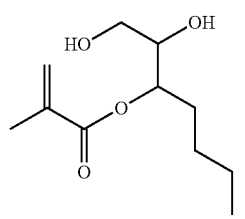 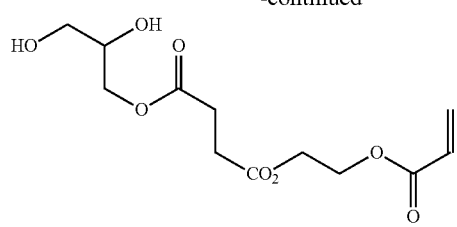
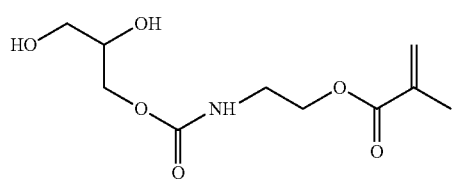 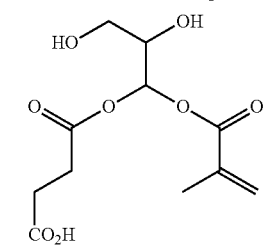
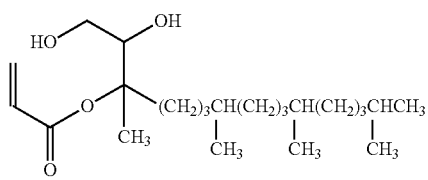 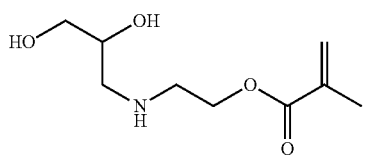
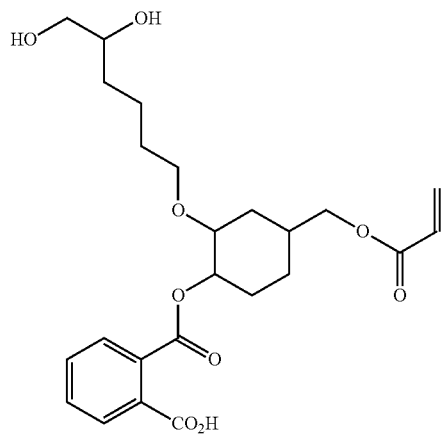
[Chemical 42]
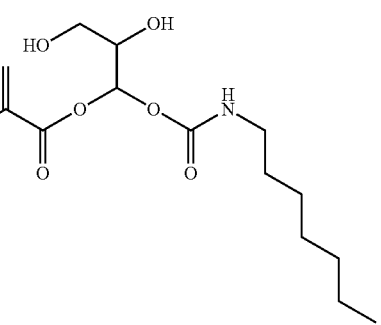
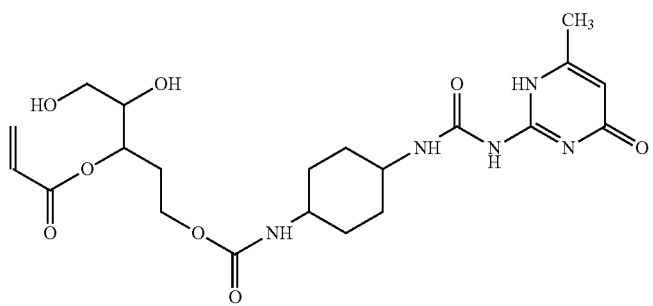 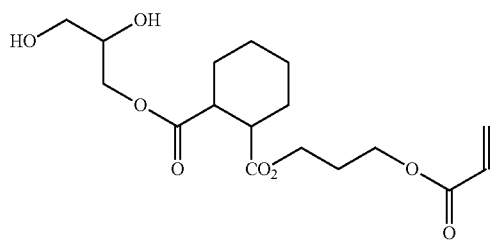

-continued

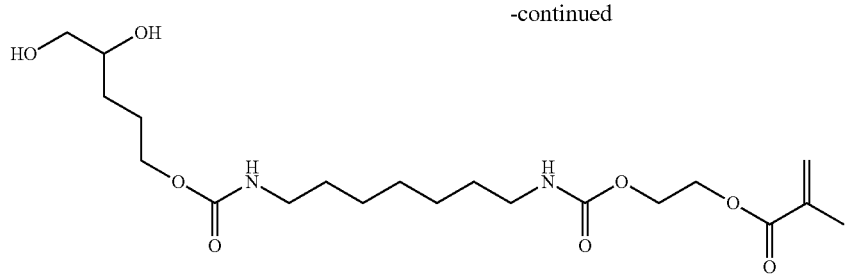

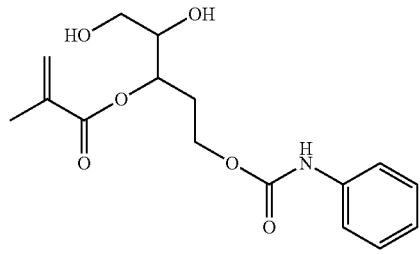

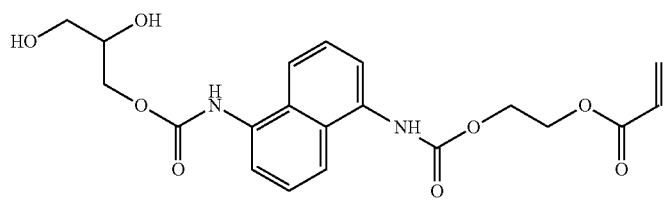

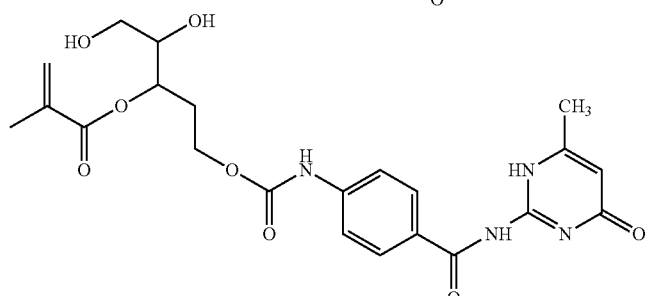

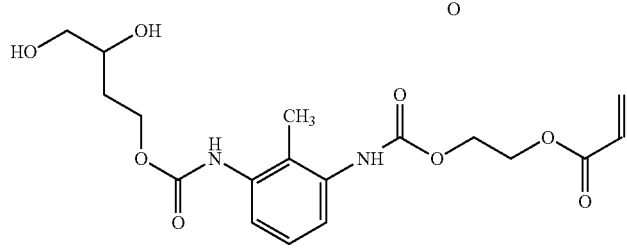

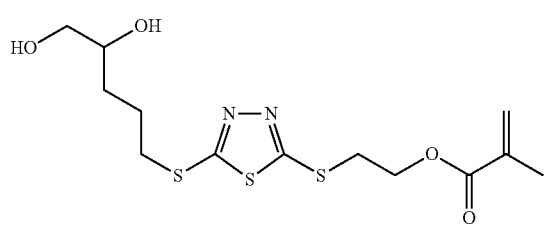

[Chemical 43]

The specific polyurethane polymer used in the present invention may, for example, be co-polymerized with a diol compound other than the above-described diol compound having an unsaturated group, from the viewpoint of improving the compatibility with the other components in the polymerizable composition, and of improving the shelf stability.

Such diol compound is exemplified by the above-described polyether diol compound, polyester diol compound, and polycarbonate diol compound.

The polyether diol compound is exemplified by compounds represented by the formulae (7), (8), (9), (30) and (11) below, and, a random copolymer composed of ethylene oxide having a terminal hydroxy group and propylene oxide.

[Chemical 44]

$$HO-(CH_2CHO)_a-H \quad (7)$$
$$\qquad |$$
$$\qquad R^{14}$$

$$HO-(CH_2CH_2CHO)_b-H \quad (8)$$
$$\qquad |$$
$$\qquad R^{14}$$

$$HO-(CH_2CH_2CH_2CH_2O)_c-H \quad (9)$$

$$HO-(CH_2CH_2O)_d-(CH_2CHO)_e-(CH_2CH_2O)_d-H \quad (10)$$
$$\qquad\qquad\qquad |$$
$$\qquad\qquad\qquad CH_3$$

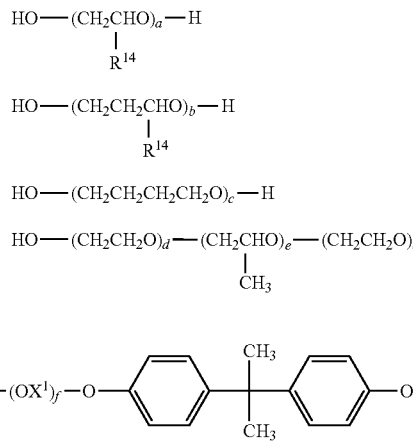

(11)

In the formulae (7) to (11), $R^{14}$ represents a hydrogen atom or methyl group, and $X^1$ represents the groups below. Each of a, b, c, d, e, f and g represents an integer of 2 or larger, and preferably an integer of 2 to 100.

[Chemical 45]

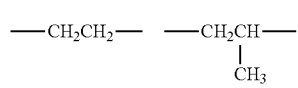

Polyether diol compounds represented by formula (7) or (8) above specifically include the following:

diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycols having a weight average molecular weight of 1000, polyethylene glycols having a weight average molecular weight of 1500, polyethylene glycols having a weight average molecular weight of 2000, polyethylene glycols having a weight average molecular weight of 3000, polyethylene glycols having a weight average molecular weight of 7500, polypropylene glycols having a weight average molecular weight of 400, polypropylene glycols having a weight average molecular weight of 700, polypropylene glycols having a weight average molecular weight of 1000, polypropylene glycols having a weight average molecular weight of 2000, polypropylene glycols having a weight average molecular weight of 3000, polypropylene glycols having a weight average molecular weight of 4000 and the like.

Polyether diol compounds represented by formula (9) above specifically include the following:

the products available from Sanyokasei Co., Ltd. under the brand names PTMG650, PTMG1000, PTMG2000, PTMG3000 and the like.

Polyether diol compounds represented by formula (10) above specifically include the following:

the products available from Sanyokasei Co., Ltd. under the brand names NEWPOL PE-61, NEWPOL PE-62, NEWPOL PE-64, NEWPOL PE-68, NEWPOL PE-71, NEWPOL PE-74, NEWPOL PE-75, NEWPOL PE-78, NEWPOL PE-108, NEWPOL PE-128, NEWPOL PE-61 and the like.

Polyether diol compounds represented by formula (11) above specifically include the following:

the products available from Sanyokasei Co., Ltd. under the brand names NEWPOL BPE-20, NEWPOL BPE-20F, NEWPOL BPE-20NK, NEWPOL BPE-20T, NEWPOL BPE-20G, NEWPOL BPE-40, NEWPOL BPE-60, NEWPOL BPE-100, NEWPOL BPE-180, NEWPOL BPE-2P, NEWPOL BPE-23P, NEWPOL BPE-3P, NEWPOL BPE-5P and the like.

The random copolymer formed between ethylene oxide and propylene oxide, respectively having terminal hydroxy groups, is specifically exemplified by the products under the trade names of Newpol 50HB-100, Newpol 50HB-260, Newpol 50HB-400, Newpol 50HB-660, Newpol 50HB-2000 and Newpol 50HB-5100 from Sanyo Chemical Industries, Ltd.

The polyester diol compound is exemplified by the compounds represented by the formulae (12), (13).

[Chemical 46]

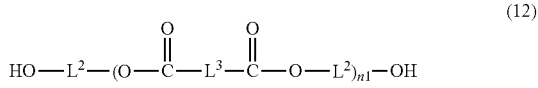

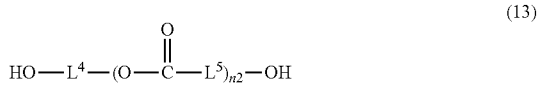

In the formulae (12) and (13), $L^2$, $L^3$ and $L^4$ may be same with, or different from each other, each of which represents a divalent aliphatic or aromatic hydrocarbon group, and $L^5$ represents a divalent aliphatic hydrocarbon group. It is preferable that each of $L^2$ to $L^4$ independently represents an alkylene group, alkenylene group, alkynylene group, or arylene group, and $L^5$ represents an alkylene group. Each of $L^2$ to $L^5$ may contain other functional group non-reactive with isocyanate group, such as ether, carbonyl, ester, cyano, olefin, urethane, amide, ureido group or halogen atom. Each of n1 and n2 independently represents an integer of 2 or larger, and preferably an integer of 2 to 100.

The polycarbonate diol compound is exemplified by compound represented by the formula (14).

[Chemical 47]

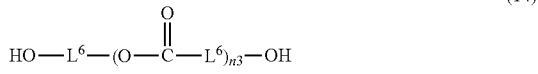

In the formula (14), $(L^6)$s are same with, or different from each other, and each of which represents a divalent aliphatic or aromatic hydrocarbon group. $L^6$ preferably represents an alkylene group, alkenylene group, alkynylene group, and arylene group. $L^6$ may contain other functional group non-reactive with isocyanate group, such as ether, carbonyl, ester, cyano, olefin, urethane, amide, ureido group or halogen atom. n3 represents an integer of 2 or larger, and preferably an integer of 2 to 100.

Diol compounds represented by formula (12), (13) or (14) above specifically include exemplary compound No. 1 to exemplary compound No. 18 shown below, wherein n represents an integer of 2 or more.

[Chemical 48]

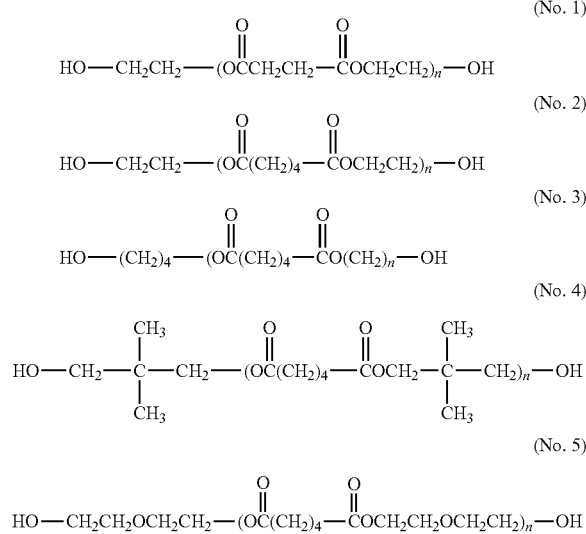

[Chemical 49]

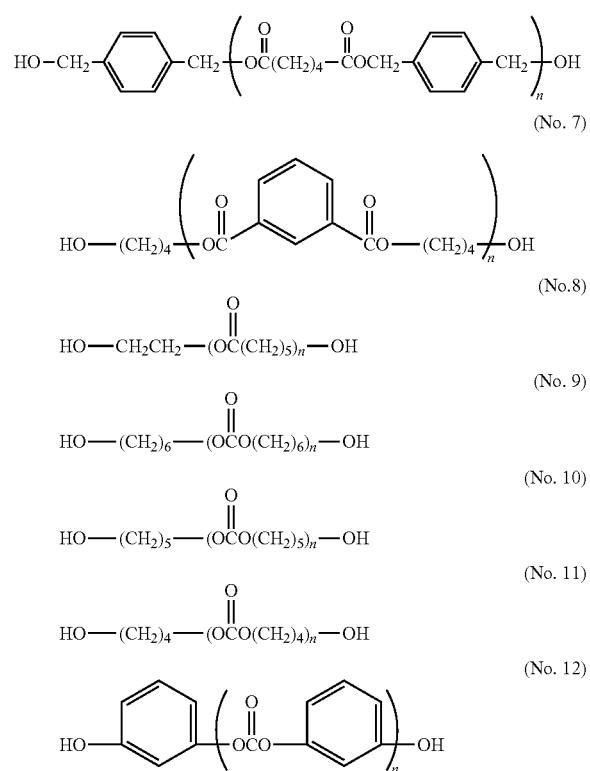

[Chemical 50]

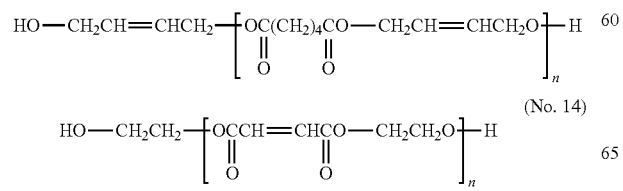

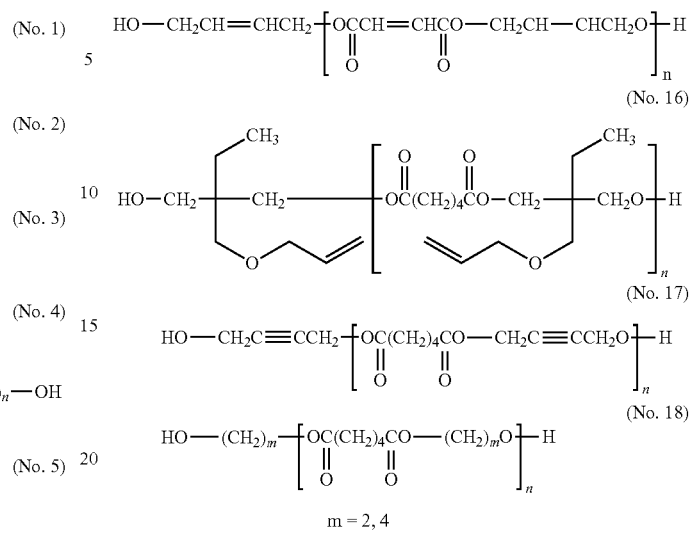

Specific diol compounds represented by the formulae (12), (13) and (14) may be referred to, and selectable from compounds typically described in paragraphs [0148] to [0150] of JP-A-2009-265518, the content of which is incorporated by reference into this specification.

$$HO\text{-}L^7\text{-}O\text{---}CO\text{-}L^8\text{-}CO\text{---}O\text{-}L^7\text{-}OH \quad (15)$$

$$HO\text{-}L^8\text{-}CO\text{---}O\text{-}L^7\text{-}OH \quad (16)$$

In the formulae (15) and (16), $L^7$ and $L^8$ may be same with, or different from each other, and each of which represents a divalent aliphatic hydrocarbon group, aromatic hydrocarbon group or heterocyclic group, which may have a substituent (for example, alkyl group, aralkyl group, aryl group, alkoxy group, aryloxy group, and halogen atom such as —F, —Cl, —Br, —I). As necessary, each of $L^7$ and $L^8$ may have therein other functional group non-reactive with isocyanate group, such as carbonyl group, ester group, urethane group, amide group, or ureido group. $L^7$ and $L^8$ may form a ring.

In synthesis of the specific polyurethane polymer, a diol compound having a carboxyl group may be used in addition to the above-described diol compound.

Examples of such diol compound include those represented by the formulae (17) to (19).

[Chemical 51]

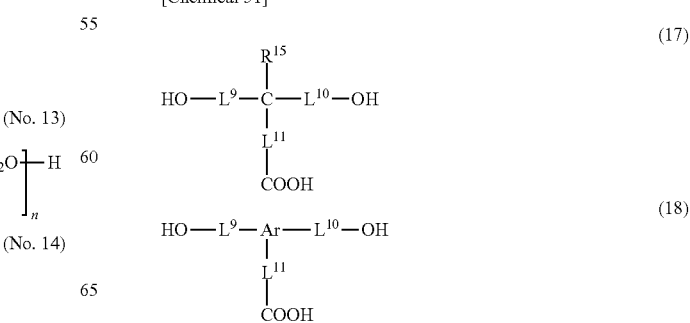

-continued

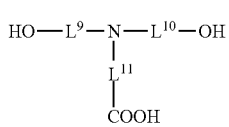
(19)

In the formulae (17) to (19), $R^{15}$ represents a hydrogen atom, alkyl group, aralkyl group, aryl group, alkoxy group, or aryloxy group, which may have a substituent (exemplified by the individual groups of cyano, nitro, halogen atom such as —F, —Cl, —Br, —I, —$CONH_2$, —$COOR^{16}$, —$OR^{16}$, —$NHCONHR^{16}$, —$NHCOOR^{16}$, —$NHCOR^{16}$, and —$OCONHR^{16}$ ($R^{16}$ represents a $C_{1-10}$ alkyl group, or $C_{7-15}$ aralkyl group.)), and preferably represents a hydrogen atom, $C_{1-8}$ alkyl group, or $C_{6-15}$ aryl group. $L^9$, $L^{10}$ and $L^{11}$ may be same with, or different from each other, and each of which represents a single bond, or a divalent aliphatic or aromatic hydrocarbon group which may have a substituent (for example, alkyl, aralkyl, aryl, alkoxy and halogeno groups are preferable), preferably represents a $C_{1-20}$ alkylene group, or $C_{6-15}$ arylene group, and furthermore preferably a $C_{1-8}$ alkylene group. As necessary, $L^9$ to $L^{11}$ may have therein other functional group non-reactive with isocyanate group, such as carbonyl, ester, urethane, amide, ureido, or ether group. Any two or three of $R^{15}$, $L^7$, $L^8$ and $L^9$ may form a ring.

Ar represents a trivalent aromatic hydrocarbon group, and preferably a $C_{6-15}$ aromatic group.

The diol compound having a carboxyl group represented by the formulae (17) to (19) is exemplified by those listed below.

The examples include 3,5-dihydroxy benzoic acid, 2,2-bis(hydroxymethyl) propionic acid, 2,2-bis(2-hydroxyethyl) propionic acid, 2,2-bis(3-hydroxypropyl) propionic acid, bis(hydroxymethyl) acetic acid, bis(4-hydroxyphenyl) acetic acid, 2,2-bis(hydroxymethyl) butyric acid, 4,4-bis(4-hydroxyphenyl) pentanoic acid, tartaric acid, N,N-dihydroxyethylglycine, and N,N-bis(2-hydroxyethyl)-3-carboxy-propionamide.

By the presence of a carboxyl group, the polyurethane polymer is preferably given a capability of forming hydrogen bond and alkali-solubility. More specifically, the polyurethane polymer having in the side chain thereof an ethylenic unsaturated binding group is a polymer further having a carboxyl group in the side chain thereof. More specifically, a polyurethane polymer having 0.3 meq/g or more of ethylenic unsaturated binding group in the side chain thereof, and 0.4 meq/g or more of carboxyl group in the side chain thereof, is particularly preferable for use as the binder polymer.

For synthesis of the specific polyurethane polymer, compounds derived from tetracarboxylic dianhydride ring-opened by a diol compound, represented by the formulae (20) to (22) below, may be used in addition to the above-described diol. Examples of such diol compound include those listed below.

[Chemical 52]

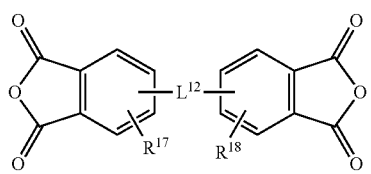
(20)

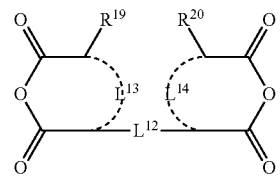
(21)

(22)

In the formulae (20) to (22), $L^{12}$ represents a single bond, divalent aliphatic or aromatic hydrocarbon group which may have a substituent (for example, alkyl, aralkyl, aryl, alkoxy, halogeno, ester and amide groups are preferable), —CO—, —SO—, —$SO_2$—, —O— or —S—, and preferably represents a single bond, $C_{1-15}$ divalent aliphatic hydrocarbon group, —CO—, —$SO_2$—, —O— or —S—. $R^{17}$ and $R^{18}$ may be same or different, each of which represents a hydrogen atom, alkyl group, aralkyl group, aryl group, alkoxy group, or halogeno group, and preferably represents a hydrogen atom, $C_{1-8}$ alkyl group, $C_{6-15}$ aryl group, $C_{1-8}$ alkoxy group or halogeno group. Any two of $L^{12}$, $R^{17}$ and $R^{18}$ may combine to form a ring.

$R^{19}$ and $R^{20}$ may be same or different, each of which represents a hydrogen atom, alkyl group, aralkyl group, aryl group or halogeno group, and preferably represents a hydrogen atom, $C_{1-8}$ alkyl, or $C_{6-15}$ aryl group. Any of two $L^{12}$, $R^{19}$ and $R^{20}$ may combine to form a ring. $L^{13}$ and $L^{14}$ may be same or different, each of which represents a single bond, double bond, or divalent aliphatic hydrocarbon group, and preferably represents a single bond, double bond, or methylene group. A represents a mononuclear or polynuclear aromatic ring, and preferably represents a $C_{6-18}$ aromatic ring.

Compounds represented by formula (20), (21) or (22) above specifically include the following:

aromatic tetracarboxylic dianhydrides such as pyromellitic dianhydride, 3,3',4,4'-benzophenonetetracarboxylic dianhydride, 3,3',4,4'-diphenyltetracarboxylic dianhydride, 2,3,6,7-naphthalenetetracarboxylic dianhydride, 1,4,5,8-naphthalenetetracarboxylic dianhydride, 4,4'-sulfonyldiphthalic dianhydride, 2,2-bis(3,4-dicarboxyphenyl)propane dianhydride, bis(3,4-dicarboxyphenyl) ether dianhydride, 4,4'-[3,3'-(alkylphosphoryldiphenylene)-bis(iminocarbonyl)]diphthalic dianhydride, adducts of hydroquinone diacetate with trimellitic anhydride, adducts of diacetyldiamine with trimellitic anhydride and the like; alicyclic tetracarboxylic dianhydrides such as 5-(2,5-dioxotetrahydrofuryl)-3-methyl-3-cyclohexene-1,2-dicarboxyl ic anhydride (EPICLON B-4400 from DIC Corporation), 1,2,3,4-cyclopentanetetracarboxylic dianhydride, 1,2,4,5-cyclohexanetetracarboxylic dianhydride, tetrahydrofuran tetracarboxylic dianhydride and the like; and aliphatic tetracarboxylic dianhydrides such as 1,2,3,4-butanetetracarboxylic dianhydride, 1,2,4,5-pentanetetracarboxylic dianhydride and the like.

Exemplary methods of introducing a compound, obtained by ring-opening reaction of these tetracarboxylic acid dianhydrides using a diol compound, into the polyurethane polymer include the followings.

a) a method of allowing an alcohol-terminated compound, obtained by ring-opening reaction of the tetracarboxylic acid dianhydride using a diol compound, to react with a diisocyanate compound; and b) a method of allowing an alcohol-terminated urethane compound, obtained by reacting a diisocyanate compound with an excessive diol compound, to react with the tetracarboxylic acid dianhydride.

Diol compounds used for the ring opening reaction here specifically include the following:

ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexane dimethanol, tricyclodecane dimethanol, hydrogenated bisphenol A, hydrogenated bisphenol F, ethylene oxide adducts of bisphenol A, propylene oxide adducts of bisphenol A, ethylene oxide adducts of bisphenol F, propylene oxide adducts of bisphenol F, ethylene oxide adducts of hydrogenated bisphenol A, propylene oxide adducts of hydrogenated bisphenol A, hydroquinone dihydroxyethyl ether, p-xylylene glycol, dihydroxyethyl sulfone, bis(2-hydroxyethyl)-2,4-tolylene dicarbamate, 2,4-tolylene-bis(2-hydroxyethyl carbamide), bis(2-hydroxyethyl)-m-xylylene dicarbamate, bis(2-hydroxyethyl) isophthalate and the like.

The specified polyurethane polymer usable in the present invention may be synthesized by heating the diisocyanate compound and the diol compound in an aprotic solvent, while being added with a publicly known catalyst with an activity depending on reactivity of the individual components. Molar ratio of the diisocyanate and the diol compound ($M_a$:$M_b$) used for the synthesis is preferably 1:1 to 1.2:1. By treatment using alcohols or amines, a product having a desired physical properties, such as molecular weight and viscosity, may be obtained in a final form containing no isocyanate group remained therein.

The specific polyurethane polymer of the present invention preferably contains an ethylenically unsaturated bond in the side chain in amount of 0.3 meq/g or more, more preferably 0.35 to 1.50 meq/g as expressed in terms of equivalents. Especially preferred binder polymers of the present invention are polyurethane polymers containing 0.4 meq/g or more, more preferably 0.45 to 1.00 meq/g of a carboxyl group in the side chain in combination with an ethylenically unsaturated bond.

Preferably, the specific polyurethane polymer of the present invention has a molecular weight 10,000 or more, more preferably in the range of 40,000 to 200,000 expressed as weight average molecular weight. Especially when the polymerizable compositions of the present invention are used for recording layers of lithographic master plates, image areas exhibit high strength and non-image areas exhibit high developability with alkaline developers if the weight average molecular weight falls in the above ranges.

Further, the specific polyurethane polymer of the present invention is also conveniently used when it contains an unsaturated group at the end or in the main chain of the polymer. The presence of an unsaturated group at the end or in the main chain of the polymer further improves the crosslinking reactivity between a polymerizable compound and a specific polyurethane polymer or between specific polyurethane polymers so that the strength of the photocured product increases. As a result, plate materials having high printing durability can be provided when the specific polyurethane polymer is used for lithographic plates. The unsaturated group here especially preferably contains a carbon-carbon double bond because crosslinking reactions readily occur.

A method for introducing an unsaturated group at the end of the polymer is as follows. Thus, an alcohol or an amine or the like containing an unsaturated group may be used during the step of treating isocyanate groups remaining at the end of the polymer with an alcohol or an amine or the like in the process for synthesizing the polyurethane polymer described above. Such compounds specifically include those similar to the exemplary compounds listed above as monofunctional alcohol or monofunctional amine compounds containing an unsaturated group.

Preferably, an unsaturated group is introduced into the side chain of the polymer rather than the end of the polymer because the amount to be introduced can be readily controlled so that an increased amount can be introduced and the crosslinking reaction efficiency is improved.

The ethylenically unsaturated bond-containing group to be introduced is preferably methacryloyl, acryloyl or styryl, more preferably methacryloyl or acryloyl because of the ease of forming crosslinked cured films. Methacryloyl is still more preferred because of a combination of the ease of forming crosslinked cured films with improved raw stock stability.

Methacryloyl groups are preferably introduced in an amount of 0.30 meq/g or more, more preferably in the range of 0.35 to 1.50 meq/g, as previously described. In other words, the most preferred embodiments of the binder polymers of the present invention are polyurethane polymers containing methacryloyl groups in the range of 0.35 to 1.50 meq/g in the side chain.

A method for introducing an unsaturated group into the main chain is to use a diol compound containing the unsaturated group in the direction of the main chain for the synthesis of the polyurethane polymer. Diol compounds containing an unsaturated group in the direction of the main chain specifically include the following compounds:

cis-2-butene-1,4-diol, trans-2-butene-1,4-diol, poly(butadiene) diol and the like.

The specific polyurethane polymer of the present invention can also be used in combination with alkali soluble polymers including polyurethane polymers having a different structure from that of the specific polyurethane polymer. For example, the specific polyurethane polymer can be used in combination with a polyurethane polymer containing an aromatic group in the main chain and/or the side chain.

(Styrene-Based Polymer Having Ethylenic Unsaturated Bonds in the Side Chains)

In the present invention, also styrene-based polymer having ethylenic unsaturated bonds in the side chains thereof (occasionally referred to as "styrene-based polymer", hereinafter) is preferable, and polymer having at least either one of a styrenic double bond (styrene and α-methylstyrene-based double bond) represented by the formula (23) below, and a vinylpyridinium group represented by the formula (24) below, is more preferable.

[Chemical 53]

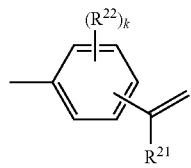

Formula (23)

In the formula (23), $R^{21}$ represents a hydrogen atom or methyl group. $R^{22}$ represents a substitutable arbitrary atom or atomic group. k represents an integer of 0 to 4.

The styrenic double bond contained in the formula (23) is bound to the principal chain of the polymer, via a single bond, or an arbitrary atom or atomic group. Mode of bonding is not specifically limited.

Preferable examples of repeating unit of the polymer compound having the functional group represented by the formula (23) are shown below. However, the present invention is not limited thereto.

[Chemical 54]

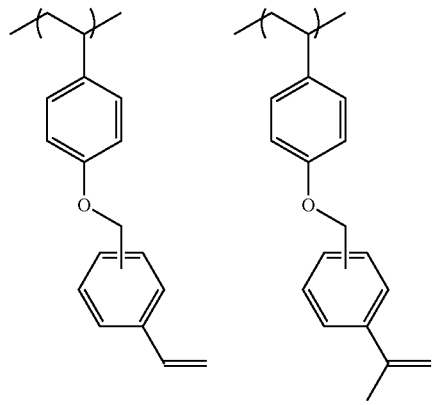

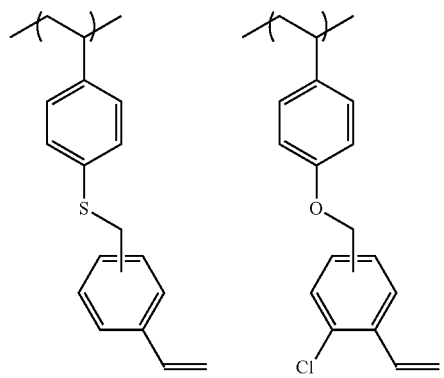

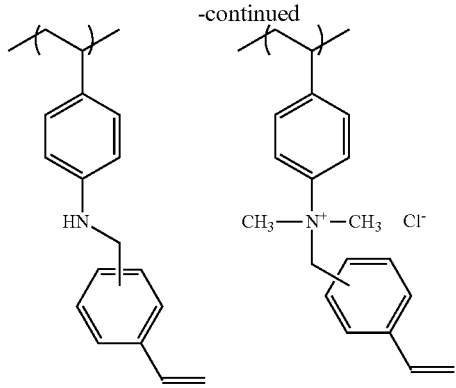

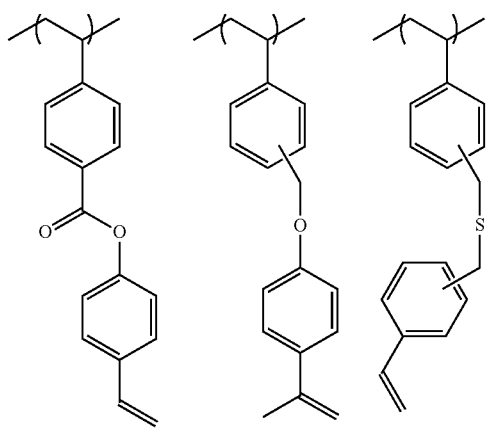

[Chemical 55]

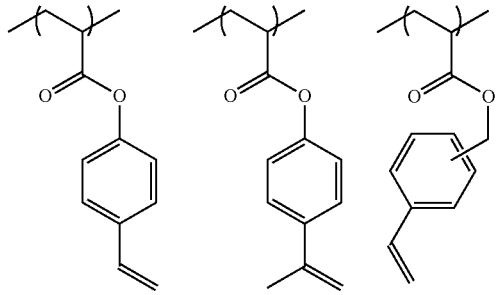

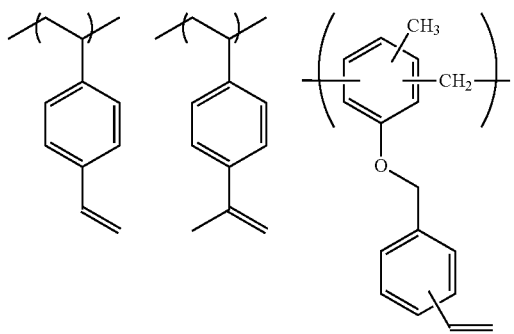

87
-continued

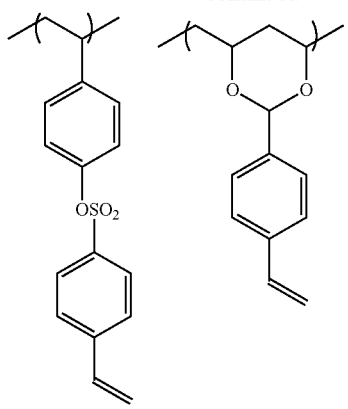

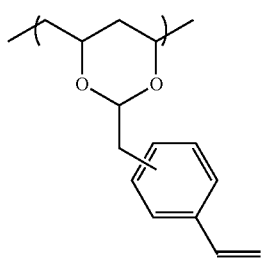

[Chemical 56]

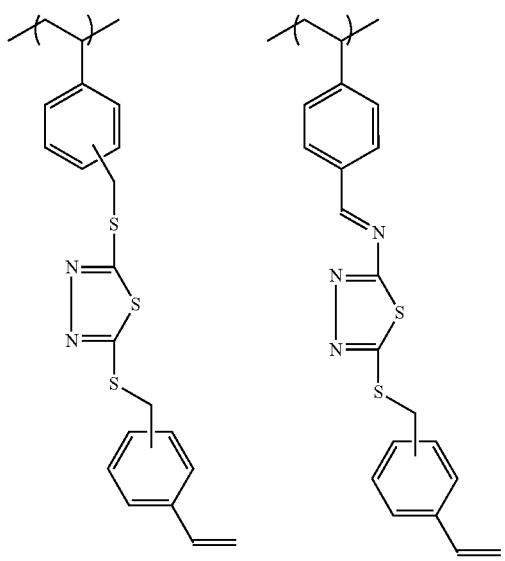

88
-continued

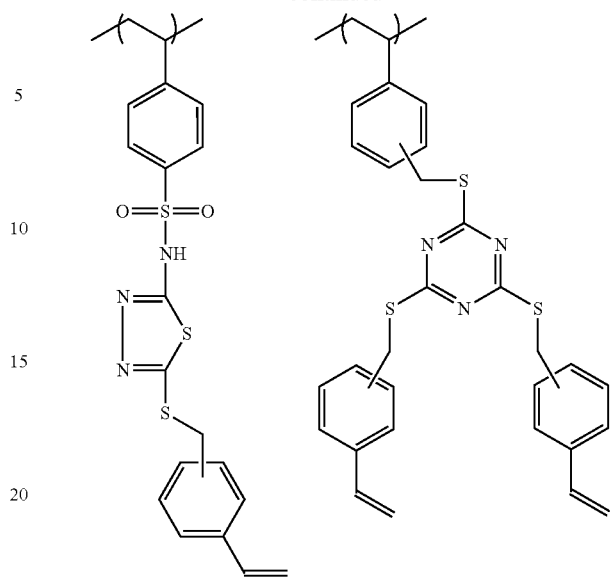

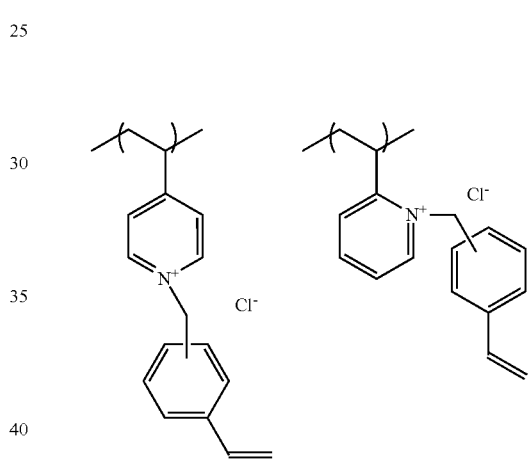

[Chemical 57]

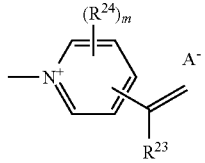

Formula (24)

In the formula (24), $R^{23}$ represents a hydrogen atom or methyl group. $R^{24}$ represents a substitutable arbitrary atom or atomic group. m represents an integer of 0 to 4. $A^-$ represents an anion. The pyridinium ring may be condensed with a benzene ring as a substituent, to be given in the form of benzopyridinium which includes quinolinium group and isoquinolinium group.

The vinylpyridinium group represented by the formula (24) is bound to the principal chain of the polymer, via a single bond, or an arbitrary atom or atomic group. Mode of bonding is not specifically limited.

Preferable examples of the repeating unit of the polymer compound having a functional group, are shown below. The present invention is not limited thereto.

[Chemical 58]

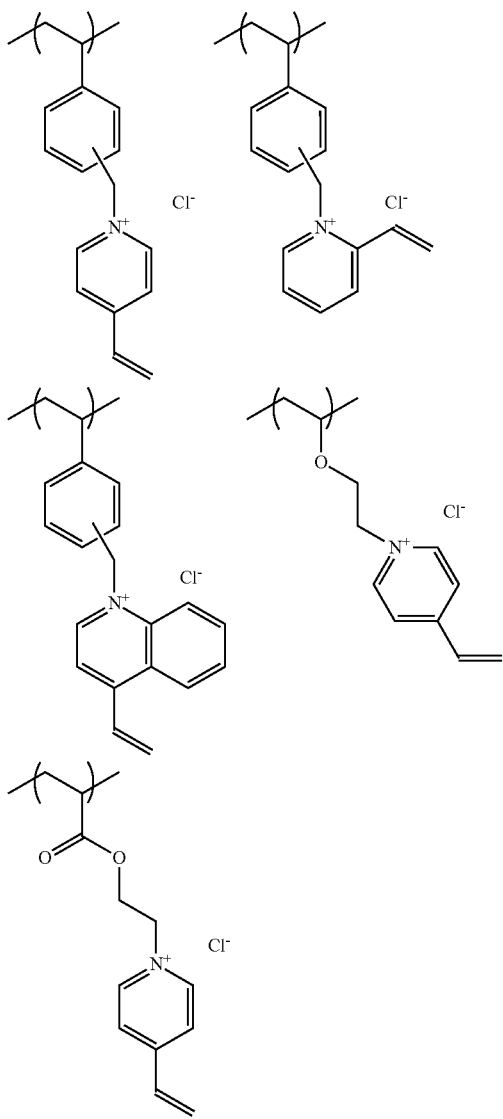

One method of synthesizing the styrene-based polymer is exemplified by a method of allowing monomers, having a functional groups represented by the formulae (23) or (24), and also having functional groups copolymerizable with other copolymerizable components, to copolymerize with each other, by a publicly-known method of copolymerization. The styrene-based polymer may be a homopolymer having only either one of the functional groups represented by the formulae (23) and (24), or may be a copolymer having two or more species of either one of, or both of the functional groups.

Moreover, the styrene-based polymer may be a copolymer with other copolymerizable monomer having none of these functional groups. Carboxy group-containing monomer is preferably selectable as the other copolymerizable monomer, typically for the purpose of providing the polymer with solubility in alkaline aqueous solution, and is exemplified by acrylic acid, methacrylic acid, 2-carboxyethyl acrylate, 2-carboxyethyl methacrylate, crotonic acid, maleic acid, fumaric acid, monoalkyl maleate, monoalkyl fumarate, and 4-carboxystyrene.

The styrene polymer can also preferably be synthesized and used as a (multi-component) copolymer by incorporating monomer components other than carboxyl-containing monomers into the copolymer. Monomers that can be incorporated into the copolymer in such cases include various monomers such as styrene and styrene derivatives such as 4-methylstyrene, 4-hydroxystyrene, 4-acetoxystyrene, 4-carboxystyrene, 4-aminostyrene, chloromethylstyrene, 4-methoxystyrene and the like; vinylphosphonic acid, vinylsulfonic acid and salts thereof, styrenesulfonic acid and salts thereof, 4-vinylpyrdine, 2-vinylpyrdine, N-vinylimidazole, N-vinylcarbazole, 4-vinylbenzy trimethylammonium chloride, N-vinylimidazole quaternized with methyl chloride, 4-vinylbenzyl pyridinium chloride, acrylonitrile, methacrylonitrile, phenylmaleimide, hydroxyphenylmaleimide; vinyl esters such as vinyl acetate, vinyl chloroacetate, vinyl propionate, vinyl butyrate, vinyl stearate, vinyl benzoate and the like; vinyl ethers such as methyl vinyl ether, butyl vinyl ether and the like; N-vinylpyrrolidone, acryloylmorpholine, vinyl chloride, vinylidene chloride, allyl alcohol, vinyltrimethoxysilane and the like; and these may be used as copolymerizable monomers as appropriate.

When the above-described copolymer is used as the styrene-based polymer, ratio of the repeating unit having the functional groups represented by the formula (23) and/or formula (24), relative to the whole copolymer composition is preferably 20% by mass or more, and more preferably 40% by mass or more. In these ranges, the effect of the present invention is distinctive, and thereby a highly sensitive crosslinked system may be provided.

When the styrene polymer contains a quaternary salt structure in the repeat unit, it may be soluble in water. If the polymerizable compositions of the present invention containing such a polymer are used as recording layers of lithographic master plates, images can also be developed with water after exposure.

Preferably, it is a copolymer with another copolymerizable monomer exemplified below, provided that when it contains a functional group represented by general formula (23) in the repeat unit and a quaternary salt structure in a linking group between the main chain and the functional group represented by general formula (23) (e.g., specific examples P-6, P-23 and P-24 shown above and the like), it may be a homopolymer having such a structure. For example, monomers that are preferably used include 4-vinylbenzyl trimethylammonium chloride, acryloyloxyethyl trimethylammonium chloride, methacryloyloxyethyl trimethylammonium chloride, dimethylaminopropyl acrylamide quaternized with methyl chloride, N-vinylimidazole quaternized with methyl chloride, 4-vinylbenzyl pyridinium chloride and the like.

When it contains a functional group represented by general formula (24) in the repeat unit, it may be a homopolymer or a copolymer with the other copolymerizable monomers listed above.

Alternatively, images can also be developed with aqueous alkaline solutions, if it is a copolymer containing a carboxyl group. In any case, the proportion of the repeat unit containing a functional group represented by general formula (23) and/or general formula (24) is preferably 20% by mass or more, and other repeat units to be introduced can be selected at will depending on the purpose.

The styrene polymer preferably has a molecular weight in the range of 10000 to 300000, more preferably in the range of 15000 to 200000, most preferably in the range of 20000 to 150000 expressed as weight average molecular weight. Especially when the polymerizable compositions of the present invention are used for recording layers of lithographic master plates, image areas exhibit high strength and non-image areas exhibit high developability with alkaline developers if the weight average molecular weight falls in the above ranges.

(Other Polymer Having Ethylenic Unsaturated Bonds in the Side Chains)

Other polymer having ethylenic unsaturated bonds in the side chains thereof includes novolac polymer having ethylenic unsaturated groups in the side chains thereof, and is exemplified by a polymer obtained by introducing, into the side chain of the polymer described in JP-A-H09-269596, an ethylenic unsaturated bond according to a method described in JP-A-2002-62648.

The acetal polymer, having ethylenic unsaturated bonds bound to the side chains thereof, is typically exemplified by polymers described in JP-A-2002-162741.

The polyamide-based polymer, having the ethylenic unsaturated bonds bound to the side chains thereof, is typically exemplified by polymers described in Japanese Patent Application No. 2003-321022, or polymers obtained by introducing the ethylenic unsaturated bonds into the polyamide polymer cited therein, by a method described in JP-A-2002-62648.

The polyimide polymer, having the ethylenic unsaturated bonds bound to the side chains thereof, is exemplified by polymers described in Japanese Patent Application No. 2003-339785, or polymers obtained by introducing the ethylenic unsaturated bonds into the polyimide polymer cited therein, by a method described in JP-A-2002-62648.

<<Polymer Having an Epoxy Group or Oxetanyl Group in the Side Chains>>

The present invention relates to an embodiment which preferably contains a polymer having an epoxy group or an oxetanyl group in the side chains. The polymer having an epoxy group in the side chains thereof, and polymerizable monomer or oligomer having two or more epoxy groups in the molecule thereof, and is exemplified by bisphenol A-type epoxy resin, bisphenol F-type epoxy resin, phenol novolac-type epoxy resin, cresol novolac-type epoxy resin, and aliphatic epoxy resin.

These compounds are commercially available, or may be obtained by introducing epoxy groups into the side chains of the polymer.

These compounds are commercially available, or may be obtained by introducing epoxy groups into the side chains of the polymer. Commercially available products include, for example, bisphenol A epoxy resins such as JER827, JER828, JER834, JER1001, JER1002, JER1003, JER1055, JER1007, JER1009 and JER1010 (all from Japan Epoxy Resins Co., Ltd.); EPICLON 860, EPICLON 1050, EPICLON 1051 and EPICLON 1055 (all from DIC Corporation) and the like; bisphenol F epoxy resins such as JER806, JER807, JER4004, JER4005, JER4007 and JER4010 (all from Japan Epoxy Resins Co., Ltd.); EPICLON 830 and EPICLON 835 (all from DIC Corporation); LCE-21 and RE-602S (all from Nippon Kayaku Co., Ltd.) and the like; phenol novolac epoxy resins such as JER152, JER154, JER15/S70 and JER157S65 (all from Japan Epoxy Resins Co., Ltd.); EPICLON N-740, EPICLON N-740, EPICLON N-770 and EPICLON N-775 (all from DIC Corporation) and the like; cresol novolac epoxy resins such as EPICLON N-660, EPICLON N-665, EPICLON N-670, EPICLON N-673, EPICLON N-680, EPICLON N-690 and EPICLON N-695 (all from DIC Corporation); EOCN-1020 (from Nippon Kayaku Co., Ltd.) and the like; aliphatic epoxy resins such as ADEKA RESIN series EP-4080S, EP-4085S and EP-4088S (all from ADEKA CORPORATION); CELLOXIDE 2021P, CELLOXIDE 2081, CELLOXIDE 2083, CELLOXIDE 2085, EHPE3150, EPOLEAD PB 3600 and EPOLEAD PB 4700 (all from Daicel Corporation); Denacol EX-212L, EX-214L, EX-216L, EX-321L and EX-850L (all from Nagase ChemteX Corporation) and the like. In addition, other examples include ADEKA RESIN series EP-4000S, EP-4003S, EP-4010S and EP-4011S (all from ADEKA CORPORATION); NC-2000, NC-3000, NC-7300, XD-1000, EPPN-501 and EPPN-502 (all from ADEKA CORPORATION); JER1031S (Japan Epoxy Resins Co., Ltd.) and the like.

Specific examples of the polymer, having oxetanyl groups in the side chains thereof, and polymerizable monomer or oligomer having two or more oxetanyl group in the molecule thereof, include Aron Oxetane OXT-121, OXT-221, OK-SQ, and PNOX (all from Toagosei Co. Ltd.).

In the synthesis based on introduction into the side chains of the polymer, a reaction for introduction may be proceeded typically by using a tertiary amine such as triethylamine or benzylmethylamine; quaternary ammonium salt such as dodecyl trimethyl ammonium chloride, tetramethyl ammonium chloride or tetraethyl ammonium chloride; pyridine or triphenylphosphine as a catalyst, in an organic solvent, at a reaction temperature of 50 to 150° C., for several to several tens hours. Amount of introduction of alicyclic epoxy unsaturated compound is preferably controlled so as to adjust the acid value of the resultant polymer to 5 to 200 KOH·mg/g. Molecular weight is in the range from 500 to 5,000,000 on the weight average basis, and preferably in the range from 1,000 to 500,000.

The epoxy unsaturated compound usable herein includes those having a glycidyl group as an epoxy group, such as glycidyl (meth)acrylate and allyl glycidyl ether, wherein unsaturated compounds having alicyclic epoxy groups are preferable. Those sorts of compounds are exemplified by the following compounds.

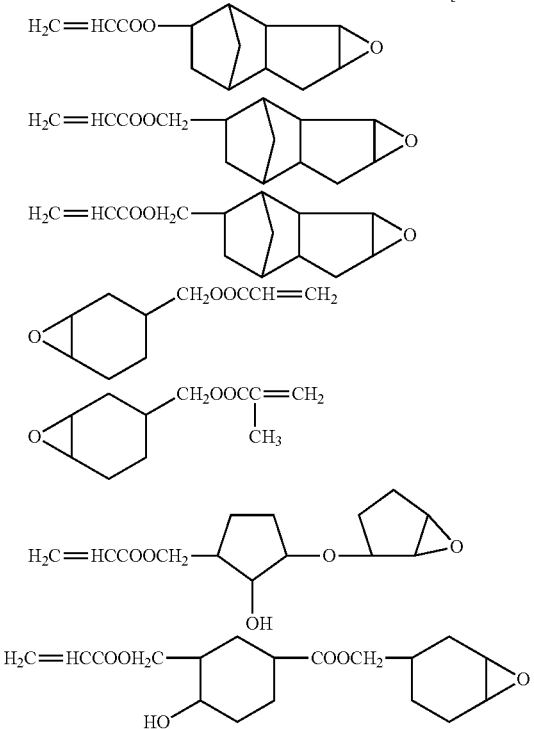

[Chemical 59]

-continued

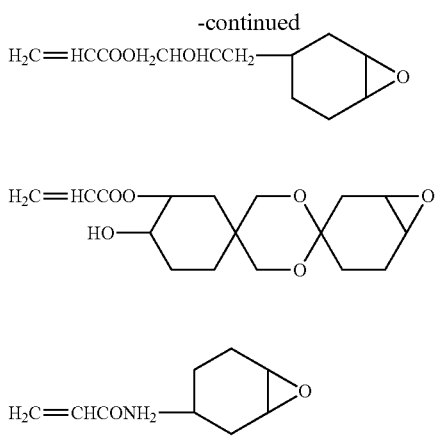

Details of these polymerizable compounds, regarding the structures thereof, independent/combined mode of use, amount of addition and so forth, are arbitrarily determined so as to be matched to final performance designs of the near-infrared absorbing composition. For example, a structure having a large content of unsaturated group is preferable, in many cases having 2 or more functional groups is more preferable from the viewpoint of sensitivity. On the other hand, from the viewpoint of improving strength of the near-infrared cut filter, the structure is preferably tri-functional or of higher functionality. Also a method of controlling both of sensitivity and strength, by combining the compounds having different numbers of functionality and different polymerizable groups (for example, acrylic ester, methacrylic ester, styrene-based compound, vinyl ether-based compound), is effective. Selection and usage of the polymerizable compound are critical factors also with respect to compatibility and dispersibility of other components (for example, metal oxide, dye, or polymerization initiator) contained in the near-infrared absorbing composition. For example, the compatibility may be improved by using low-purity compound, or by using two or more species in combination. Alternatively, a specified structure is selectable from the viewpoint of improving adhesiveness to a hard surface such as supporting member.

Amount of addition of the polymerizable compound to the composition of the present invention is preferably 1 to 80% by mass of the whole solid content excluding the solvent, more preferably 15 to 70% by mass, and particularly 20 to 60% by weight.

Only one species of the polymerizable compound, or two or more species thereof may be used. When two or more species are used in combination, the total amount falls in the ranges described above.

<Binder Polymers>

The compositions of the present invention may comprise a binder polymer to improve film properties or for other purposes. Alkali-soluble resins are preferably used as binder polymers. Alkali-soluble resins are effective for improving heat resistance and the like or precisely optimizing coatability.

The alkali-soluble resin is properly selectable from linear organic high polymers, having in the molecule thereof (preferably, in the molecule having an acrylic copolymer or styrene-based copolymer in the principal chain) at least one group capable of enhancing alkali solubility. Polyhydroxy styrene-based resin, polysiloxane-based resin, acrylic resin, acrylamide-based resin, and acryl/acrylamide copolymer resin are preferable from the viewpoint of heat resistance, whereas, acrylic resin, acrylamide-based resin, and acryl/acrylamide copolymer resin are preferable from the viewpoint of developing property control.

The group capable of enhancing alkali solubility (also referred to as "acid group", hereinafter) is exemplified by carboxyl group, phosphoric acid group, sulfonic acid group, and phenolic hydroxyl group. Those making the resin soluble into organic solvent and developable with a weak alkaline aqueous solution are preferable. (Meth)acrylic acid is particularly preferable. The acid group may be of a single species, or of two or more species.

Examples of monomer capable of adding an acid group after polymerization include a monomer having a hydroxy group such as 2-hydroxyethyl (meth)acrylate, a monomer having an epoxy group such as glycidyl (meth)acrylate, and a monomer having an isocyanate group such as 2-isocyanate ethyl (meth)acrylate. The group for introducing an acid group may be of a single species or of two or more species. The acid group may be introduced into the alkali-soluble binder, for example, by polymerizing the monomer having the acid group and/or the monomer capable of adding an acid group after polymerization (occasionally referred to as "acid group introducing monomer", hereinafter) as a monomer component. For the case where the acid group is introduced by using, as the monomer component, the monomer capable of introducing an acid group after polymerization, a treatment for adding the acid group described later will be necessary after the polymerization.

The alkali-soluble resin may be manufactured, for example, by a publicly known radical polymerization process. Conditions for polymerization regarding temperature, pressure, species and amount of radical initiator, and species of solvent are readily adjustable by those skilled in the art, and may also be determined by experiments.

High-molecular weight organic linear polymers used as alkali-soluble resins are preferably polymers containing a carboxylic acid in the side chain, including methacrylic acid copolymers, acrylic acid copolymers, itaconic acid copolymers, crotonic acid copolymers, maleic acid copolymers, partially esterified maleic acid copolymers, alkali-soluble phenol resins such as novolac resins and the like; as well as acidic cellulose derivatives containing a carboxylic acid in the side chain, and adducts of hydroxyl-containing polymers with acid anhydrides. Especially preferred alkali-soluble resins axe copolymers of (meth)acrylic acid and other monomers copolymerizable therewith. Other monomers copolymerizable with (meth)acrylic acid include alkyl (meth)acrylates, aryl (meth)acrylates, vinyl compounds and the like. Alkyl (meth)acrylates and aryl (meth)acrylates include methyl (meth)acrylate, ethyl (meth)acrylate, propyl (meth) acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth) acrylate and the like; vinyl compounds include styrene, α-methylstyrene, vinyltoluene, glycidyl methacrylate, acrylonitrile, vinyl acetate, N-vinylpyrrolidone, tetrahydrofurfuryl methacrylate, polystyrene macromonomers, polymethyl methacrylate macromonomers and the like; and other examples include the N-substituted maleimide monomers described in JP-A-H10-300922 such as N-phenylmaleimide, N-cyclohexylmaleimide and the like. These other monomers polymerizable with (meth)acrylic acid may be used alone or as a combination of two or more of them.

The alkali-soluble resin also preferably contains represented by the formula (ED) below:

[Chemical 60]

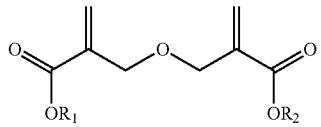

Formula (ED)

(in the formula (ED), each of $R^1$ and $R^2$ independently represents a hydrogen atom or a $C_{1-25}$ hydrocarbon group which may have a substituent). In this way, the composition of the present invention may form a cured coated film especially excellent in the heat resistance and translucency. Commercially available products, such Akurikyua RD-F8 (acrylic resin) (manufactured by Nippon Shokubai Co., Ltd.), and the like.

In the formula (1) representing the ether dimer, the $C_{1-25}$ hydrocarbon group which may have a substituent represented by $R^1$ and $R^2$ is exemplified by, but not specially limited to, straight-chain or branched alkyl group such as methyl, ethyl, n-propyl, isopropyl, n-butyl, isobutyl, t-butyl, t-amyl, stearyl, lauryl, and 2-ethylhexyl groups; aryl group such as phenyl group; alicyclic group such as cyclohexyl, t-butylcyclohexyl, dicyclopentadienyl, tricyclodecanyl, isobornyl, adamantyl, and 2-methyl-2-adamantyl groups; alkoxy-substituted alkyl group such as 1-methoxyethyl, and 1-ethoxyethyl groups; and aryl group-substituted alkyl group such as benzyl group. Among them, substituents having a primary or secondary carbon less eliminatable by acid or heat, such as methyl, ethyl, cyclohexyl, and benzyl, are preferable from the viewpoint of heat resistance.

Specific examples of the ether dimer include, for example, dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)]bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, di(2-methyl-2-adamantyl)-2,2'-[oxybis(methylene)]bis-2-propenoate and the like. Among them, especially preferred are dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate. These ether dimers may be used alone or as a combination of two or more of them. Structures derived from the compound represented by general formula (ED) above may be copolymerized with other monomers.

The novolac resin is typically exemplified by those obtainable by condensing phenols and aldehydes, under the presence of an acid catalyst. The phenols are exemplified by phenol, cresol, ethylphenol, butyl phenol, xylenol, phenylphenol, catechol, resorcinol, pyrogallol, naphthol, and bisphenol-A.

The aldehydes are exemplified by formaldehyde, paraformaldehyde, acetaldehyde, propionaldehyde, and benzaldehyde.

Only one species each of the phenols and aldehydes may be used, or two or more each species of them may be used in combination.

Specific examples of the above novolac resin is exemplified by a condensed product of methcresol, parachresol, or mixture thereof and hormalin The novolac resin may be controlled in the molecular weight distribution thereof, typically by fractionation. The novolac resin may also be mixed with a low molecular weight component having a phenolic hydroxy group such as bisphenol-C and bisphenol-A.

As the alkali-soluble resin, particularly preferable are multi-component copolymer such as composed of benzyl (meth)acrylate (BzMA)/(meth)acrylic acid (MAA) copolymer, or formed by reacting them with the other monomers. Other examples include copolymer having 2-hydroxyethyl methacrylate co-polymerized therein, and those described in JP-A-H7-140654 including 2-hydroxypropyl (meth)acrylate/polystyrene macromonomer/benzyl methacrylate/methacrylic acid copolymer, 2-hydroxy-3-phenoxypropyl acrylate/polymethyl methacrylate macromonomer/benzyl methacrylate/methacrylic acid copolymer, 2-hydroxyethyl methacrylate/polystyrene macromonomer/methyl methacrylate/methacrylic acid copolymer, and 2-hydroxyethyl methacrylate/polystyrene macromonomer/benzyl methacrylate/methacrylic acid copolymer, the copolymer described in JP-2004-300204.

Acid value of the alkali-soluble resin is preferably 30 mg KOH/g to 200 mg KOH/g, more preferably 50 mg KOH/g to 150 mg KOH/g, and most preferably 70 to 120 mg KOH/g.

Weight average molecular weight (Mw) of the alkali-soluble resin is preferably 2,000 to 50,000, more preferably 5,000 to 30,000, and most preferably 7,000 to 20,000.

When the composition of the present invention contains the binder polymer, Content of the binder polymer in the composition of the present invention is preferably 1% by mass to 80% by mass of the whole solid content of the composition, more preferably 10% by mass to 70% by mass, and furthermore preferably 20 to 60% by mass.

<Polymerization Initiator>

The composition of the present invention may also contain a polymerization initiator. The polymerization initiator may be of a single species, or of two or more species. When two or more species are used, the total content is adjusted to the range described below. The content is preferably 0.01% by mass to 30% by mass, more preferably 0.1% by mass to 20% by mass, and particularly 0.1% by mass to 15% by mass.

The polymerization initiator is properly selectable depending on purposes, without special limitation so long as it can initiate polymerization of the polymerizable compound with the aid of light and/or heat, and is preferably a photopolymerizable compound. When the polymerization is triggered by light, the polymerization initiator preferably shows photosensitivity over the region from ultraviolet radiation to visible light.

On the other hand, when the polymerization is triggered by heating, the polymerization initiator is preferably decomposable at 150° C. to 250° C.

The polymerization initiator preferably has at least an aromatic group, and is exemplified by acylphosphine compound, acetophenone-based compound, α-aminoketone compound, benzophenone-based compound, benzoin ether-based compound, ketal derivative compound, thioxanthone compound, oxime compound, hexaaryl biimidazole compound, trihalomethyl compound, azo compound, organic peroxide, diazonium compound, iodonium compound, sulfonium compound, azinium compound, benzoin ether-based compound, ketal derivative compound, onium salt compound, metallocene compound, organic borate compound, and disulfone compound.

From the viewpoint of sensitivity, preferable are the oxime compound, acetophenone-based compound, α-aminoketone compound, trihalomethyl compound, hexaaryl biimidazole compound and thiol compound.

Examples of the polymerization initiator preferably used in the present invention will be listed below, but not intended to limit the present invention.

Acetophenone compounds specifically include, for example, 2,2-diethoxyacetophenone, p-dimethylaminoacetophenone, 2-hydroxy-2-methyl-1-phenylpropan-1-one, p-dimethylaminoacetophenone, 4'-isopropyl-2-hydroxy-2-methylpropiophenone, 1-hydroxycyclohexyl phenyl ketone, 2-benzyl-2-dimethylamino-1-(4-morpholinophenyl)-1-butanone, 2-tolyl-2-dimethylamino-1-(4-morpholinophenyl)-1-butanone, 2-methyl-1-[4-(methylthio)phenyl]-2-morpholino-1-propanone, 2-methyl-1-(4-methylthiophenyl)-2-morpholinopropan-1-one, 2-benzyl-2-dimethylamino-1-(4-morpholinophenyl)-1-butanone, 2-(dimethylamino)-2-[(4-methylphenyl)methyl]-1-[4-(4-morpholinyl)phenyl]-1-butanone, and 2-methyl-1-(4-methylthiophenyl)-2-morpholinopropan-1-one and the like.

Trihalomethyl compounds more preferably include s-triazine derivatives in which at least one mono-, di- or tri-halogen-substituted methyl group is attached to an s-triazine ring, specifically for example, 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-naphthoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine and the like.

Hexaarylbiimidazole compounds include, for example, various compounds described in JP-B-H6-29285; U.S. Pat. Nos. 3,479,185; 4,311,783; and 4,622,286; and the like, specifically 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluorophenyl)-4,4',5,5'-tetraphenylbiimidazole and the like.

Oxime compounds include the compounds described in J.C.S. Perkin II (1979) 1653-1660, J.C.S. Perkin II (1979) 156-162, Journal of Photopolymer Science and Technology (1995) 202-232, Journal of Applied Polymer Science (2012) pp. 725-731, JP-A2000-66385, OP-A2000-80068 and JP-A2004-534797; IRGACURE OXE 01 (1,2-octanedione, 1-[4-(phenylthio)-, 2-(O-benzoyloxime)]) and IRGACURE OXE 02 (ethanone, 1-[9-ethyl-6-(2-methylbenzoyl)-9H-carbazole-3-yl]-, 1-(O-acetyloxime)) from BASF Japan Ltd.; 2-(acetyloxyiminomethyl)thioxanthen-9-one and the like.

More preferably, cyclic oxime compound described in JP-A-2007-231000 and JP-A-2007-322744 are used in a successful manner.

Still other examples include oxime compounds having specified substituents described in JP-A-2007-269779, and oxime compounds having a thioaryl group described in JP-A-2009-191061.

More specifically, also oxime compounds represented by the formula (1) below are preferable. The oxime may be an E-isomer, or Z-isomer, or mixture of E-isomer and Z-isomer, with respect to the N—O bond.

[Chemical 61]

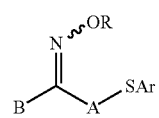

(1)

(In the formula (1), each of R and B independently represents a monovalent substituent, A represents a divalent organic group, and Ar represents an aryl group.)

The monovalent substituent represented by R is preferably a monovalent non-metallic atomic group. The monovalent non-metallic atomic group is exemplified by alkyl group, aryl group, acyl group, alkoxycarbonyl group, aryloxycarbonyl group, heterocyclic group, alkylthiocarbonyl group, and arylthiocarbonyl group. Each of these groups may have one or more substituents. The substituent may further be substituted by other substituent.

Examples of the substituent include halogen atom, aryloxy group, alkoxycarbonyl group or aryloxycarbonyl group, acyloxy group, acyl group, alkyl group, and aryl group.

The optionally substituted alkyl group is preferably an alkyl group containing 1 to 30 carbon atoms, examples of which specifically include methyl, ethyl, propyl, butyl, hexyl, octyl, decyl, dodecyl, octadecyl, isopropyl, isobutyl, sec-butyl, t-butyl, 1-ethylpentyl, cyclopentyl, cyclohexyl, trifluoromethyl, 2-ethylhexyl, phenacyl, 1-naphthoylmethyl, 2-naphthoylmethyl, 4-methylsulfanylphenacyl, 4-phenylsulfanylphenacyl, 4-dimethylaminophenacyl, 4-cyanophenacyl, 4-methylphenacyl, 2-methylphenacyl, 3-fluorophenacyl, 3-trifluoromethylphenacyl, and 3-nitrophenacyl.

The optionally substituted aryl group is preferably an aryl group containing 6 to 30 carbon atoms, examples of which specifically include phenyl, biphenyl, 1-naphthyl, 2-naphthyl, 9-anthryl, 9-phenanthryl, 1-pyrenyl, 5-naphthacenyl, 1-indenyl, 2-azulenyl, 9-fluorenyl, terphenyl, quaterphenyl, o-, m- and p-tolyl, xylyl, o-, m- and p-cumenyl, mesityl, pentalenyl, binaphthalenyl, ternaphthalenyl, quaternaphthalenyl, heptalenyl, biphenylenyl, indacenyl, fluoranthenyl, acenaphthylenyl, aceanthrylenyl, phenalenyl, fluorenyl, anthryl, bianthracenyl, teranthracenyl, quateranthracenyl, anthraquinonyl, phenanthryl, triphenylenyl, pyrenyl, chrysenyl, naphthacenyl, pleiadenyl, picenyl, perylenyl, pentaphenyl, pentacenyl, tetraphenylenyl, hexaphenyl, hexacenyl, rubicenyl, coronenyl, trinaphthylenyl, heptaphenyl, heptacenyl, pyranthrenyl, and ovalenyl.

The optionally substituted acyl group is preferably an acyl group containing 2 to 20 carbon atoms, examples of which specifically include acetyl, propanoyl, butanoyl, trifluoroacetyl, pentanoyl, benzoyl, 1-naphthoyl, 2-naphthoyl, 4-methylsulfanylbenzoyl, 4-phenylsulfanylbenzoyl, 4-dimethylaminobenzoyl, 4-diethylaminobenzoyl, 2-chlorobenzoyl, 2-methylbenzoyl, 2-methoxybenzoyl, 2-butoxybenzoyl, 3-chlorobenzoyl, 3-trifluoromethylbenzoyl, 3-cyanobenzoyl, 3-nitrobenzoyl, 4-fluorobenzoyl, 4-cyanobenzoyl, and 4-methoxybenzoyl.

The optionally substituted alkoxycarbonyl group is preferably an alkoxycarbonyl group containing 2 to 20 carbon atoms, examples of which specifically include methoxycarbonyl, ethoxycarbonyl, propoxycarbonyl, butoxycarbonyl, hexyloxycarbonyl, octyloxyoxycarbonyl, decyloxycarbonyl, octadecyloxycarbonyl, and trifluoromethyloxycarbonyl.

Examples of optionally substituted aryloxycarbonyl groups specifically include phenoxycarbonyl, 1-naphthyloxycarbonyl, 2-naphthyloxycarbonyl, 4-methylsulfanylphenyloxycarbonyl, 4-phenylsulfanylphenyloxycarbonyl, 4-dimethylaminophenyloxycarbonyl, 4-diethylaminophenyloxycarbonyl, 2-chlorophenyloxycarbonyl, 2-methylphenyloxycarbonyl, 2-methoxyphenyloxycarbonyl, 2-butoxyphenyloxycarbonyl, 3-chlorophenyloxycarbonyl, 3-trifluoromethylphenyloxycarbonyl, 3-cyanophenyloxycarbonyl, 3-nitrophenyloxycarbonyl, 4-fluorophenyloxycarbonyl, 4-cyanophenyloxycarbonyl, and 4-methoxyphenyloxycarbonyl.

The heterocyclic group which may have a substituent is preferably an aromatic or aliphatic heterocycle containing a nitrogen atom, oxygen atom, sulfur atom or phosphorus atom.

Specifically, examples include thienyl, benzo[b]thienyl, naphtho[2,3-b]thienyl, thianthrenyl, furyl, pyranyl, isobenzofuranyl, chromenyl, xanthenyl, phenoxathiinyl, 2H-pyrrolyl, pyrrolyl, imidazolyl, pyrazolyl, pyridyl, pyrazinyl, pyrimidinyl, pyridazinyl, indolizinyl, isoindolyl, 3H-indolyl, indolyl, 1H-indazolyl, purinyl, 4H-quinolizinyl, isoquinolyl, quinolyl, phthalazinyl, naphthyridinyl, quinoxalinyl, quinazolinyl, cinnolinyl, pteridinyl, 4aH-carbazolyl, carbazolyl, β-carbolinyl, phenanthridinyl, acridinyl, perimidinyl, phenanthrolinyl, phenazinyl, phenarsazinyl, isothiazolyl, phenothiazinyl, isoxazolyl, furazanyl, phenoxazinyl, isochromanyl, chromanyl, pyrrolidinyl, pyrrolinyl, imidazolidinyl, imidazolinyl, pyrazolidinyl, pyrazolinyl, piperidyl, piperazinyl, indolinyl, isoindolinyl, quinuclidinyl, morpholinyl, and thioxanthenyl.

Examples of optionally substituted alkylthiocarbonyl groups specifically include methylthiocarbonyl, propylthiocarbonyl, butylthiocarbonyl, hexylthiocarbonyl, octylthiocarbonyl, decylthiocarbonyl, octadecylthiocarbonyl, and trifluoromethylthiocarbonyl.

Optionally substituted arylthiocarbonyl groups specifically include 1-naphthylthiocarbonyl, 2-naphthylthiocarbonyl, 4-methylsulfanylphenylthiocarbonyl, 4-phenylsulfanylphenylthiocarbonyl, 4-dimethylaminophenylthiocarbonyl, 4-diethylaminophenylthiocarbonyl, 2-chlorophenylthiocarbonyl, 2-methylphenylthiocarbonyl, 2-methoxyphenylthiocarbonyl, 2-butoxyphenylthiocarbonyl, 3-chlorophenylthiocarbonyl, 3-trifluoromethylphenylthiocarbonyl, 3-cyanophenylthiocarbonyl, 3-nitrophenylthiocarbonyl, 4-fluorophenylthiocarbonyl, 4-cyanophenylthiocarbonyl, and 4-methoxyphenylthiocarbonyl.

The monovalent substituent represented by B is exemplified by aryl group, heterocyclic group, arylcarbonyl group, or heterocyclic carbonyl group. These groups may have one or more substituents. The substituent may be exemplified by those described previously. The above-described substituents may further be substituted by other substituents.

Among them, particularly preferable structures are listed below.

In the structures below, Y, X and n are synonymous to Y, X and n in the formula (2) described later, the same will also apply to the preferable ranges.

[Chemical 62]

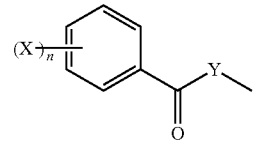

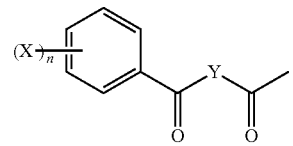

The divalent organic group represented by A is exemplified by $C_{1-12}$ alkylene group, cyclohexylene group, and alkynylene group. Each of these groups may have one or more substituents. The substituent is exemplified by the substituents described previously. The above-described substituents may further be substituted by other substituents.

In particular, from the viewpoint of enhancing the sensitivity and suppressing coloration over time under heating, A preferably represents an unsubstituted alkylene group; an alkylene group substituted by an alkyl group (for example, methyl group, ethyl group, tert-butyl group or dodecyl group); an alkylene group substituted by an alkenyl group (for example, vinyl group or allyl group); or an alkylene group substituted by an aryl group (for example, phenyl group, p-tolyl group, xylyl group, cumenyl group, naphthyl group, anthryl group, phenanthryl group or styryl group).

The aryl group represented by Ar is preferably a $C_{6-30}$ aryl group, and may have a substituent. The substituent is exemplified by those same as the substituents introduced into the substituted aryl group exemplified previously as the specific examples of the aryl group which may have a substituent.

Among others, substituted or unsubstituted phenyl group is preferable in view of enhancing the sensitivity, and suppressing coloration with time under heating.

In formula (1), the structure of "SAr" formed by the Ar group as defined above with the adjacent S is preferably one of the structures shown below to improve sensitivity, wherein Me represents methyl, and Et represents ethyl.

[Chemical 63]

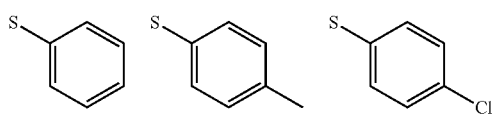
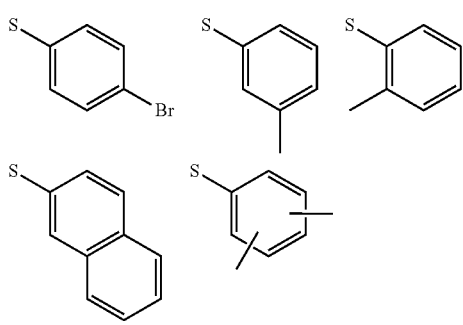
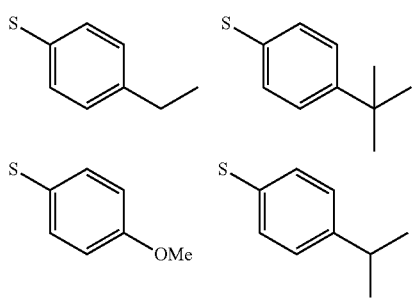
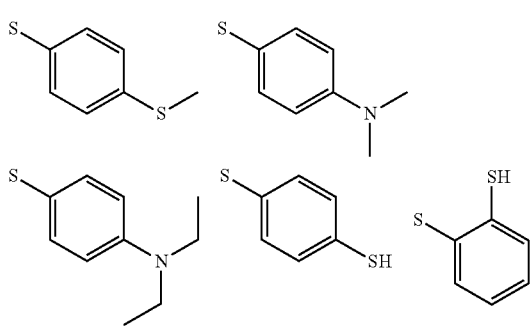
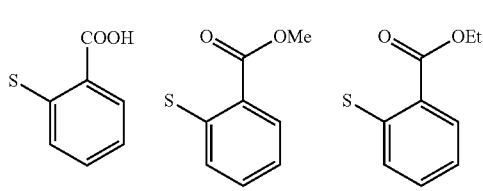
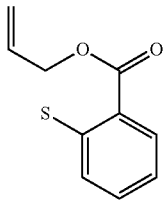

The oxime compound is also preferably a compound represented by the formula (2) below:

[Chemical 64]

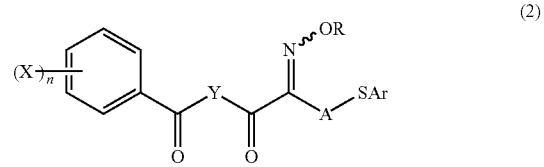

monovalent substituent, each of A and Y independently represents a divalent organic group, Ar represents an aryl group, and n represents an integer of 0 to 5).

R, A and Ar in the formula (2) are synonymous to R, A and Ar in the formula (1), the same will also apply to the preferable ranges.

The monovalent substituent represented by X is exemplified by alkyl group, aryl group, alkoxy group, aryloxy group, acyl oxy group, acyl group, alkoxycarbonyl group, amino group, heterocyclic group and halogen atom. Each of these group may have one or more substituents. The substituents may be exemplified by those described previously. The substituent may further be substituted by other substituent.

Among them, X preferably represents an alkyl group, from the viewpoint of improving the solubility into solvents and absorption efficiency in the longer wavelength region.

n in the formula (2) represents an integer of 0 to 5, and preferably an integer of 0 to 2.

The divalent organic group represented by Y is exemplified by those having structures below. Note that, in the groups shown below, * represents a site of bonding with the carbon atom adjacent to Y in the formula (2).

[Chemical 65]

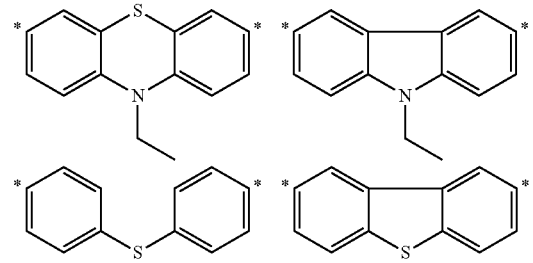
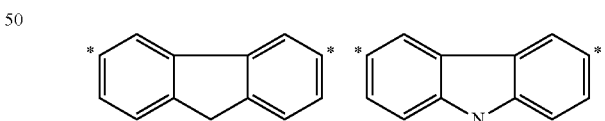
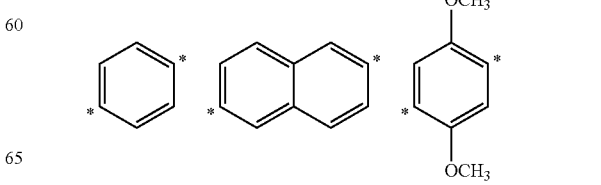

In particular, the structures shown below are preferable from the viewpoint of increasing the sensitivity.

[Chemical 66]

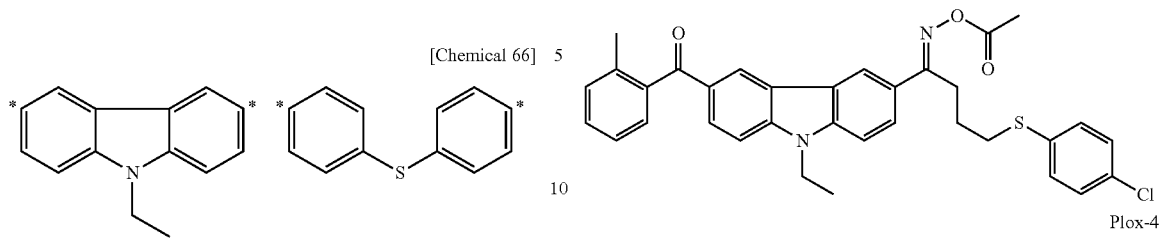

The oxime compound is also preferably a compound represented by the formula (3) below.

[Chemical 67]

(3)

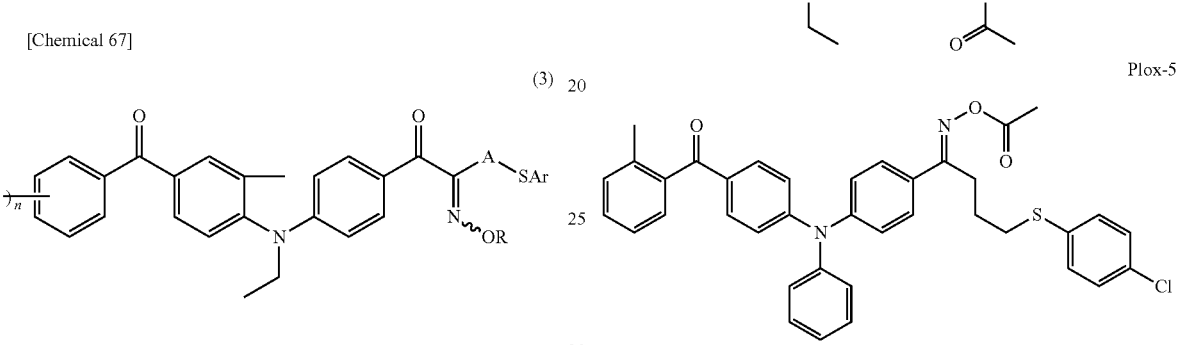

R, X, A, Ar and n in the formula (3) are synonymous to R, X, A, Ar and n in the formula (2), the same will also apply to the preferable ranges.

Hereinafter, the specific examples (PIox-1) to (PIox-13) of the oxime compound preferably used are shown below. The present invention is not limited thereto.

[Chemical 68]

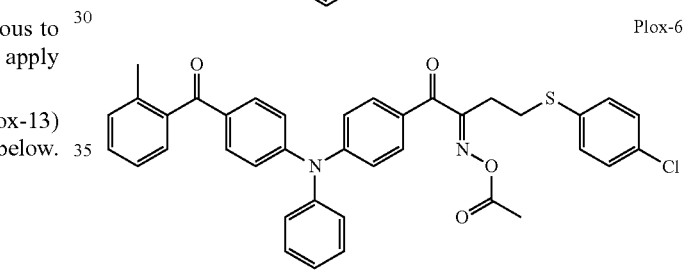

Plox-1

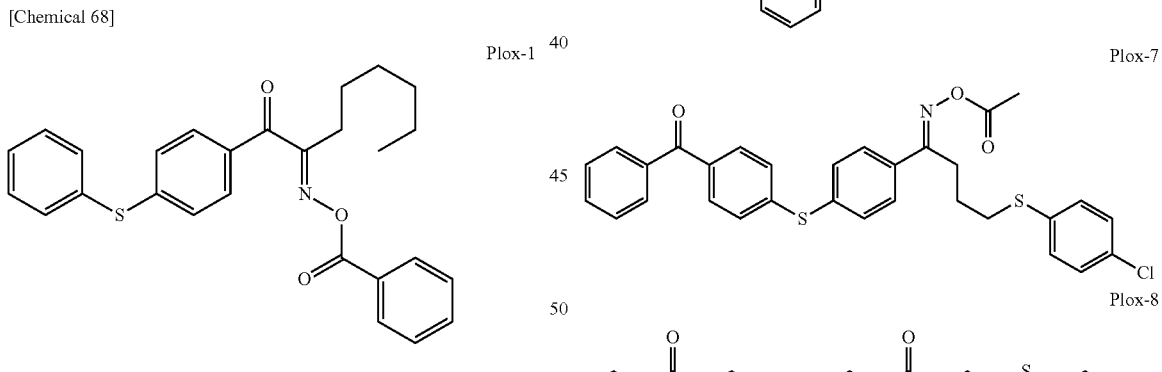

Plox-2

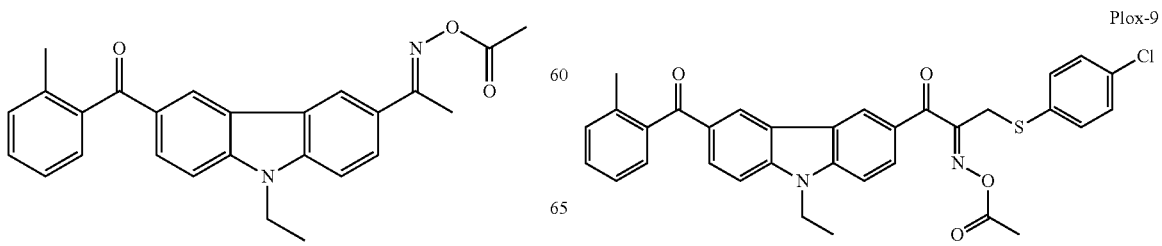

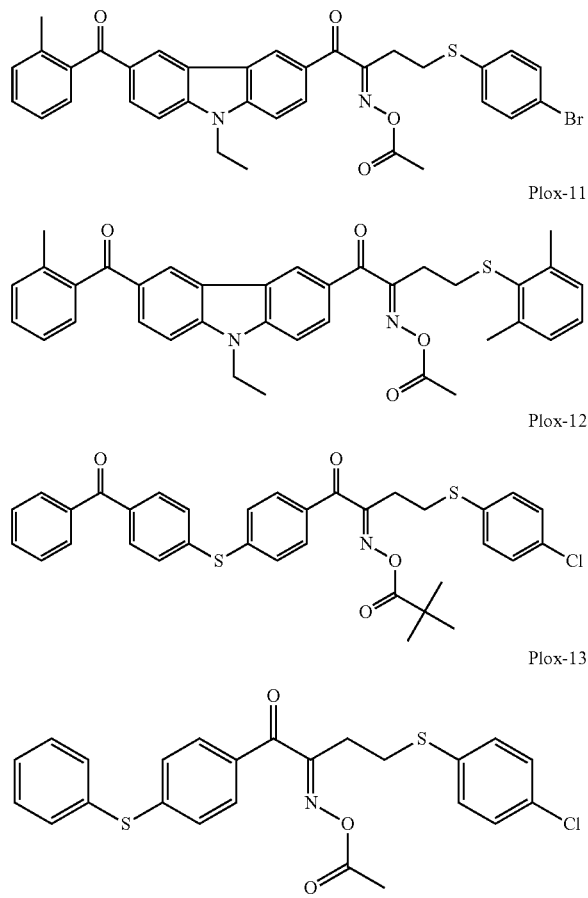

The oxime compound preferably has a maximum absorption wavelength in the wavelength range from 350 nm to 500 nm, more preferably from 360 nm to 480 nm, and particularly shows large absorbance at 365 nm and 455 nm.

From the viewpoint of sensitivity, the oxime compound preferably has a molar extinction coefficient at 365 nm or 405 nm of 3,000 to 300,000, more preferably 5,000 to 300,000, and particularly 10,000 to 200,000.

The molar extinction coefficient of the compound is measurable by any of publicly known methods, and is specifically measured typically by using a UV-visible spectrophotometer (Cary-5 spectrophotometer, from Varian, Inc.), using ethyl acetate as a solvent, at a concentration d of 0.01 g/L.

The photo-polymerization initiator is more preferably selectable from the group consisting of oxime compound, acetophenone-based compound and acyl phosphine compound. More specifically, also amino acetophenone-based initiator described in JP-A-H10-291969, acylphosphine oxide-based initiator described in Japanese Patent No. 4225898, and the oxime-based initiator described above may be used. Also compounds described in JP-A-2001-233842 may be used as the oxime-based initiator.

The acetophenone-based initiator is commercially available under the trade names of IRGACURE-907, IRGACURE-369 and IRGACURE-379 (all from BASF Japan Ltd.). The acylphosphine-based initiator is commercially available under the trade names of IRGACURE-819 and DAROCUR-TPO (both from BASF Japan Ltd.).

<Surfactants>

The compositions of the present invention may comprise a surfactant. Only one surfactant may be used or two or more surfactants may be combined. Preferably, the surfactant should be added in an amount of 0.001% by mass to 2.0% by mass, more preferably 0.005% by mass to 1.0% by mass, still more preferably 0.01 to 0.1% by mass or less based on the total mass of the compositions of the present invention. Surfactants that can be used include various surfactants such as fluorosurfactants, nonionic surfactants, cationic surfactants, anionic surfactants, silicone surfactants and the like.

Especially when the compositions of the present invention contain a fluorosurfactant, the liquid properties (especially flowability) of coating solutions prepared therefrom are further improved so that the uniformity of the coating thickness and the reduction of coating consumption can be further improved.

Thus, when coating solutions prepared from the compositions containing a fluorosurfactant are used to form a film, interfacial tension between the substrate surface and the coating solutions decreases, whereby wettability on the substrate surface and coatability on the substrate surface are improved. This is advantageous in that a film of even and uniform thickness can be more conveniently formed even if a small amount of a coating solution is used to form a thin film of about several micrometers.

The fluorine content in the fluorosurfactant is preferably 3% by mass to 40% by mass, more preferably 5% by mass to 30% by mass, especially preferably 7% by mass to 25% by mass. Fluorosurfactants having a fluorine content in the above ranges are effective for obtaining coated films of uniform thickness and for reducing coating consumption, but also they are well soluble in the near-infrared absorptive compositions.

Fluorosurfactants include, for example, MEGAFACE F171, F172, F173, F176, F177, F141, F142, F143, F144, R30, F437, F475, F479, F482, F554, F780 and F781 (all from DIC Corporation); Fluorad FC430, FC433 and FC171 (all from Sumitomo 3M Limited); SURFLON S-382, SC-101, SC-103, SC-104, SC-105, SC1068, SC-381, SC-383, S393 and KH-40 (all from Asahi Glass Co., Ltd.): PF636, PF656, PF6320, PF6520 and PF7002 (from OMNOVA Solutions Inc.); and the like.

Nonionic surfactants specifically include glycerol, trimethylolpropane, trimethylolethane and ethoxylates and propoxylates thereof (e.g., glycerol propoxylate, glycerin ethoxylate and the like); polyoxyethylene lauryl ether, polyoxyethylene stearyl ether, polyoxyethylene oleyl ether, polyoxyethylene octyl phenyl ether, polyoxyethylene nonylphenyl ether, polyethylene glycol dilaurate, polyethylene glycol distearate; sorbitan fatty acid esters (Pluronic L10, L31, L61, L62, 10R5, 17R2 and 25R2, and Tetronic 304, 701, 704, 901, 904 and 150R1 from BASF Corporation); Solsperse 20000 (from Lubrizol Japan Limited) and the like.

Cationic surfactants specifically include phthalocyanine derivatives (available from Morishita Sangyo K.K. under the brand name EFKA-745); the organosiloxane polymer KP341 (from Shin-Etsu Chemical Co., Ltd.); the (meth) acrylic (co)polymers POLYFLOW No. 75, No. 90 and No. 95 (from Kyoeisha Chemical Co., Ltd.); W001 (from Yusho Co., Ltd.); and the like.

Anionic surfactants specifically include W004, W005 and W017 (from Yusho Co., Ltd.) and the like.

Silicone surfactants include, for example, "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA", and "Toray Silicone SH8400" from Dow Corning Toray Co., Ltd.; "TSF-4440", "TSF-4300", "TSF-4445", "TSF-4460", and "TSF-4452" from Momentive Performance Materials Inc.; "KP341", "KF6001", and "KF6002" from Shin-Etsu Silicone, Co., Ltd.; "BYK307", "BYK323", and "BYK330" from BYK Japan KK; and the like.

<Other Components>

For the near-infrared absorbing composition of the present invention, in addition to the essential components and the preferable additives, any other component (s) may arbitrarily be selected and used depending on purposes, provided that the effects of the present invention are not adversely affected.

Other components are exemplified by binder polymer, dispersant, sensitizer, crosslinking agent, hardening accelerator, filler, heat hardening accelerator, heat polymerization inhibitor and plasticizer. It is also allowable to combine and use adhesion enhancer to the surface of substrate and other auxiliaries (for example, electro-conductive particle, filler, defoaming agent, flame retarder, leveling agent, stripping accelerator, antioxidant, perfume, surface tension modifier, and chain transfer agent).

By appropriately mixing these components, target properties of the near-infrared absorbing filter, such as stability and film properties, become adjustable.

These components are referred to, and selectable from components typically described in paragraphs [0183] to [0260] of JP-A-2012-003225, paragraphs [0101] to [0102] of JP-A-2008-250074, paragraphs [0103] to [0104] of JP-A-2008-250074, and paragraphs [0107] to [0109] of JP-A-2008-250074, the content of which is incorporated by reference into this specification.

The proportion of solids in the compositions of the present invention is 10 to 90% by mass, more preferably 10 to 50% by mass, still more preferably 10 to 30% by mass. When it is in such numerical ranges, the coating process is easier to perform and uniform film surfaces can be obtained.

Since the near-infrared absorbing composition of the present invention may be given in the form of liquid, so that near-infrared cut filter may readily be manufactured only by a simple process of spin coating, so that poor manufacturability of the conventional near-infrared cut filter described above may be improved.

The near-infrared absorptive compositions of the present invention are used for applications including, but not specifically limited to, near-infrared cut filters on the light-capturing side of solid-state image sensor substrates (e.g., near-infrared cut filters for wafer-level lenses and the like), near-infrared cut filters on the reverse side (opposite to the light-capturing side) of solid-state image sensor substrates and the like, preferably light-blocking films on the light-capturing side of solid-state image sensor substrates. Especially, they are preferably used by forming a coating on image sensors for solid-state imaging devices in the present invention. Specifically, examples include embodiments in which they are used by directly forming a coating on image sensors for solid-state imaging devices, or embodiments in which they are used by forming a coating on a glass substrate or the like on image sensors for solid-state imaging devices.

Further, the near-infrared absorptive compositions of the present invention preferably have a viscosity in the range of 1 mPa·s or more and 3000 mPa·s or less, more preferably in the range of 10 mPa·s or more and 2000 mPa·s or less, still more preferably in the range of 100 mPa·s or more and 1500 mPa·s or less.

When the near-infrared absorptive compositions of the present invention are used for near-infrared cut filters on the light-capturing side of solid-state image sensor substrates, the viscosity is preferably in the range of 10 mPa·s or more and 3000 mPa·s or less, more preferably in the range of 500 mPa·s or more and 1500 mPa·s or loss, most preferably in the range of 700 mPa·s or more and 1400 mPa·s or less to form thick films and to allow uniform coating.

The present invention also relates to a near-infrared cut filter having the near-infrared cut filter obtained by using the above-described near-infrared absorbing composition of the present invention. Since this sort of near-infrared cut filter is composed of the near-infrared absorbing composition of the present invention, so that the near-infrared cut filter has a large blocking performance in the near-infrared region (near-infrared blocking performance), a large translucency in the visible light region (visible light translucency), and excellent weatherability such as light resistance and moisture resistance. In particular, the near-infrared cut filter of the present invention is beneficial in the wavelength range from 700 to 2,500 nm.

The present invention also relates to a method of manufacturing a near-infrared cut filter, the method includes applying (preferably by coating, and more preferably by spin coating) the near-infrared absorbing composition to thereby form a film, on the light receiving side of the substrate for solid state image sensing device.

In the process of manufacturing the near-infrared cut filter, first, a film is formed using the near-infrared absorbing composition of the present invention. The film is not specifically limited so long as it is formed while containing the near-infrared absorbing composition. Thickness and structure of stacking may arbitrarily be selectable depending on purposes.

An exemplary method of forming the film is such as directly applying (preferably by coating), onto the support, the near-infrared absorbing composition of the present invention (coating liquid having the solid components in the composition dissolved, emulsified or dispersed in the solvent), and then by drying it to form the film.

The support may be a substrate for solid state image sensing device, or may be another substrate separately provided on the light receiving side of the substrate for solid state image sensing device (for example, a glass substrate 30 described later), or may be a layer such as planarizing layer provided on the light receiving side of the substrate for solid state image sensing device.

The near-infrared absorbing composition (coating liquid) may be applied, for example, by a method of using a spin coater, slit-and-spin coater or the like.

Conditions for drying of the coated film may vary depending on species of the solvent and ratio of use. The drying is generally proceeded at 60° C. to 150° C., for 30 seconds to 15 minutes or around.

The method of forming the near-infrared cut filter using the near-infrared absorbing composition of the present invention may further include any other process.

The other process may arbitrarily selectable depending on purposes without special limitation, and is exemplified by surface treatment, pre-baking, hardening, and post-baking of the base.

<Preheating Process, Postheating Process>

Heating temperature in the preheating process and the postheating process is generally 80° C. to 200° C., and preferably 90° C. to 150° C.

Heating time in the preheating process and the postheating process is generally 30 seconds to 240 seconds, and preferably 60 seconds to 180 seconds.

<Curing Process>

The curing process is provided, as necessary, for curing the formed film. By the process, the mechanical strength of the near-infrared cut filter may be improved.

The curing process is properly selectable depending on purposes, without special limitation. Preferable examples include whole exposure and whole heating. Note that the word "exposure" in the context of the present invention is used not only for exposure by light of various wavelength, but also for exposure by electron beam, and irradiation of radioactive ray such as X-ray.

The exposure is preferably effected by irradiation of radioactive ray. Particularly preferable examples of the radioactive ray usable for the exposure include electron beam, and ultraviolet radiation and visible light such as KrF, ArF, g-line, h-line and i-line. Particularly, KrF, g-line, h-line and i-line are preferable.

Method of exposure include exposure using a stepper, and exposure using a high-pressure mercury lamp.

Exposure energy is preferably 5 mJ/cm$^2$ to 3,000 mJ/cm$^2$, more preferably 10 mJ/cm$^2$ to 2,000 mJ/cm$^2$, and most preferably 50 mJ/cm$^2$ to 1,000 mJ/cm$^2$.

Method of the whole exposure is exemplified by method of exposing the entire surface of the formed film. When the near-infrared absorptive liquid composition contains a polymerizable compound, curing of a polymerizable component generated from the composition in the film is promoted, so that the film is further cured, and is improved in the mechanical strength and durability.

Apparatus for implementing the whole exposure is selectable depending on purposes, without special limitation. Preferable examples include a UV exposure apparatus typically using ultra-high pressure mercury lamp.

Methods of whole heating process is exemplified by method of heating of the entire surface of the formed film. By the whole heating, strength of the patterned film may be enhanced.

Heating temperature in the whole heating is preferably 120° C. to 250° C., and more preferably 120° C. to 250° C. If the heating temperature is 120° C. or above, the strength of the film may be enhanced by the heating, whereas if 250° C. or below, the film may be prevented from being embrittled due to decomposition of the components in the film.

Heating time in the whole heating is preferably 3 minutes to 180 minutes, and more preferably 5 minutes to 120 minutes.

Apparatus for implementing the whole heating is properly selectable from publicly-known apparatuses depending on purposes, without special limitation, and is exemplified by drying oven, hot plate, and IR heater.

The present invention also relates to a camera module which includes a substrate of solid state image sensing device, and a near-infrared cut filter disposed on the light receiving side of the substrate of solid state image sensing device, wherein the above-described near-infrared cut filter is the near-infrared cut filter of the present invention.

The camera module according to the embodiment of the present invention will be explained below, referring to FIG. 1 and FIG. 2, but not intended to limit the present invention to the specific examples below.

Figure 2:
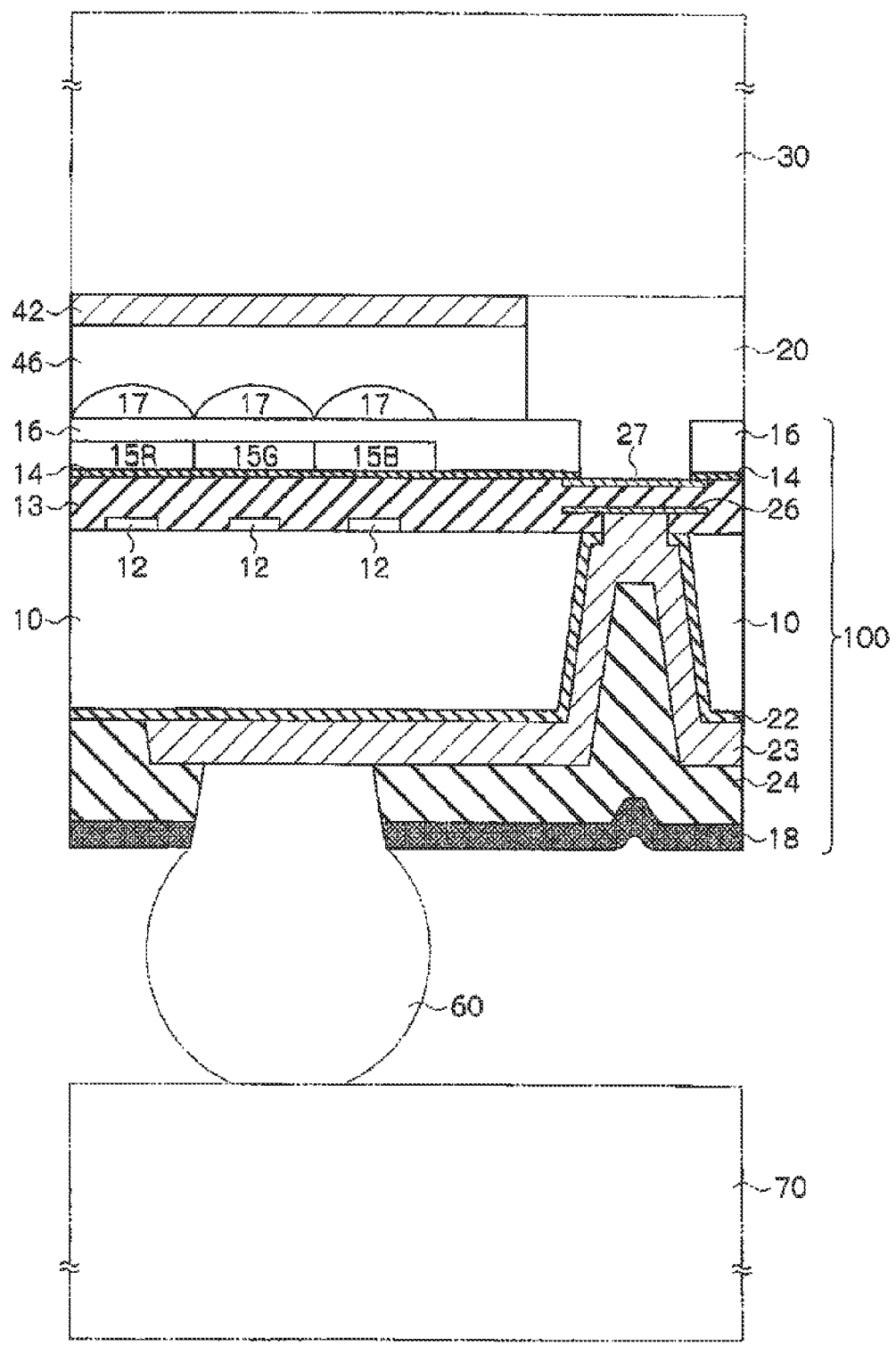
FIG. 2 is a schematic cross sectional view illustrating a substrate for solid state image sensing device according to an embodiment of the present invention.

Note that all constituents commonly appear in FIG. 1 and FIG. 2 will given the same reference numerals or marks.

In the description, the words "on", "above" and "upper side" are used in relation to the further side as viewed from the silicon substrate 10, whereas "under", "below" and "lower side" are used in relation to the side closer to the silicon substrate 10.

FIG. 1 is a schematic cross sectional view illustrating a configuration of a camera module having a solid state image sensing device.

A camera module 200 illustrated in FIG. 1 is connected through solder balls 60 which are connecting members, to a circuit substrate 70 which is a mounting substrate.

In further detail, the camera module 200 is configured to have a substrate for solid state image sensing device 100 which has an image sensing unit provided on a first principal surface of a silicon substrate; a planarizing layer 46 provided on a first principal surface (on the light receiving side) of the substrate for solid state image sensing device 100; a near-infrared cut filter 42 in the planarizing layer 46; a glass substrate 30 (translucent substrate) which is disposed above the near-infrared cut filter 42; a lens holder 50 disposed above the glass substrate 30 and housing in the inner space thereof an image sensing lens 40; and a light blocking and electromagnetic shield 44 disposed so as to surround the substrate for solid state image sensing device 100 and the glass substrate 30. The individual components are bonded by adhesives 20, 45.

The present invention also relates to a method of manufacturing a camera module which has a substrate for solid state image sensing device, and a near-infrared cut filter disposed on the light receiving side of the substrate for solid state image sensing device, the method includes spin coating the near-infrared absorbing composition described above to thereby form a film, on the light receiving side of the substrate for solid state image sensing device.

Accordingly, in the camera module of this embodiment, the near-infrared cut filter 42 is formed typically by spin coating the near-infrared absorbing composition of the present invention over the planarizing layer 46. The method of forming the film by spin coating, to thereby manufacture the near-infrared cut filter, is same as described above.

The camera module 200 is configured to allow incident light hv from the external to transmit sequentially through the image sensing lens 40, the glass substrate 30, the near-infrared cut filter 42, and the planarizing layer 46, and to reach the image sensing unit on the substrate for solid state image sensing device 100.

The camera module 200 is connected through the solder balls 60 (connecting material) to the circuit substrate 70, on the second principal surface side of the substrate for solid state image sensing device 100.

FIG. 2 is an enlarged cross sectional view illustrating the substrate of solid state image sensing device 100 in FIG. 1.

The substrate of solid state image sensing device 100 is configured to have a silicon substrate 10 as a base, image sensing devices 12, an insulating interlayer 13, a base layer 14, a red color filter 15R, a green color filter 15G, a blue color filter 15B, an overcoat 16, microlenses 17, a light-shielding film 18, an insulating film 22, a metal electrode 23, a solder resist layer 24, an internal electrode 26, and a device surface electrode 27.

Note that the solder resist layer 24 is omissible.

First, the configuration of the substrate of solid state image sensing device 100 will be explained mainly on the first principal plane side thereof.

As illustrated in FIG. 2, on the first principal plane side of the silicon substrate 10, which is a base of the substrate of solid state image sensing device 100, provided is the image sensing device section having a plurality of image sensing devices 12 such as CCDs or CMOSs arranged therein in a two dimensional manner.

In the image sensing device section, the insulating interlayer 13 is formed over the image sensing devices 12, and the base layer 14 is formed over the insulating interlayer 13. Over the base layer 14, there are provided the red color filter 15R, the green color filter 15G and the blue color filter 15B (in some cases, collectively referred to as "color filter 15", hereinafter) so as to be respectively corresponded to the image sensing devices 12.

An unillustrated light-shielding film may be provided to the boundaries of the red color filter 15R, the green color filter 15G, and the blue color filter 15B, and to the periphery of the image sensing device section. The light-shielding film may be manufactured, for example, by using a publicly known black color resist.

The overcoat 16 is formed over the color filter 15, and the microlenses 17 are formed over the overcoat 16 so as to be respectively corresponded to the image sensing devices 12 (color filter 15).

On the microlenses 17, provided is the planarizing layer 46.

On the periphery of the image sensing device section on the first principal plane side, there are provided a peripheral circuit (not illustrated) and the internal electrode 26, wherein the internal electrode 26 is electrically connected through the peripheral circuit to the image sensing devices 12.

Further over the internal electrode 26, the device surface electrode 27 is formed while placing in between the insulating interlayer 33. In the insulating interlayer 13 laid between the internal electrode 26 and the device surface electrode 27, there is formed a contact plug (not illustrated) for electrically connecting these electrodes. The device surface electrode 27 is used for applying voltage and reading signals through the contact plug and the internal electrode 26.

Over the device surface electrode 27, the base layer 14 is formed. Over the base layer 14, the overcoat 16 is formed. The base layer 14 and the overcoat 16 are opened above the device surface electrode 27 to form a pad opening, in which a part of the device surface electrode 27 exposes.

A configuration on the first principal surface side of the substrate for solid state image sensing device 100 has been described. Another possible embodiment is such as having the near-infrared cut filter provided between the base layer 14 and the color filter 15, or, between the color filter 15 and the overcoat 16, in place of providing the near-infrared cut filter 42 over the planarizing layer 46.

On the first principal surface side of the substrate for solid state image sensing device 100, the adhesive 20 is provided around the image sensing unit, and the substrate for solid state image sensing device 100 and the glass substrate 30 are bonded while placing the adhesive 20 in between.

The silicon substrate 10 has through-holes which extend therethrough, and each through-hole has provided therein a through-electrode as a part of the metal electrode 23. By the through-electrodes, the image sensing unit and the circuit substrate 70 are electrically connected.

Next, the configuration of the substrate of solid state image sensing device 100 will be explained mainly on the second principal plane side thereof.

On the second principal plane side, the insulating film 22 is formed so as to extend over the second principal plane and the inner wall of the through-hole.

On the insulating film 22, there is provided the metal electrode 23 patterned so as to extend from a region on the second principal plane of the silicon substrate 10 to the inside of the through-hole. The metal electrode 23 is an electrode for connecting the image sensing device section in the substrate of solid state image sensing device 100 and the circuit substrate 70.

The through-hole electrode is a portion of the metal electrode 23 formed in the through-hole. The through-hole electrode extends through a part of the silicon substrate 10 and the insulating interlayer to reach the lower side of the internal electrode 26, and is electrically connected to the internal electrode 26.

Further on the second principal plane side, there is provided a solder resist layer 24 (protective insulating film) formed so as to cover the second principal plane having the metal electrode 23 formed thereon, and has an opening which allows a part of the metal electrode 23 to expose therein.

Further on the second principal plane side, there is provided a light-shielding film 18 formed so as to cover the second principal plane having the solder resist layer 24 formed thereon, and has an opening which allows a part of the metal electrode 23 to expose therein.

While the light-shielding film 18 illustrated in FIG. 2 is patterned so as to cover a part of the metal electrode 23, and to allow the residual part to expose, it may alternatively be patterned so as to allow the entire portion of the metal electrode 23 to expose (the same will also apply to the patterning of the solder resist layer 24).

Alternatively, the solder resist layer 24 is omissible, and the light-shielding film 18 may be provided directly on the second principal plane having the metal electrode 23 formed thereon.

On the exposed portion of the metal electrode 23, there is provided a solder ball 60 as a connection component, and through the solder ball 60, the metal electrode 23 of the substrate of solid state image sensing device 100 and an unillustrated connection electrode of the circuit substrate 70 are electrically connected.

The configuration of the substrate for solid state image sensing device 100 has been explained, which may be formed any of publicly known methods such as described in paragraphs [0033] to [0068] of JP-A-2009-158863, and paragraphs [0036] to [0065] of JP-A-2009-99591.

The insulating interlayer 13 is configured by a $SiO_2$ film or a SiN film, typically formed by sputtering, CVD (Chemical Vapor Deposition) or the like.

The color filter is formed typically by using publicly known color resist, by photolithography.

The overcoat 16 and the base layer 14 are formed typically by using publicly known resist for forming organic insulating interlayer, by photolithography.

The microlens 17 is formed typically by using a styrene-based polymer, by photolithography.

The solder resist layer 24 is preferably formed by using, for example, a publicly known solder resist containing a phenolic polymer, polyimide-based polymer, or amine-based polymer, by photolithography.

The solder balls 60 are formed typically by using Sn—Pb (eutectic), 95Pb—Sn (high-lead, high-melting-point solder), or Pb-free solder such as Sn—Ag, Sn—Cu, Sn—Ag—Cu or the like. The solder balls 60 are formed, for example, into a spherical form with a diameter of 100 μm to 1,000 μm (preferably 150 μm to 700 μm).

The internal electrode 26 and the device-top electrode 27 are configured as a metal electrode composed of Cu or the like, typically formed by CMP (Chemical Mechanical Polishing), or photolithography combined with etching.

The metal electrode 23 is configured as a metal electrode composed of Cu, Au, Al, Ni, W, Pt, Mo, Cu compound, W compound, Mo compound or the like, typically formed by sputtering, photolithography, etching or electroplating. The metal electrode 23 may have a single-layered structure or a stacked structure composed of two or more layers. Thickness of the metal electrode 23 is typically 0.1 µm to 20 µm (preferably 0.1 µm to 10 µm). The silicon substrate 10 is not specifically limited, and may also be a substrate thinned by grinding the back surface. While thickness of the substrate is not specifically limited, a silicon wafer having of 20 µm to 200 µm thick (preferably 30 to 150 µm thick) is typically used.

The through-holes in the silicon substrate 10 are formed typically by photolithography combined with RIE (Reactive Ion Etching).

While one embodiment of the camera module has been explained referring to FIG. 1 and FIG. 2, the embodiment is not limited to that illustrated in FIG. 1 and FIG. 2.

EXAMPLE

The present invention will further be detailed below referring to Examples. Materials, amount of use, ratio, details of processes, procedures of process and so forth described in Examples below may be modified arbitrarily, without departing from the spirit of the present invention. Accordingly, the scope of the present invention should not be construed to be limited by Examples below. In Examples, wording of "part(s)" used for describing the amount of use means "part(s) by weight", unless otherwise specifically stated.

(Copper Complex A and its Preparation Process)

In 25 ml of acetone were dissolved 5 g of anhydrous copper benzoate and 7 g of methacryloyloxyethyl phosphate (from Johoku Chemical Co., Ltd.), and the solution was reacted with stirring at room temperature for 4 hours. The resulting reaction product was added dropwise into a hexane solvent, and the precipitates were extracted by filtration and dried to give copper complex A.

(Copper Complex B and its Preparation Process)

In the preparation process of copper complex A, methacryloyloxyethyl phosphate was replaced by bis(2-methacryloyloxyethyl) phosphate (from Johoku Chemical Co., Ltd.) to give the desired product.

(Copper Complex C and its Preparation Process)

In the preparation process of copper complex A, methacryloyloxyethyl phosphate was replaced by Phosmer PP (from UNI-CHEMICAL CO., LTD.) to give the desired product.

Example 1

The near-infrared absorptive composition of Example 1 was prepared by mixing the following compounds:

| | |
|---|---|
| Copper complex B | 30 parts by mass |
| Binder of the structure shown below (binder polymer) | 69.8 parts by mass |
| F-781 (surfactant from DIC Corporation) | 0.2 parts by mass |
| Propylene glycol monomethyl ether (PGME) (solvent) | 100 parts by mass |

[Chemical 69]

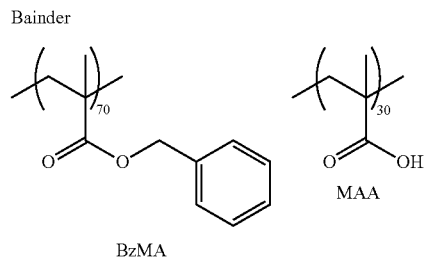

Molecular weight 30000

Example 2

The near-infrared absorptive composition of Example 2 was prepared by mixing the following compounds:

| | |
|---|---|
| Copper complex B | 30 parts by mass |
| A-TMMT (pentaerythritol tetraacrylate from Shin Nakamura Chemical Co., Ltd.) (polymerizable compound) | 34.9 parts by mass |
| JER157S65 (epoxy resin from Japan Epoxy Resin Co., Ltd.) (polymerizable compound) | 34.9 parts by mass |
| F-781 (surfactant from DIC Corporation) | 0.2 parts by mass |
| Propylene glycol monomethyl ether (PGME) (solvent) | 100 parts by mass |

Examples 3 to 13, and 16 to 19, and Comparative Examples 1 to 3

The near-infrared absorptive compositions of the Examples and Comparative examples were prepared in compositions similar to that of Example 2 except that the types of the copper complex and solvent were changed as shown in the table below. The solids contents were changed by adding the solvent in varying amounts to control A-TMMT and JER157S65 (in a constant mass ratio of 1:1). Example 19 was prepared to have a total solids content of 70%, while Example 20 was prepared to have a total solids content of 35%.

Example 14

The near-infrared absorptive composition of Example 14 was prepared in the same manner as in Example 7 except that copper complex B in Example 7 was replaced by copper complex A.

Example 15

The near-infrared absorptive composition of Example 15 was prepared in the same manner as in Example 7 except that copper complex B in Example 7 was replaced by copper complex C.

Example 21

The near-infrared absorptive composition of Example 19 was prepared in the same manner as in Example 1 except that the binder in Example 1 was replaced by a binder of the structure shown below:

[Chemical 69]

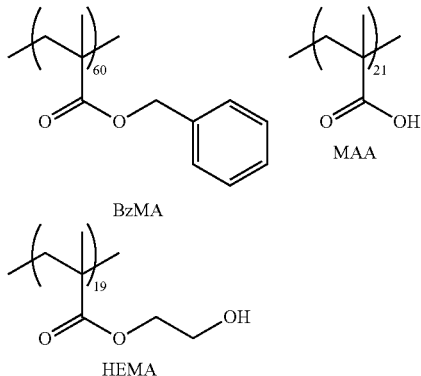

Molecular weight 1.4000

Examples 22 and 23, and Comparative Example 4

Near-infrared absorptive compositions were prepared in the same manner as in Example 2 except that the solvent in Example 2 (PGME) was replaced by the mixed solvents indicated in the table in the weight ratios indicated in the table.

Examples 101 to 120

Examples 101 to 120 were prepared by replacing the solvent in Example 2 by those indicated in the table below. The mixing ratios by weight are indicated in the parentheses following the designations of two solvents.

Examples 121 to 130

Examples 121 to 130 wore prepared by replacing the solvent in Example 13 by those indicated in the table below. The mixing ratios by weight are indicated in the parentheses following the designations of two solvents.
<Evaluation of the Near-Infrared Absorptive Compositions>
(Preparation of Near-Infrared Cut Filters)

Each near-infrared absorptive composition of the Examples and Comparative examples was applied on a glass substrate of 10 cm×10 cm by spin coating (using MIKASA SPINCOATER 1H-D7 from MIKASA Co., LTD. at 300 rpm), and preheated (prebaked) at 100° C. for 120 seconds. Then, all samples were heated on a hot plate at 200° C. for 180 seconds to prepare near-infrared cut filters having a final film thickness of 5 μm.
(Evaluation of Near-Infrared Cut Performance)

The transmittance at a wavelength of 900 nm through each color filter obtained as described above was measured with the spectrophotometer U-4100 (from Hitachi High-Technologies Corporation). The transmittance through the film having a thickness of 5 μm described above was converted into the value at a thickness of 200 μm because such filters often have a film thickness of 200 μm for practical uses, and infrared cut performance was evaluated according to the following criteria:
1: Near-infrared transmittance of 25% or more; rather high and unsuitable for practical uses.
2: Near-infrared transmittance of 20% or more and less than 25%; still high and unsuitable for practical uses.
3: Near-infrared transmittance of 12% or more and less than 20%; acceptable for practical uses.
4: Near-infrared transmittance of 5% or more and less than 12%; suitable for most practical uses.
5: Near-infrared transmittance of 3% or more and less than 5%; almost completely suitable for practical uses.
6: Near-infrared transmittance of less than 3%; completely suitable for practical uses.
(Evaluation of Coated Surface Profile)

Each film having a thickness of 5 μm prepared as described above was observed on the entire surface under a light microscope, and the number for unevenness (surface irregular points) that could be identified in an area of 10 cm×10 cm on the surface was counted and evaluated as follows:
1: There was unevenness throughout the surface, an uncountable number (i.e., 100 or more points), unsuitable for practical uses.
2: There was unevenness throughout the surface, 80 to 100 points; unsuitable for practical uses.
3: There was unevenness on the periphery, 30 to 50 points; acceptable for practical uses.
4: There was unevenness on the periphery, 15 to 29 points; acceptable.
5: There was unevenness on the periphery, 5 to 14 points; acceptable.
6: There was few unevenness, a small number (i.e., 1 to 4); acceptable.
7: There was substantially no unevenness; acceptable.
(Evaluation of Variation in Near-Infrared Absorptive Ability after Repeated Coating)

A film having a thickness of 5 μm was prepared by coating of each composition of the Examples and Comparative examples (N=10) according to the preparation process described above, and the variation in transmittance was converted into the value at 200 μm and evaluated in the same manner as described above for the evaluation of near-infrared transmittance.
1: Variation in near-infrared transmittance of ±4% or more; unsuitable for practical uses.
2: Variation in near-infrared transmittance of ±2 to 4%; unsuitable for practical uses.
3: Variation in near-infrared transmittance of ±1 to 2%; acceptable.
4: Variation in near-infrared transmittance of ±0.5 to 1%; acceptable.
5: Variation in near-infrared transmittance of ±0.3 to 0.5%; acceptable.
6: Variation in near-infrared transmittance of ±0.1 to 0.3%; acceptable.
7: Variation in near-infrared transmittance of less than ±0.1%; acceptable.
(Evaluation of Coated Surface Profile after Long-Term Storage of Coating Solutions)

The samples of Examples 13, 127 and 128 were further evaluated for their coated surface profile after long-term storage of coating solutions as follows.

Each sample prepared was placed in a sealed glass container and stored at 25° C. for 90 days. A film having a thickness of 5 μm was prepared from the stored sample and observed on the entire surface under a light microscope, and the number for unevenness (surface irregular points) that could be identified in an area of 10 cm×10 cm on the surface was counted in the same manner as described above for the evaluation of coated surface profile and evaluated as follows:
1: There was unevenness throughout the surface, an uncountable number (i.e., 100 or more points), unsuitable for practical uses.

2: There was unevenness throughout the surface, 80 to 100 points; unsuitable for practical uses.
3: There was unevenness on the periphery, 30 to 50 points; acceptable for practical uses.
4: There was unevenness on the periphery, 15 to 29 points; acceptable.
5: There was unevenness on the periphery, 5 to 14 points; acceptable.
6: There was few unevenness, a small number (i.e., 1 to 4); acceptable.
7: There was substantially no unevenness; acceptable.

TABLE 33

| | Solids (mass %) | Proportion of copper complex solids (mass %) | Solvent | Solvent bp (°C.) | Solvent density (g/cm³) | IR cut performance | Coated surface profile | Variation in IR-absorbing ability by repeated coating |
|---|---|---|---|---|---|---|---|---|
| Example 1 | 50 | 30 | PGME | 120 | 0.92 | 3 | 3 | 3 |
| Example 2 | 50 | 30 | PGME | 120 | 0.92 | 3 | 4 | 4 |
| Example 3 | 50 | 40 | PGME | 120 | 0.92 | 3 | 4 | 5 |
| Example 4 | 50 | 50 | PGME | 120 | 0.92 | 5 | 5 | 5 |
| Example 5 | 50 | 60 | PGME | 120 | 0.92 | 6 | 6 | 5 |
| Example 6 | 50 | 30 | Butyl acetate | 126 | 0.88 | 3 | 3 | 4 |
| Example 7 | 50 | 30 | PGMEA | 146 | 0.97 | 3 | 5 | 5 |
| Example 8 | 50 | 30 | Cyclohexanone | 157 | 0.95 | 3 | 5 | 4 |
| Example 9 | 50 | 30 | EEP | 170 | 0.95 | 3 | 4 | 4 |
| Example 10 | 50 | 40 | PGMEA | 146 | 0.97 | 4 | 5 | 6 |
| Example 11 | 50 | 50 | PGMEA | 146 | 0.97 | 5 | 6 | 6 |
| Example 12 | 50 | 60 | PGMEA | 146 | 0.97 | 6 | 6 | 7 |
| Example 13 | 50 | 75 | PGMEA | 146 | 0.97 | 6 | 7 | 7 |
| Example 14 | 50 | 30 | PGMEA | 146 | 0.97 | 4 | 5 | 6 |
| Example 15 | 50 | 30 | PGMEA | 146 | 0.97 | 4 | 5 | 6 |
| Example 16 | 50 | 30 | Diethyl ketone | 101 | 0.82 | 3 | 3 | 3 |
| Example 17 | 50 | 30 | Diethylene glycol diethyl ether | 188 | 0.91 | 3 | 3 | 3 |
| Example 18 | 50 | 75 | PGME | 120 | 0.92 | 5 | 5 | 5 |
| Example 19 | 70 | 75 | PGMEA | 146 | 0.97 | 6 | 6 | 7 |
| Example 20 | 35 | 75 | PGMEA | 146 | 0.97 | 5 | 6 | 6 |
| Example 21 | 50 | 30 | PGME | 120 | 0.92 | 3 | 3 | 3 |
| Example 22 | 50 | 30 | PGME/PGMEA = 50/50 | 136 | 0.83 | 3 | 4 | 4 |
| Example 23 | 50 | 30 | PGME/methyl ethyl ketone = 40/60 | 95.7 | 0.85 | 3 | 3 | 3 |
| Comp. Exam. 1 | 30 | 30 | PGME | 120 | 0.92 | 1 | 3 | 3 |
| Comp. Exam. 2 | 50 | 30 | Methyl ethyl ketone | 79.5 | 0.81 | 2 | 1 | 1 |
| Comp. Exam. 3 | 50 | 30 | N-methylpyrrolidone | 202 | 1.03 | 2 | 1 | 1 |
| Comp. Exam. 4 | 50 | 30 | PGME/methyl ethyl ketone = 20/80 | 87.6 | 0.89 | 3 | 2 | 2 |

TABLE 34

| Example | Solids (mass %) | Proportion of copper complex solids (mass %) | Solvent | Solvent bp (° C.) | Solvent densitiy (g/cm³) | IR cut performance | Coated surface profile | Variation in IR-absorbing ability by repeated coating |
|---|---|---|---|---|---|---|---|---|
| 101 | 50 | 30 | Propylene glycol | 158.8 | 0.977 | 3 | 3 | 3 |
| 102 | 50 | 30 | PGMEA/butoxypropanol (90/10) | 157 | 0.961 | 3 | 4 | 4 |
| 103 | 50 | 30 | PGMEA/ethoxypropanol (90/10) | 153.2 | 0.963 | 3 | 3 | 4 |
| 104 | 50 | 30 | PGMEA/ethyl lactate (90/10) | 155.5 | 0.976 | 3 | 5 | 4 |
| 105 | 50 | 30 | PGMEA/dipropylene glycol monomethyl ether (90/10) | 159 | 0.968 | 3 | 3 | 3 |
| 106 | 50 | 30 | PGMEA/butoxyethanol (90/10) | 157.1 | 0.963 | 3 | 4 | 4 |
| 107 | 50 | 30 | PGMEA/dimethylformamide (DMF) (90/10) | 155.3 | 0.967 | 3 | 5 | 4 |
| 108 | 50 | 30 | PGMEA/dimethyl sulfoxide (DMSO) (90/10) | 158.9 | 0.983 | 3 | 3 | 3 |
| 109 | 50 | 30 | PGMEA/dimethylacetamide (90/10) | 156.5 | 0.967 | 3 | 5 | 4 |
| 110 | 50 | 30 | PGMEA/methyl diglyme (90/10) | 156.2 | 0.968 | 3 | 5 | 4 |
| 121 | 50 | 75 | Propylene glycol | 158.8 | 0.977 | 6 | 6 | 6 |
| 122 | | | PGMEA/butoxypropanol (90/10) | 157 | 0.961 | 6 | 6 | 6 |
| 123 | 50 | 75 | PGMEA/ethoxypropanol (90/10) | 153.2 | 0.963 | 6 | 6 | 6 |
| 124 | 50 | 75 | PGMEA/ethyl lactate (90/10) | 155.5 | 0.976 | 6 | 6 | 6 |

TABLE 34-continued

| Example | Solids (mass %) | Proportion of copper complex solids (mass %) | Solvent | Solvent bp (° C.) | Solvent densitiy (g/cm³) | IR cut performance | Coated surface profile | Variation in IR-absorbing ability by repeated coating |
|---|---|---|---|---|---|---|---|---|
| 125 | 50 | 75 | PGMEA/dipropylene glycol monomethyl ether (90/10) | 159 | 0.968 | 6 | 6 | 6 |
| 126 | 50 | 75 | PGMEA/butoxyethanol (90/10) | 157.1 | 0.963 | 6 | 6 | 6 |
| 127 | 50 | 75 | PGMEA/dimethylformamide (DMF) (90/10) | 155.3 | 0.967 | 6 | 7 | 7 |
| 128 | 50 | 75 | PGMEA/dimethyl sulfoxide (DMSO) (90/10) | 158.9 | 0.983 | 6 | 7 | 7 |
| 129 | 50 | 75 | PGMEA/dimethylacetamide (90/10) | 156.5 | 0.967 | 6 | 6 | 6 |
| 130 | 50 | 75 | PGMEA/methyl diglyme (90/10) | 156.2 | 0.968 | 6 | 6 | 6 |

TABLE 35

| Example | Solids (mass %) | Proportion of copper complex solids (mass %) | Solvent | Solvent bp (° C.) | Solvent density (g/cm³) | IR cut performance | Coated surface profile | Variation in IR-absorbing ability by repeated coating | Evaluation of coated surface profile after long term storage of coating solutions |
|---|---|---|---|---|---|---|---|---|---|
| 13 | 50 | 75 | PGMEA | 146 | 0.97 | 6 | 7 | 7 | 6 |
| 127 | 50 | 75 | PGMEA/dimethyl formamide (DMF) (90/10) | 155.3 | 0.967 | 6 | 7 | 7 | 7 |
| 128 | 50 | 75 | PGMEA/dimethyl sulfoxide (DMSO) (90/10) | 158.9 | 0.983 | 6 | 7 | 7 | 7 |

* In the tables, EEP means ethyl 3-ethoxypropionate; and PGMEA means propylene glycol monomethyl ether acetate.

The tables above show that when the compositions of the present invention were used, they provided near-infrared absorptive compositions having excellent infrared cut performance and capable of reducing unevenness in the coated surface profile and variation in the near-infrared absorptive ability of the resulting films.

INDUSTRIAL APPLICABILITY

According to the present invention, the film thickness of near-infrared cut filters can be decreased because unevenness in the coated surface profile and variation in the infrared absorbing ability of the films can be reduced even if the solids contents of the compositions were increased.

What is claimed is:

1. A near-infrared absorptive composition comprising a copper complex and a solvent, wherein the near-infrared absorptive composition has a solids content of 35 to 70% by mass, the composition comprises the solvent in an amount of 30 to 65% by mass, the solvent has a boiling point of 90 to 200° C. at 1 atm, and the copper complex is a copper compound represented by general formula (1) below:

$$Cu(L)n \cdot X \quad \text{general formula (1)}$$

wherein L represents a ligand coordinated to the copper and is a compound having at least one selected from sulfonic acids, phosphoric acid, phosphoric acid esters, phosphonic acids, phosphonic acid esters, phosphinic acid, phosphinic acid esters, carboxylic acids, carbonyl (esters, ketones), amines, amides, sulfonamides, urethane, urea, alcohols and thiols;

X is absent, or represents a halogen atom, $H_2O$, $NO_3$, $ClO_4$, $SO_4$, CN, SCN, $BF_4$, $PF_6$, $BPh_4$ or alcohol;

Ph represents phenyl; and n represents an integer of 1 to 4.

2. The near-infrared absorptive composition according to claim 1, wherein the solvent has a boiling point of 120 to 180° C. at 1 atm.

3. The near-infrared absorptive composition according to claim 1, wherein the solvent has a density of 0.90 g/cm³ or more.

4. The near-infrared absorptive composition according to claim 1, wherein the solvent is at least one solvent selected from the group consisting of alcohols, ketones, esters, ethers, aromatic hydrocarbons and halogenated hydrocarbons.

5. The near-infrared absorptive composition according to claim 1, wherein the solvent is at least one solvent selected from the group consisting of propylene glycol monomethyl ether acetate, propylene glycol monomethyl ether, cyclohexanone, and ethyl 3-ethoxypropionate.

6. The near-infrared absorptive composition according to claim 1, wherein the solvent is at least one solvent selected from the group consisting of propylene glycol, propylene glycol monomethyl ether acetate, butoxypropanol, ethoxypropanol, ethyl lactate, dipropylene glycol monomethyl ether, butoxyethanol, dimethylformamide, dimethyl sulfoxide, dimethylacetamide and methyl diglyme.

7. The near-infrared absorptive composition according to claim 1, further comprising a polymerizable compound.

8. The near-infrared absorptive composition according to claim 1, further comprising at least one component selected from the group consisting of a polyfunctional (meth) acrylate, an acrylic resin, and an acrylic copolymer.

9. The near-infrared absorptive composition according to claim 1, which further comprises a polymerizable compound in an amount of 15 to 70% by mass based on the solids content of the near-infrared absorptive composition.

10. The near infrared absorptive composition according to claim 1, wherein the copper complex is a complex other than a complex of a squarylium compound and copper.

11. The near-infrared absorptive composition according to claim 1, wherein the copper complex is a copper phosphate ester compound.

12. The near-infrared absorptive composition according to claim 1, which comprises the copper complex in an amount of 60 to 90% by mass based on the solids content of the near-infrared absorptive composition.

13. A near-infrared cut filter manufactured formed from a near-infrared absorptive composition according to claim 1.

14. A camera module comprising a solid-state image sensor substrate and a near-infrared cut filter according to claim 13 provided on the light-capturing side of the solid-state image sensor substrate.

15. A method for manufacturing a camera module comprising a solid-state image sensor substrate and a near-infrared cut filter provided on a light-capturing side of the solid-state image sensor substrate, the method comprising forming a film by coating a near-infrared absorptive composition according to claim 1 on the light-capturing side of the solid-state image sensor substrate.

16. The method for manufacturing a camera module according to claim 15, comprising curing the film formed by coating the near-infrared absorptive composition with light irradiation.

17. A near-infrared absorptive composition comprising a copper complex and a solvent, wherein the near-infrared absorptive composition has a solids content of 10 to 90% by mass, the solvent has a boiling point of 90 to 200° C. at 1 atm, and the copper complex is a copper compound represented by general formula (1) below:

$$Cu(L)n.X \qquad \text{general formula (1)}$$

wherein L represents a ligand coordinated to the copper and is a compound having at least one selected from sulfonic acids and carboxylic acids;

X is absent, or represents a halogen atom, $H_2O$, $NO_3$, $ClO_4$, $SO_4$, CN, SCN, $BF_4$, $PF_6$, $BPh_4$ or alcohol;

Ph represents phenyl; and n represents an integer of 1 to 4.

18. The near-infrared absorptive composition according to claim 1, wherein the solvent is a mixture solution of propylene glycol monomethyl ether acetate and dimethylformamide or dimethyl sulfoxide.

* * * * *